US012740040B2

(12) United States Patent
Hwang et al.

(10) Patent No.: US 12,740,040 B2
(45) Date of Patent: Sep. 15, 2026

(54) CAPACITORLESS 3D STACKED DRAM DEVICE AND MANUFACTURING METHOD THEREOF

(71) Applicant: SEOUL NATIONAL UNIVERSITY R&DB FOUNDATION, Seoul (KR)

(72) Inventors: Cheol Seong Hwang, Seoul (KR); Seo Young Jang, Gyeonggi-do (KR); Han Chul Lee, Gyeonggi-do (KR)

(73) Assignee: Seoul National University R&DB foundation, Seoul (KR)

( * ) Notice: Subject to any disclaimer, the term of this patent is extended or adjusted under 35 U.S.C. 154(b) by 402 days.

(21) Appl. No.: 18/570,810

(22) PCT Filed: Oct. 17, 2023

(86) PCT No.: PCT/KR2023/016042
§ 371 (c)(1),
(2) Date: Dec. 15, 2023

(87) PCT Pub. No.: WO2024/242243
PCT Pub. Date: Nov. 28, 2024

(65) Prior Publication Data

US 2024/0397699 A1 Nov. 28, 2024

(30) Foreign Application Priority Data

May 25, 2023 (KR) ........................ 10-2023-0067638

(51) Int. Cl.
*H10B 12/00* (2023.01)

(52) U.S. Cl.
CPC .................................... *H10B 12/00* (2023.02)

(58) Field of Classification Search
CPC .... H10B 12/00; H10B 12/482; G11C 11/4097
See application file for complete search history.

(56) References Cited

U.S. PATENT DOCUMENTS

2006/0044870 A1 3/2006 Bhattacharyya et al.
2022/0285355 A1 9/2022 Manfrini et al.
(Continued)

FOREIGN PATENT DOCUMENTS

CN 115666133 1/2023
CN 115763428 3/2023
(Continued)

OTHER PUBLICATIONS

International Search Report mailed Feb. 15, 2024 for PCT/KR2023/016042.

*Primary Examiner* — Bac H Au

(57) ABSTRACT

The present disclosure discloses a capacitorless three-dimensional stacked DRAM device including a plurality of memory cell structures spaced apart from each other in horizontal and vertical directions, each of the plurality of memory cell structures including a horizontal read transistor structure and a horizontal write transistor structure, a plurality of write bit lines connected to the plurality of write transistor structures of the plurality of memory cell structures and extending in the horizontal direction, a plurality of read bit lines connected to the plurality of read transistor structures of the plurality of memory cell structures and extending in the horizontal direction, a plurality of write word lines connected to the plurality of write transistor structures and extending in the vertical direction, and a plurality of read word lines connected to the plurality of read transistor structures and extending in the vertical direction.

9 Claims, 44 Drawing Sheets

(56) References Cited

U.S. PATENT DOCUMENTS

| | | | | |
|---|---|---|---|---|
| 2023/0122541 | A1* | 4/2023 | Im | H10B 12/05<br>257/314 |
| 2025/0098140 | A1* | 3/2025 | Hwang | H10B 12/05 |

FOREIGN PATENT DOCUMENTS

| | | |
|---|---|---|
| KR | 10-1895686 | 9/2018 |
| KR | 10-2022-0047047 | 4/2022 |
| KR | 10-2022-0083115 | 6/2022 |
| KR | 10-2022-0153308 | 11/2022 |

* cited by examiner

H30
S30
M50
NL21
NL21
Z
WBL
NF2
RBL
NF1
Y
X

H30
S30
GT1
GN1
CH1
H5
Z
WBL
NF2
RBL
NF1
Y
X

H40
GT1 GN1 CH1
M60
S30
Z
Y X
WBL NF2 RBL NF1

S30
WBL
GN1
CH1
NF1
WBL
Z
X
Y

S30
WBL
H5
NF1
H5
WBL
Z
X
Y

GT2 GN2
M70
S30
CH2
WBL
NF1
H5
WBL
Z
X Y

FIG. 30

WBL
RBL
WWL
5F
RWL
2F
GT2
GN2
CH2
GT1
GN1
CH1
$T_W$
$T_R$
MC1
Y
X

CAPACITORLESS 3D STACKED DRAM DEVICE AND MANUFACTURING METHOD THEREOF

This application claims the priority of Korean Patent Application No. 10-2023-0067638, filed on May 25, 2023 in the KIPO (Korean Intellectual Property Office), the disclosure of which is incorporated herein entirely by reference. Further, this application is the National Stage application of International Application No. PCT/KR2023/016042, filed on Oct. 17, 2023, which designates the United States and was published in Korean. Each of these applications is hereby incorporated by reference in their entirety into the present application.

TECHNICAL FIELD

The present invention relates to semiconductor/electronic devices and manufacturing methods thereof, more particularly, to memory devices and methods of manufacturing the same.

BACKGROUND ART

There is a continuous need to increase the performance of semiconductor devices and the degree of integration of semiconductor devices. Arranging unit cells of semiconductor devices two-dimensionally, that is, in a planar manner, is reaching its limit in increasing the degree of integration of semiconductor devices. Accordingly, attempts are being made to develop technologies which greatly increase the degree of integration of semiconductor devices by three-dimensionally integrating the unit cells of the semiconductor devices. In this regard, the attempts to increase the integration degree of memory devices such as NAND devices or DRAM devices are being attempted in various forms. In addition, research and development are continuously being conducted to improve the performance and operating characteristics of memory devices.

Recently, DRAM with a 2T0C (two transistor zero capacitor) cell structure has been proposed as a new DRAM structure. 2T0C DRAM has the advantage that the gate capacitance of a read transistor may be used as a storage element, a data retention time is long, and a cell may be formed by only a plurality of transistors without a capacitor.

However, since the existing 2T0C DRAM devices have a structure in which two types of word lines and two types of bit lines extend in the horizontal direction and are disconnected between cells in the vertical direction, it is difficult to stack and integrate them three dimensionally. That is, since the first word line and the first bit line are arranged to be orthogonal to each other while extending in the horizontal direction, and similarly, the second word line and the second bit line are arranged to be orthogonal to each other while extending in the horizontal direction, when cells are stacked vertically in the three-dimensional manner, the cells are disconnected in the vertical direction and thus, there are problems that it is difficult to implement the manufacturing process and mass production is impossible.

DISCLOSURE OF THE INVENTION

Technical Problem

The technological object to be achieved by the present invention is to provide a capacitorless three-dimensional stacked dynamic random access memory (DRAM) device which may significantly improve degree of integration three-dimensionally, secure excellent performance, and facilitate the manufacturing process.

In addition, the technological object to be achieved by the present invention is to provide a manufacturing method of the capacitorless three-dimensional stacked DRAM device described above.

The objects to be solved by the present invention are not limited to the objects mentioned above, and other objects not mentioned will be understood by those skilled in the art from the description below.

Technical Solution

According to one embodiment of the present invention, thee is provided a manufacturing method of capacitorless 3D stacked DRAM device comprising: forming a stack having a structure in which first and second material layers composed of different materials are alternately stacked on a substrate; forming a patterned stack having a the plurality of pattern portions having a first material layer pattern obtained from the first material layer and a second material layer pattern obtained from the second material layer by patterning the stack, wherein the plurality of pattern portions extend in a first direction and are spaced apart from each other in a second direction perpendicular to the first direction; forming a structure including the patterned stack and a filling material by filling the filling material between the plurality of pattern portions; forming first and second vertical holes spaced apart from each other in the first direction, the first and second vertical holes penetrating through each of the plurality of pattern portions in the structure in a vertical direction; forming first and second recesses exposing the second material layer pattern by recessing the first material layer pattern and the filling material around each of the first and second vertical holes of the structure; forming an intermediate device structure including a write bit line extending in a horizontal direction while surrounding the second material layer pattern in the first recess, a read bit line extending in a horizontal direction while surrounding the second material layer pattern in the second recess, and a filling insulating layer filling a space around the write bit line and the read bit line from the structure; forming a third vertical hole in a region corresponding to the first vertical hole in the intermediate device structure; forming a horizontal hole extending in the first direction and exposing the write bit line and the read bit line by removing the second material layer pattern exposed by the third vertical hole; forming a read transistor structure electrically connected to the read bit line in the horizontal hole, the read transistor structure including a first channel layer, a first gate insulating layer, and a first gate electrode; forming a write transistor structure electrically connected to the write bit line in the horizontal hole, the write transistor structure including a second channel layer, a second gate insulating layer, and a second gate electrode, wherein the second channel layer is electrically connected to the first gate electrode; and forming a write word line electrically connected to the second gate electrode and extending in the vertical direction in a region corresponding to the first vertical hole, and forming a read word line electrically connected to the first channel layer and extending in the vertical direction in a region corresponding to the second vertical hole.

The first material layer and the filling material may include a silicon nitride, and the second material layer may include a silicon oxide.

At least one of the first and second channel layers may include an oxide semiconductor.

The forming the intermediate device structure may include: forming a write bit line material layer surrounding the second material layer pattern portion exposed to the first recess and a read bit line material layer surrounding the second material layer pattern portion exposed to the second recess; forming first and second through-holes corresponding to the first and second vertical holes, respectively by etching a region corresponding to the first vertical hole in the write bit line material layer, and a region corresponding to the second vertical hole in the read bit line material layer; recessing a portion of the write bit line material layer exposed by the first through-hole and a portion of the read bit line material layer exposed by the second through-hole; and forming a first filling insulating layer to fill the first and second through-holes.

The forming the intermediate device structure may further include: forming an opening region by removing the first material layer pattern and the filling material between the write bit line material layer and the read bit line material layer; recessing a portion of each of the write bit line material layer and the read bit line material layer exposed by the opening region; and forming a second filling insulating layer to fill the opening region.

The forming the read transistor structure may include: sequentially forming a first channel material layer and a first gate insulating material layer on inner surfaces of the horizontal hole and the third vertical hole; forming a first gate electrode material layer on the first gate insulating material layer to fill the horizontal hole and the third vertical hole; forming a fourth vertical hole in a region corresponding to the third vertical hole in the intermediate device structure where the first channel material layer, the first gate insulating material layer, and the first gate electrode material layer are formed; forming the first gate electrode by recessing a portion of the first gate electrode material layer exposed by the fourth vertical hole; and forming the first gate insulating layer and the first channel layer by recessing a portion of the first gate insulating material layer and a portion of the first channel material layer exposed by the fourth vertical hole, and wherein the first gate electrode may have a structure which protrudes more toward the fourth vertical hole than the first channel layer.

The method may further include forming a first gap fill insulation layer which fills an empty space around an end portion of the first gate electrode and exposes the first gate electrode toward the fourth vertical hole.

The forming the write transistor structure may include: sequentially forming a second channel material layer and a second gate insulating material layer on inner surfaces of the horizontal hole portion adjacent to the write bit line and the fourth vertical hole; forming a second gate electrode material layer to fill the horizontal hole portion and the third vertical hole on the second gate insulating material layer; forming a fifth vertical hole in a region corresponding to the fourth vertical hole in the intermediate device structure where the second channel material layer, the second gate insulating material layer, and the second gate electrode material layer are formed; and recessing a portion of the second channel material layer exposed by the fifth vertical hole.

The method may further include forming a second gap fill insulating layer which fills an empty space around an end portion of the second gate electrode and exposes the second gate electrode toward the fifth vertical hole.

A plurality of the second material layer patterns may be arranged to be spaced apart from each other in the horizontal and vertical directions, a plurality of the horizontal holes may be arranged to be spaced apart from each other in the horizontal and vertical directions, a read transistor structure and a write transistor structure may be formed in each of the plurality of horizontal holes, each of the write word lines may be commonly connected to a plurality of write transistor structures spaced apart from each other in a vertical direction, and each of the read word lines may be connected to a plurality of the read transistor structures spaced apart from each other in a vertical direction.

According to another embodiment of the present invention, there is provided a capacitorless 3D stacked DRAM device comprising: a plurality of memory cell structures spaced apart from each other in horizontal and vertical directions, each of the plurality of memory cell structures including a horizontal read transistor structure and a horizontal write transistor structure, the horizontal read transistor structure including a first channel layer, a first gate insulating layer, and a first gate electrode, the horizontal write transistor structure including a second channel layer electrically connected to the first gate electrode, a second gate insulating layer, and a second gate electrode layer; a plurality of write bit lines connected to the plurality of write transistor structures of the plurality of memory cell structures and extending in the horizontal direction; a plurality of read bit lines connected to the plurality of read transistor structures of the plurality of memory cell structures and extending in the horizontal direction; a plurality of write word lines connected to the plurality of write transistor structures and extending in the vertical direction; and a plurality of read word lines connected to the plurality of read transistor structures and extending in the vertical direction, and wherein the plurality of write bit lines and the plurality of read bit lines are disposed between the plurality of write word lines and the plurality of read word lines, wherein the plurality of write bit lines are disposed between the plurality of write word lines and the plurality of read bit lines, and wherein the plurality of read bit lines are disposed between the plurality of read word lines and the plurality of write bit lines.

At least one of the first and second channel layers may include an oxide semiconductor.

In each of the read transistor structures, the first gate electrode may have a rod structure extending in the horizontal direction, the first gate insulating layer may have a first shell structure surrounding a remaining portion except for one end portion of the first gate electrode, and the first channel layer may have a second shell structure surrounding the first gate insulating layer.

The first gate electrode may protrude toward the write transistor structure rather than the first channel layer.

The read bit line may have a structure surrounding a portion of the first channel layer, and the read word line may be electrically connected to an end of the first channel layer.

In each of the write transistor structures, the second gate electrode may have a rod structure extending in a horizontal direction, the second gate insulating layer may have a first shell structure surrounding a remaining portion except for one end portion of the second gate electrode, and the second channel layer may have a second shell structure surrounding the second gate insulating layer.

The second gate electrode may protrude toward the write word line rather than the second channel layer.

The write bit line may have a structure surrounding a portion of the second channel layer, and the write word line may be electrically connected to an end of the second gate electrode.

A unit memory area of the capacitorless 3D stacked DRAM device may have a size of $10F^2$ (F: feature size).

Advantageous Effects

According to embodiments of the present invention, it is possible to implement a capacitorless three-dimensional stacked DRAM device which may significantly improve degree of integration three-dimensionally, secure excellent performance, and facilitate the manufacturing process. In particular, as the capacitorless three-dimensional stacked DRAM device according to an embodiment of the present invention has a structure in which the write word line and the read word line extend in the vertical direction, and the write bit line and the read bit line extend in the horizontal direction, it may be easy to manufacture a three-dimensional stacked structure in which cells are connected in the vertical direction. According to this embodiment of the present invention, highly integrated and high capacity devices may be easily manufactured and mass production is possible. In particular, it is possible to minimize the area per memory cell, and implement highly integrated, high capacity devices while minimizing the lithography process steps by stacking the memory cells in a three-dimensional manner. According to one example, the three-dimensional stacked DRAM device may be a DRAM device of 2T0C type or may be configured to include it.

However, the effects of the present invention are not limited to the above effects and may be expanded in various ways without departing from the technological spirit and scope of the present invention.

BRIEF DESCRIPTION OF THE DRAWINGS

FIGS. 1A, 2A, 3A, 4A, 5A, 6A, 7A, 8A, 9A, 10A, 11A, 12A, 13A, 14A, 15A, 16A, 17A, FIGS. 18A, 19A, 20A, 21A, 22A, 23A, 24A, 25A, 26A, and 27A are cross-sectional diagrams for explaining an example of a manufacturing method of a capacitorless three-dimensional stacked dynamic random access memory (DRAM) device according to an embodiment of the present invention.

FIGS. 1B, 2B, 3B, 4B, 5B, 6B, 7B, 8B, 9B, 10B, 11B, 12B, 13B, 14B, 15B, 16B, 17B, 18B, 19B, 20B, 21B, 22B, 23B, 24B, 25B, 26B and 27B are diagrams for explaining an example of a manufacturing method of a capacitorless three-dimensional stacked dynamic random access memory (DRAM) device according to an embodiment of the present invention.

FIGS. 1C, 2C, 3C, 4C, 5C, 6C, 7C, 8C, 9C, 10C, 11C, 12C, 13C, 14C, 15C, 16C, 17C, 18C, 19C, 20C, 21C, 22C, 23C, 24C, 25C, 26C, and 27C are cross-sectional diagrams for explaining an example of a manufacturing method of a capacitorless three-dimensional stacked dynamic random access memory (DRAM) device according to an embodiment of the present invention.

FIG. 30 is a diagram illustrating a size of a unit memory area in the capacitorless three-dimensional stacked DRAM device of FIG. 29.

BEST MODE FOR CARRYING OUT THE INVENTION

Figure 1A:

Hereinafter, embodiments of the present invention will be described in detail with reference to the accompanying drawings.

The embodiments of the present invention to be described below are provided to more clearly explain the present invention to those skilled in the art, and the scope of the present invention is not limited by the following embodiments, and the embodiments may be modified in many different forms.

The terms used in this specification are used to describe specific embodiments and are not intended to limit the present invention. The terms indicating a singular form used herein may include plural forms unless the context clearly indicates otherwise. Also, as used herein, the terms, "comprise" and/or "comprising" specify the presence of the stated shape, step, number, operation, member, element, and/or group thereof and does not exclude the presence or addition of one or more other shapes, steps, numbers, operations, elements, elements and/or groups thereof. In addition, the term, "connection" used in this specification means not only a direct connection of certain members, but also a concept including an indirect connection in which other members are interposed between the members.

In addition, in the description of this specification, descriptions such as "first" and "second", "upper or top", and "lower or bottom" are intended to distinguish members, and they are not used to limit the members themselves, or to mean a specific order, but rather they are used to convey a relative positional relationship and does not limit the specific cases where other configuration members are in direct contact with the described members or another member is introduced into the interface between them. The same interpretation may be applied to other expressions which describe relationships between components.

In addition, in the present specification, when a member is said to be located "on" another member, this arrangement includes not only a case in which a member is in contact with another member, but also a case where another member exists between the two members. As used herein, the term, "and/or" includes any one and all combinations of one or more of the listed items. In addition, the terms of degree such as "about" and "substantially" used in the present specification are used as a range of values or degrees, or as a meaning close thereto, taking into account inherent manufacturing and substance tolerances, and exact or absolute figures provided to aid in the understanding of this application are used to prevent the infringers from unfairly exploiting the stated disclosure.

Hereinafter, embodiments of the present invention will be described in detail with reference to the accompanying drawings. A size or a thickness of areas or parts shown in the accompanying drawings may be slightly exaggerated for clarity of the specification and convenience of description. The same reference numbers indicate the same configuring elements throughout the detailed description.

FIG. 1A to FIG. 27C are diagrams for explaining an example of a manufacturing method of a capacitorless three-dimensional stacked dynamic random access memory (DRAM) device according to an embodiment of the present invention. The capacitorless 3D stacked DRAM device may be a 3D stacked DRAM device having a gain cell structure. For example, the capacitorless three-dimensional stacked DRAM device may be a three-dimensional stacked DRAM device having a two transistor zero capacitor (2T0C) cell structure.

The same reference numbers in FIGS. 1A-27C (e.g., FIG. 1 in FIGS. 1A, 1B, and 1C) refer to the same steps. FIGS. 1A, 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, and 27A are cross-sectional diagrams cut along the XZ plane. FIGS. 1B, 2B, 3B, 4B, 5B, 6B, 7B, 8B, 9B, 10B, 11B, 12B, 13B, 14B, 15B, 16B, 17B, 18B, 19B, 20B, 21B, 22B, 23B, 24B, 25B, 26B, and 27B are plan diagrams (i.e., top-view) observed from above direction or are cross-sectional diagrams cut in the XY plane (i.e., Z-cut view). FIGS. 1C, 2C, 3C, 4C, 5C, 6C, 7C, 8C, 9C, 10C, 11C, 12C, 13C, 14C, 15C, 16C, 17C, 18C, 19C, 20C, 21C, 22C, 23C, 24C, 25C, 26C, and 27C are cross-sectional diagrams cut along the YZ plane.

Figure 1B:
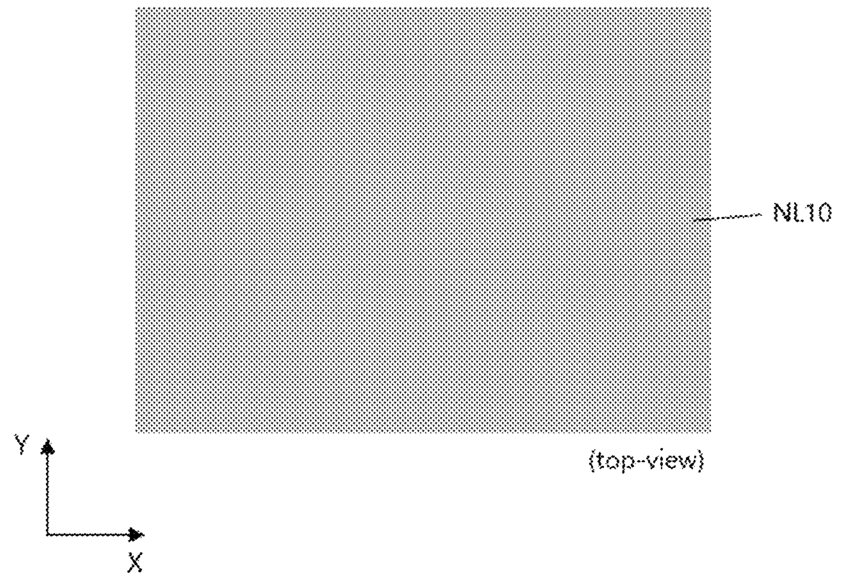
Figure 1C:
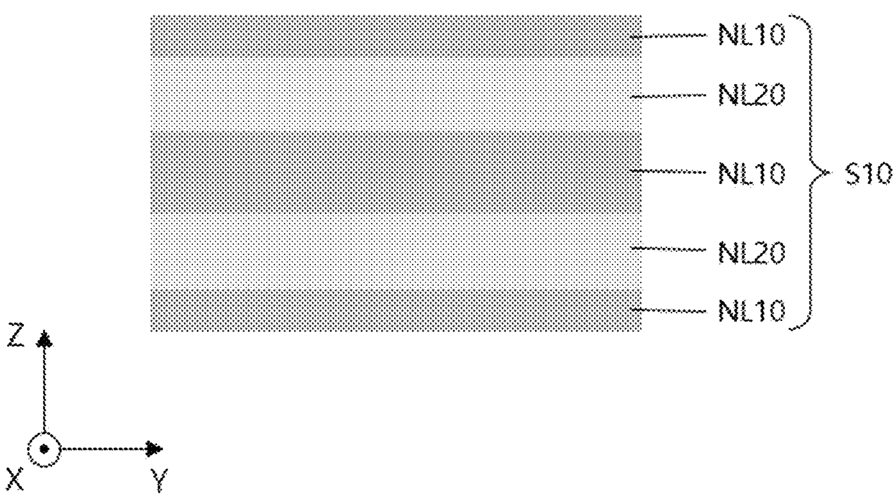

Referring to FIGS. 1A to 1C, a stack S10 may be formed on a predetermined substrate (not shown). The material of the substrate may be selected from a variety of materials. The substrate may be formed by including a semiconductor material or an insulating material. The substrate may include a semiconductor wafer. The substrate may include a bulk silicon substrate, a silicon-on-insulator (SOI) substrate, a germanium substrate, or a germanium-on-insulator (GOI), a silicon-germanium substrate, or a substrate formed by an epitaxial growth process.

The stack S10 may be formed on the substrate. The stack S10 may include a structure in which first and second material layers NL10 and NL20 configured (formed) by the different materials are alternately and repeatedly stacked. The first and second material layers NL10 and NL20 may be different insulating material layers. As a non-limiting example, the first material layer NL10 may include a silicon nitride (e.g., $SiN_x$) or may be formed by a silicon nitride (e.g., $SiN_x$). As a non-limiting example, the second material layer NL20 may include a silicon oxide (e.g., $SiO_2$) or may be formed by a silicon oxide (e.g., $SiO_2$). The first material layer NL10 and the second material layer NL20 may have an etching selectivity. The first material layer NL10 and the second material layer NL20 may be formed through a deposition process.

The first material layer NL10 and the second material layer NL20 may be alternately stacked two or more times. At least one of the lowermost first material layer NL10 and the uppermost first material layer NL10 may have a thickness which is thinner than the remaining first material layer NL10. However, this is only an example, and all first material layers NL10 may be formed to have the same thickness. The second material layer NL20 may have a thickness similar to or substantially the same as that of the first material layer NL10 disposed between the two second material layers NL20.

Figure 2A:
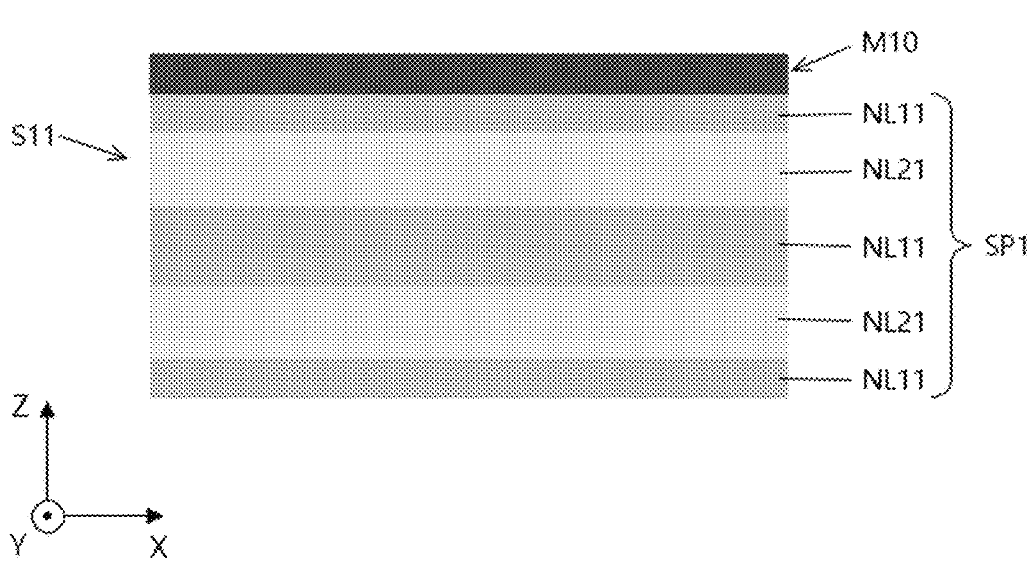
Figure 2B:
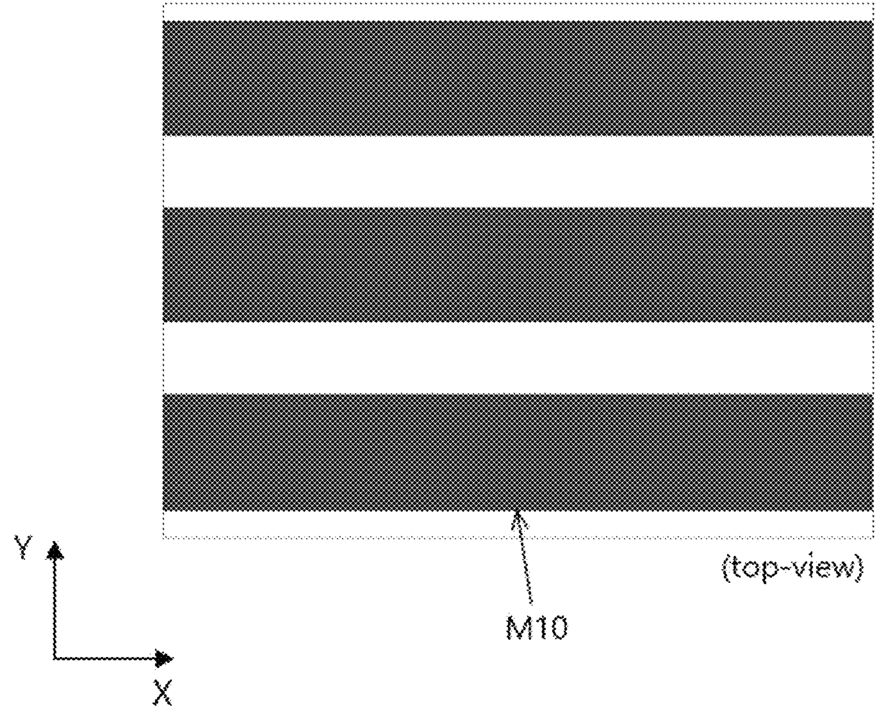
Figures 2C, 3A:
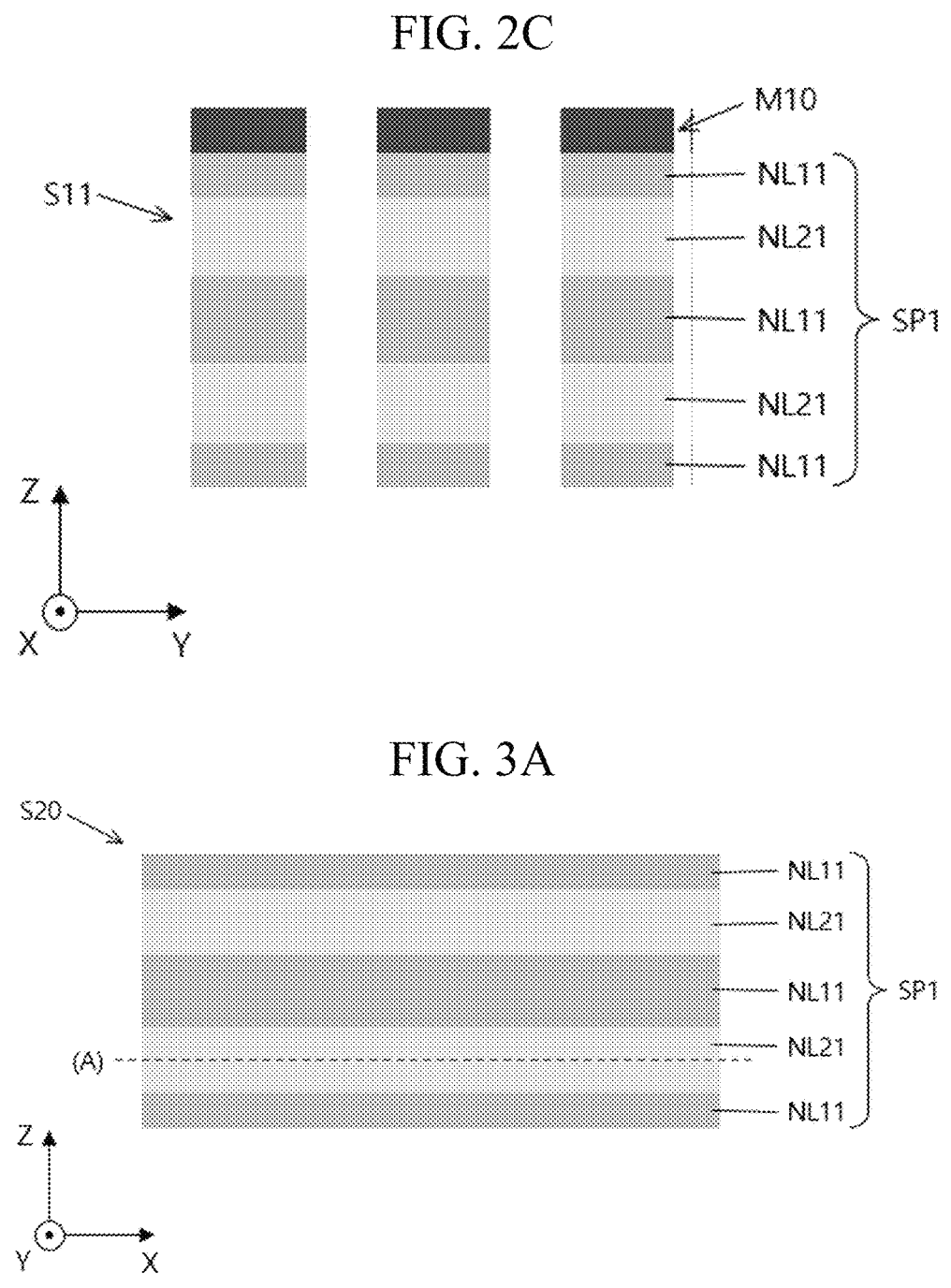

Referring to FIGS. 2A to 2C, the stack (S10 in FIG. 1A) may be patterned to form a patterned stack S11 having a plurality of pattern portions SP1. The plurality of pattern portions SP1 may have a shape extending in a first direction, for example, in the X-axis direction, and may be spaced apart from each other in a second direction orthogonal (perpendicular) to the first direction, for example, the Y-axis direction. Empty spaces may be provided on both sides of the pattern portion SP1 according to the second direction. The plurality of pattern portions SP1 may be spaced apart in the Y-axis direction and arranged side by side in the X-axis direction. In this step, remaining regions excluding the region extending from a channel region to be formed later may be removed by patterning.

The pattern portion SP1 may include a patterned first material layer NL11 and a patterned second material layer NL21. Here, the patterned first material layer NL11 may be referred to as a first material layer pattern NL11 obtained from the first material layer (NL10 in FIG. 1A). Furthermore, the patterned second material layer NL21 may be referred to as a second material layer pattern NL21 obtained from the second material layer (NL20 in FIG. 1A). A plurality of second material layer patterns NL21 may be arranged to be spaced apart from each other in the Y-axis direction and the Z-axis direction. In other words, the plurality of second material layer patterns NL21 may be arranged to be spaced apart from each other in the horizontal and vertical directions. The plurality of second material layer patterns NL21 may extend parallel to each other in the X-axis direction. Furthermore, a plurality of first material layer patterns NL11 may be arranged to be spaced apart from each other in the Y-axis direction and the Z-axis direction. In other words, the plurality of first material layer patterns NL11 may be arranged to be spaced apart from each other in the horizontal and vertical directions. The plurality of first material layer patterns NL11 may extend parallel to each other in the X-axis direction. Each of the plurality of first material layer patterns NL11 and each of the plurality of second material layer patterns NL21 may have a line shape. For the patterning process of FIGS. 2A to 2C, a first mask pattern M10 disposed on the stack (S10 in FIG. 1A) may be used. The first mask pattern M10 may have a predetermined pattern structure. The first mask pattern M10 may be, for example, a photoresist pattern. After the patterning process, the first mask pattern M10 may be removed.

Figures 3B, 3C:
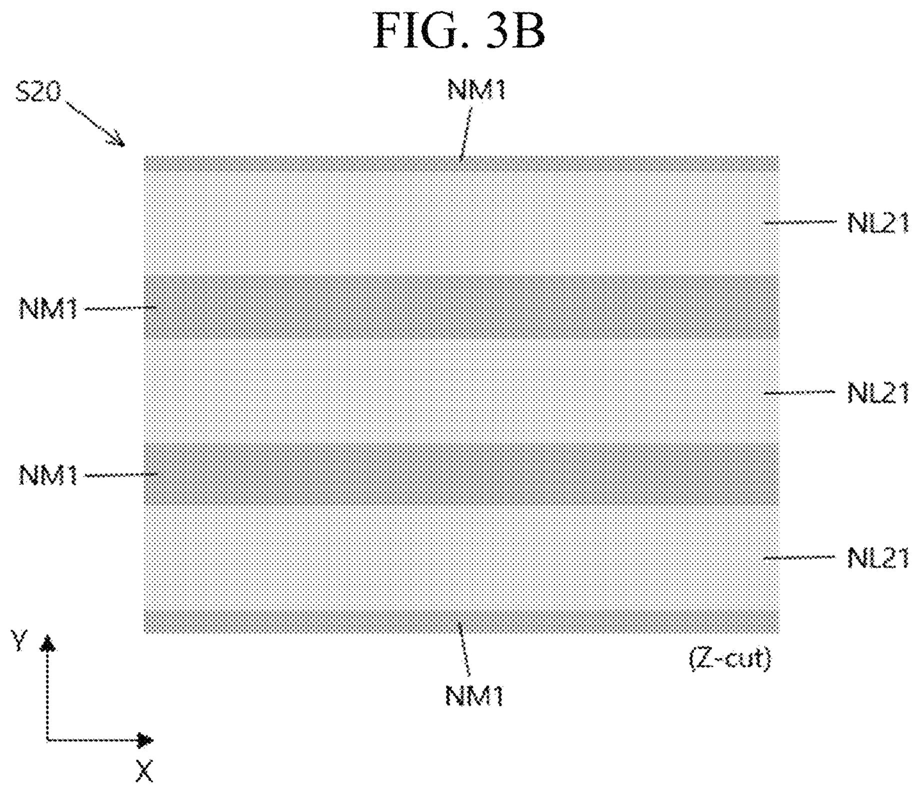

Referring to FIGS. 3A to 3C, a structure S20 including the patterned stack (S11 in FIG. 2A) and a filling material NM1 may be formed by filling the filling material NM1 between the plurality of pattern portions SP1. In other words, the structure S20 including the patterned stack (S11 in FIG. 2A) and the filling material NM1 may be formed by filling the filling material NM1 into the empty spaces on both sides of the plurality of pattern portions SP1. Here, FIG. 3B may be a cross-sectional view taken along line (A) of FIG. 3A.

The filling material NM1 may have the same (or substantially the same) height as the pattern portion SP1. The filling material NM1 may be, for example, an insulating material. In this case, the filling material NM1 may be referred to as 'an insulating material layer' or 'an insulating material layer pattern'. The filling material NM1 may be formed of the same material as the first material layer pattern NL11. As a non-limiting example, the filling material NM1 may include a silicon nitride (e.g., $SiN_x$) or be formed of a silicon nitride (e.g., $SiN_x$). Accordingly, it can be said that a plurality of second material layer patterns NL21 formed of a second material are disposed in a matrix material layer formed of a first material, where the second material has an etching selectivity with respect to the first material.

Figures 4A, 4B:
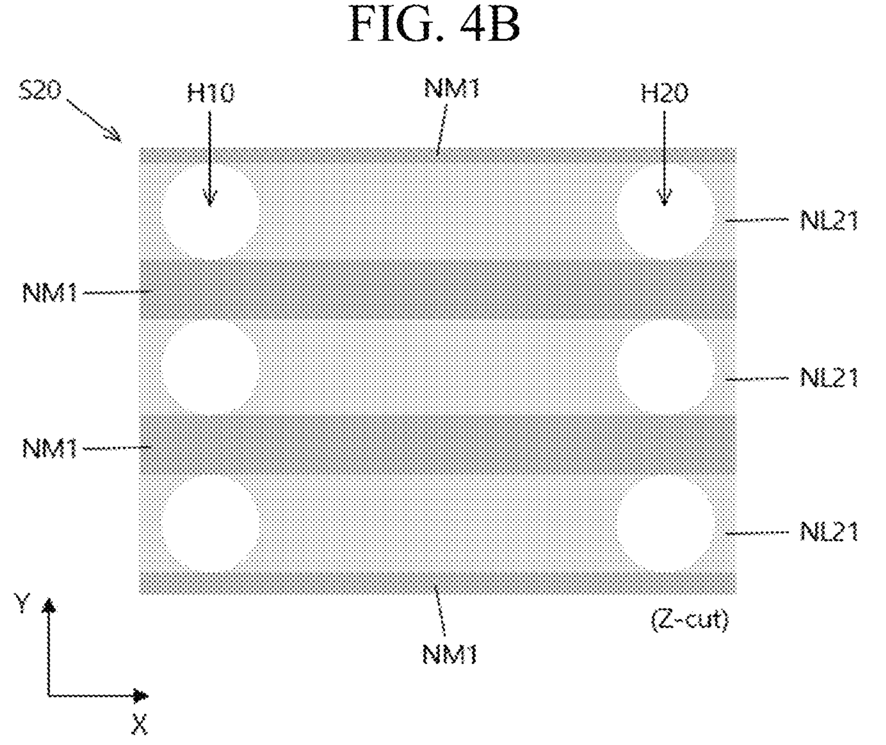
Figure 4C:
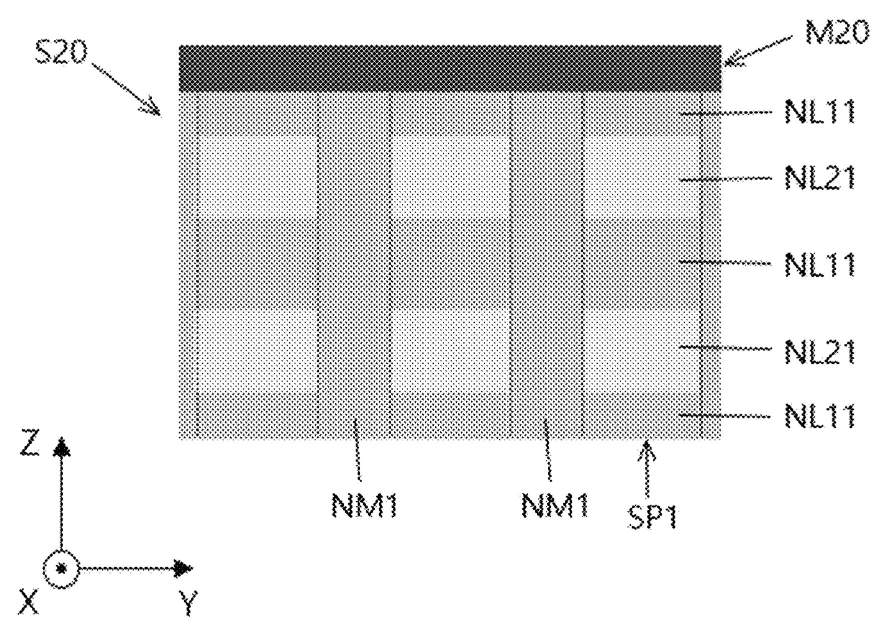

Referring to FIGS. 4A to 4C, first and second vertical holes H10 and H20 penetrating through each of the plurality of pattern portions SP1 in the vertical direction may be formed in the structure S20. In each of the plurality of pattern portions SP1, the corresponding first and second vertical holes H10 and H20 may be spaced apart from each other in the first direction, for example, the X-axis direction. Each of the first and second vertical holes H10 and H20 may be formed to penetrate through the second material layer pattern NL21. Each of the first and second vertical holes H10 and H20 may be formed so that it may penetrates from the first material layer pattern NL11 at the uppermost part of the pattern portion SP1 to the first material layer NL11 at the lowermost part in a predetermined area of the structure S20. Each of the first and second vertical holes H10 and H20 may be formed to have the same or similar width as that of the pattern portion SP1.

The first vertical hole H10 may correspond to a region where a write word line will be formed later. The second vertical hole H20 may correspond to a region where a read word line will be formed later. A plurality of first vertical holes H10 may be formed to be spaced apart from each other in the Y-axis direction. Similarly, a plurality of second vertical holes H20 may be formed to be spaced apart from each other in the Y-axis direction. As the first and second vertical holes H10 and H20 are formed, side surfaces of the first material layer pattern NL11 and the second material layer pattern NL21 may be exposed.

A second mask pattern M20 may be used to form the first and second vertical holes H10 and H20. The second mask pattern M20 may have a predetermined opening pattern. The second mask pattern M20 may be, for example, a photoresist pattern.

Figure 5A:
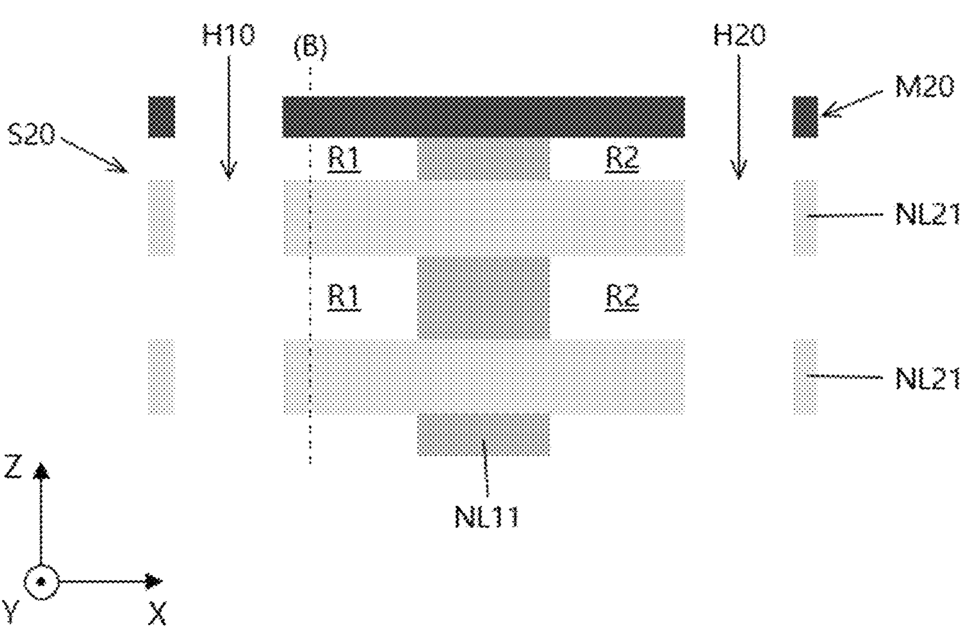
Figure 5C:
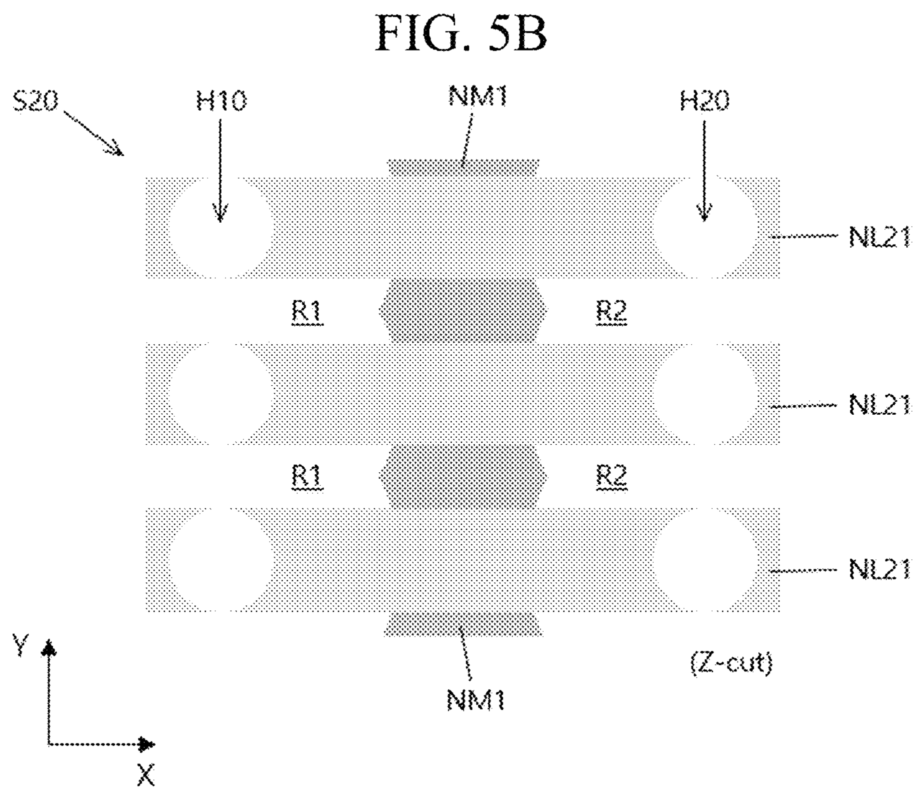

Referring to FIG. 5A to FIG. 5C, first and second recesses (recess portions) R1 and R2 which expose the second material layer pattern NL21 may be formed by recessing the first material layer pattern NL11 and the filling material NM1 around each of the first and second vertical holes H10 and H20 of the structure S20. The first recess R1 may be formed around the first vertical hole H10, and the second recess R2 may be formed around the second vertical hole H20. A portion of the first material layer pattern NL11 and a portion of the filling material NM1 may be selectively recessed (etched) by using a wet etching process using a wet etchant having etching selectivity for the first material layer pattern NL11 and the filling material NM1. The first material layer pattern NL11 and the filling material NM1 may remain in a region between the first recess R1 and the second recess R2. Then, the second mask pattern M20 may be removed. FIG. 5C may be a cross-sectional view taken along line (B) of FIG. 5A.

Then, an intermediate device structure (S30 in FIG. 12A) may be formed from the structure (S20 in FIG. 5A) by using a method as illustrated in FIGS. 6A to 12C. The intermediate element structure (S30 in FIG. 12A) may include a write bit line (WBL in FIG. 12A) extending in the horizontal direction while surrounding the second material layer pattern NL21 in the first recess R1, a read bit line (RBL in FIG. 12A) extending in the horizontal direction while surrounding the second material layer pattern NL21 in the second recess R2, and a filling insulation layer (NF1, NF2 in FIG. 12A) which fills a space around the write bit line (WBL in FIG. 12A) and the read bit line (RBL in FIG. 12A). The intermediate device structure (S30 in FIG. 12A) may be referred to as 'an intermediate stage structure' or 'an intermediate result structure'.

Figure 6A:
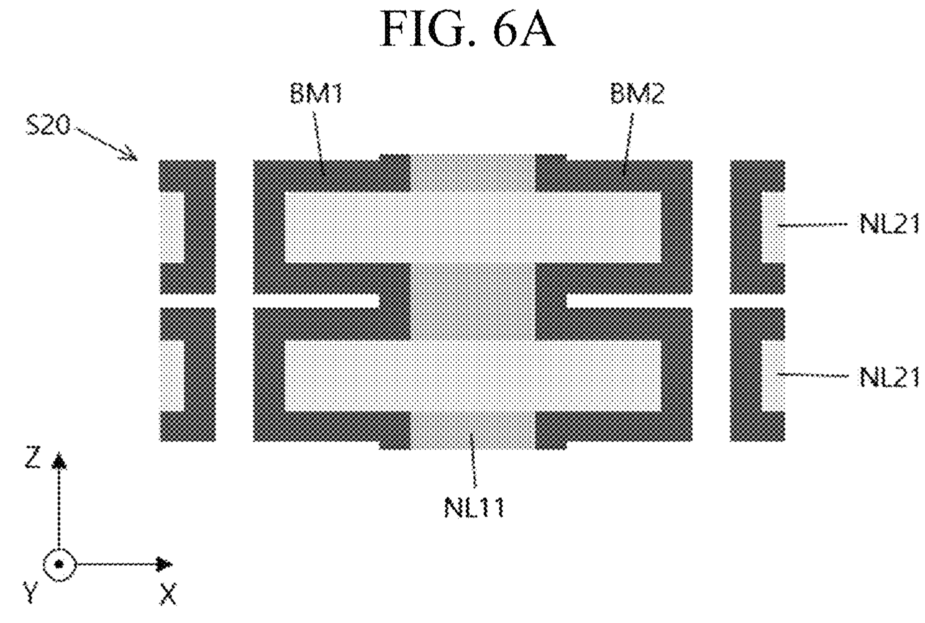
Figure 6B:
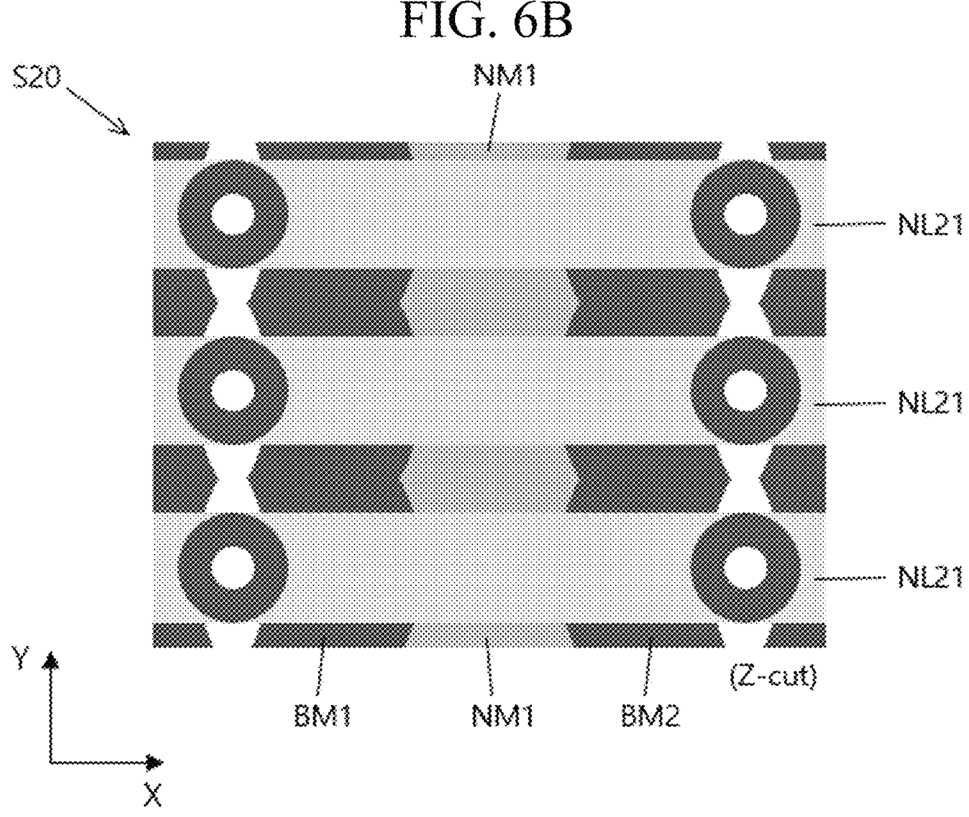
Figure 6C:
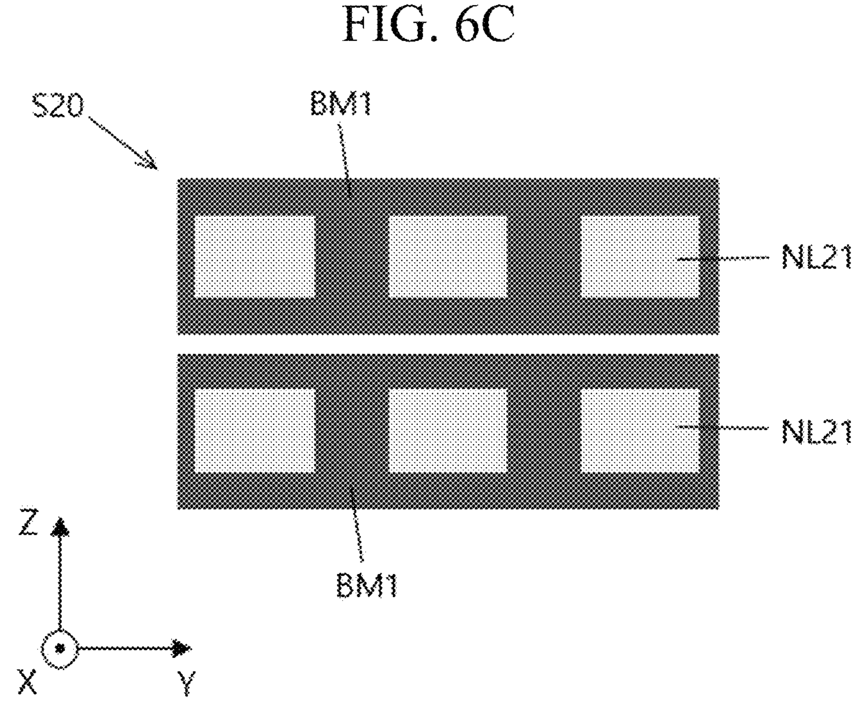

Referring to FIGS. 6A to 6C, a write bit line material layer BM1 (material layer for a write bit line) surrounding the portion of the second material layer pattern NL21 exposed in the first recess (R1 in FIG. 5A), and a read bit line material layer BM2 (material layer for a read bit line) surrounding the portion of the second material layer pattern NL21 exposed in the second recess (R2 in FIG. 5A) may be formed. The write bit line material layer BM1 may have a shape extending in the Y-axis direction while covering a top, a bottom, and side surfaces of a first exposed portion of the second material layer pattern NL21. The read bit line material layer BM2 may have a shape extending in the Y-axis direction while covering a top, a bottom, and side surfaces of a second exposed portion of the second material layer pattern NL21. The write bit line material layer BM1 and the read bit line material layer BM2 may be formed together by the same material. The write bit line material layer BM1 and the read bit line material layer BM2 may be formed of a metal, a metal compound, or other conductive material. The write bit line material layer BM1 and the read bit line material layer BM2 may be formed by a deposition method.

The write bit line material layer BM1 and the read bit line material layer BM2 may be generally conformally according to a shape of surface regions exposed in the first and second recesses (R1 and R2 in FIG. 5A). At this time, as shown in FIGS. 6A and 6C, a gap in the Z-axis direction between the two second material layer patterns NL21 spaced apart in the Z-axis direction may be greater than about 2 times of the thickness of the bit line material layer BM1 and BM2. Meanwhile, as shown in FIG. 6B, a gap in the Y-axis direction between the two second material layer patterns NL21 spaced apart in the Y-axis direction may be smaller than about 2 times of the thickness of the bit line material layer BM1 and BM2.

Figure 7A:
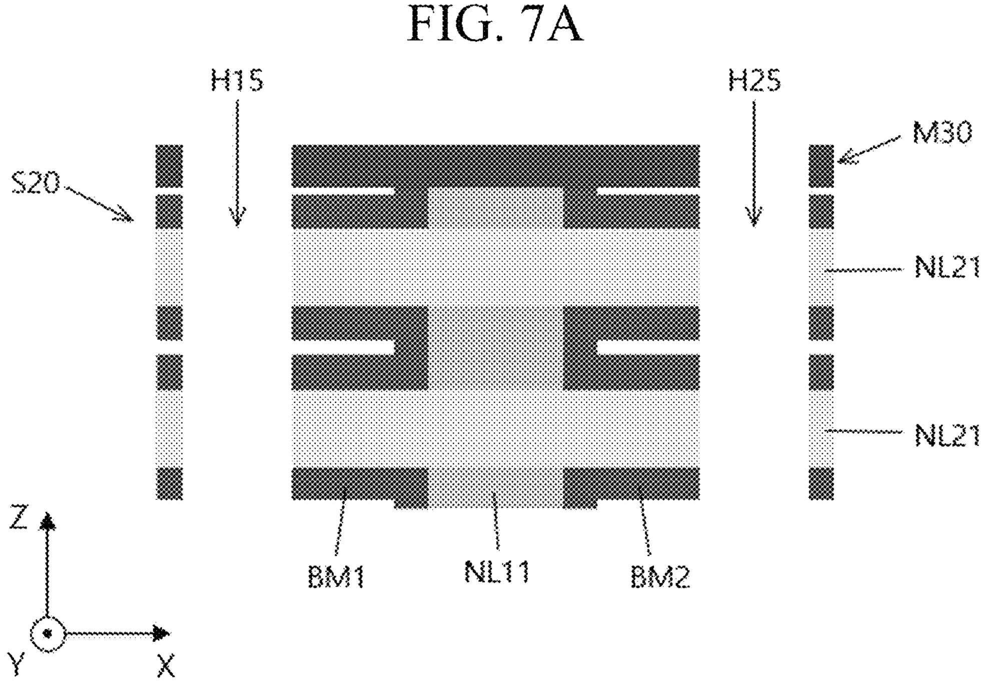
Figure 7B:
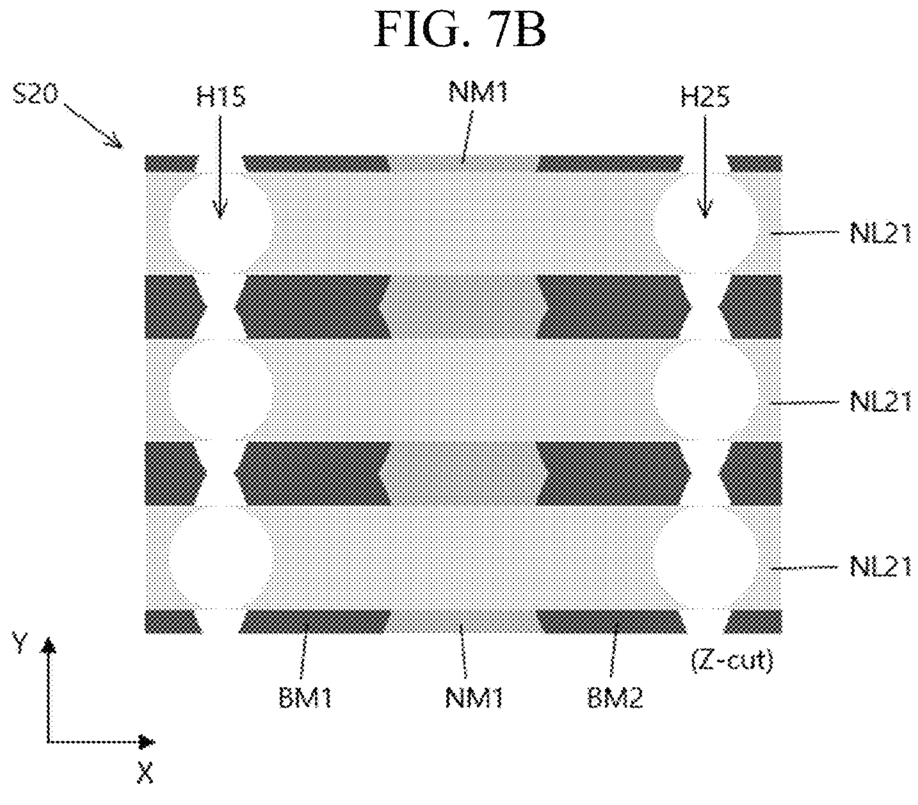
Figure 7C:
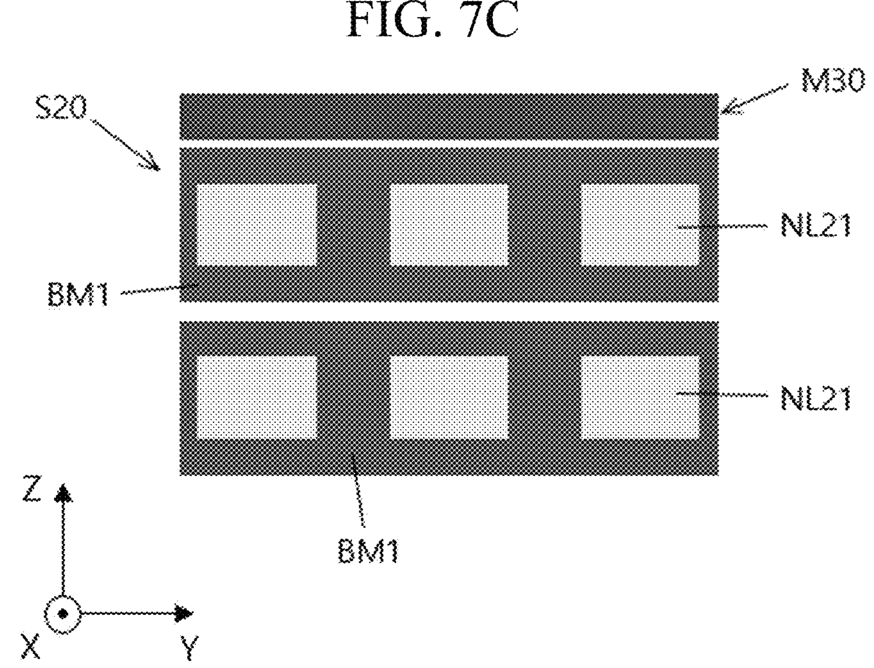

Referring to FIG. 7A to FIG. 7C, first and second through-holes H15, H25 corresponding to the first and second vertical holes (H10, H20 in FIG. 4A), respectively by etching a region corresponding to the first vertical hole (H10 in FIG. 4A) in the write bit line material layer BM1 and the area corresponding to the second vertical hole in the read bit line material layer BM2. The first and second through-holes H15 and H25 may be vertical holes. A third mask pattern M30 may be used to form the first and second through-holes H15 and H25. At this time, the third mask pattern M30 may be formed after filling the empty space formed around the write bit line material layer BM1 and the read bit line material layer BM2 with a filling material. The filling material must be a material which has a selectivity with the second material layer pattern NL21, the write bit line material layer BM1, and the read bit line material layer BM2, and may be removed after removing the third mask pattern M30. The third mask pattern M30 may have a predetermined opening pattern. The third mask pattern M30 may be, for example, a photoresist pattern. After forming the first and second through-holes H15 and H25, the third mask pattern M30 may be removed. However, the removal timing of the third mask pattern M30 may vary. For example, the third mask pattern M30 may be removed after the recess process described in FIG. 8A.

Figure 8A:
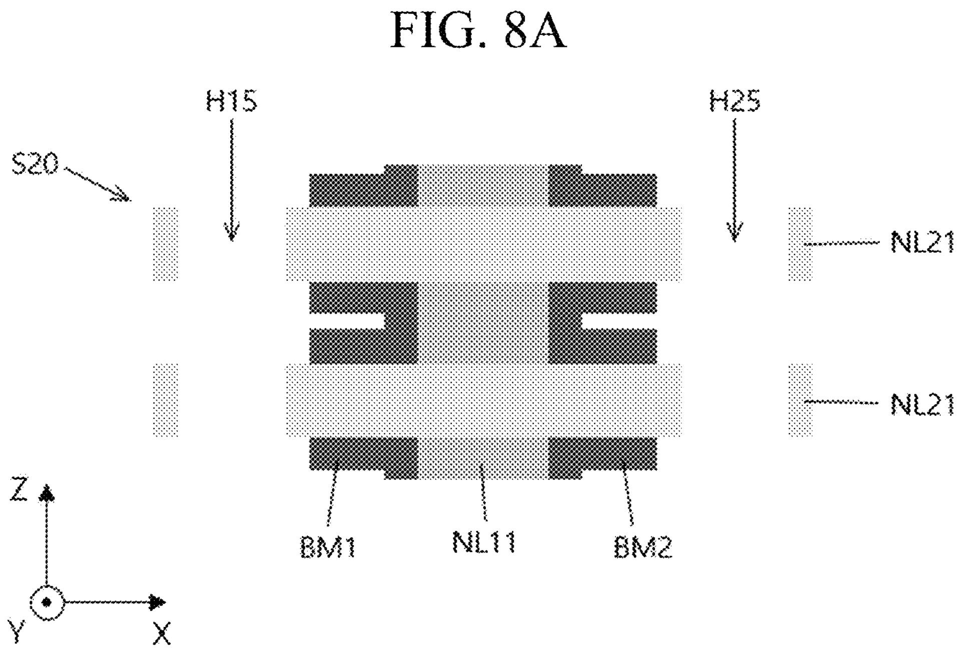
Figure 8B:
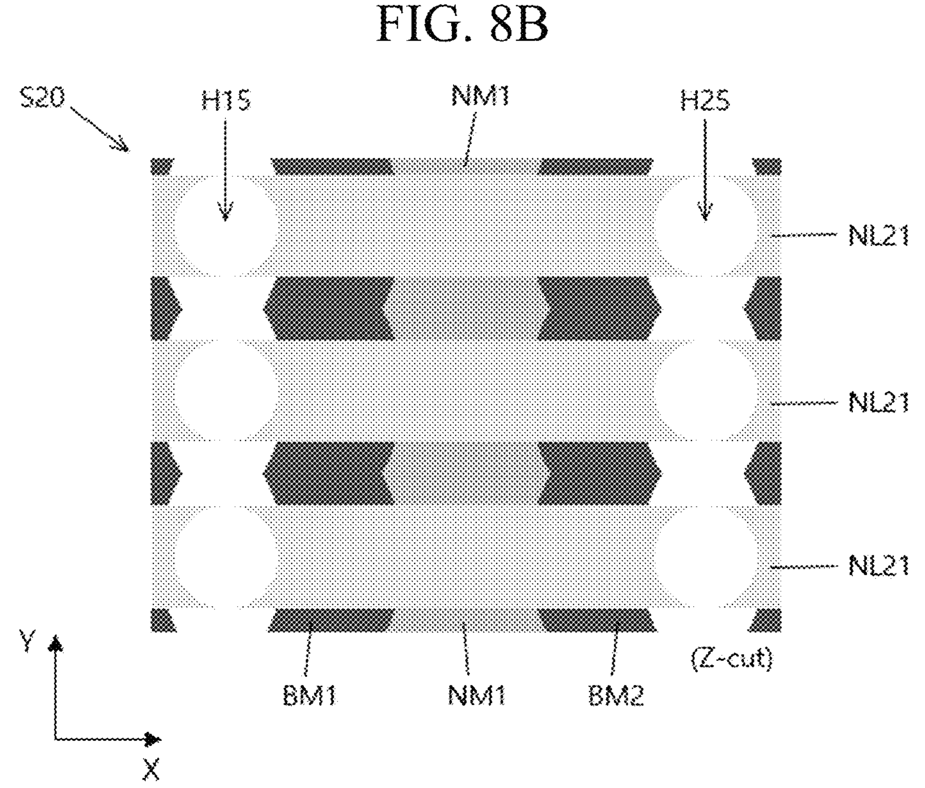
Figure 8C:
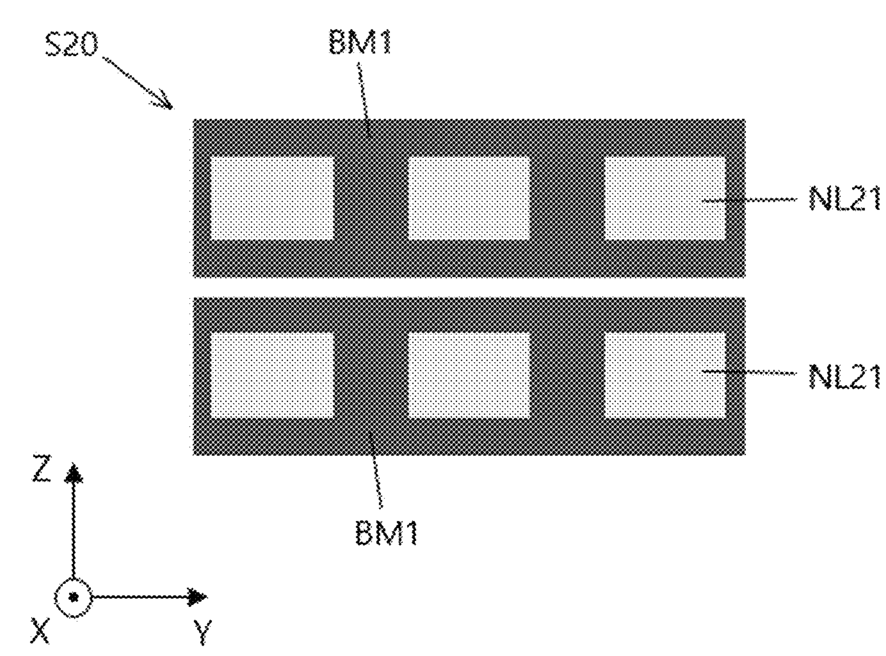

Referring to FIG. 8A to FIG. 8C, a portion of the write bit line material layer BM1 exposed by the first through-hole H15, and a portion of the read bit line material layer BM2 exposed by the second through-hole H25 may be recessed. Accordingly, a portion of the second material layer pattern NL21 around the first through-hole H15 may protrude toward the first through-hole H15 rather than the write bit line material layer BM1. Similarly, a portion of the second material layer pattern NL21 around the second through-hole H25 may protrude toward the second through-hole H25 rather than the read bit line material layer BM2.

Figure 9A:
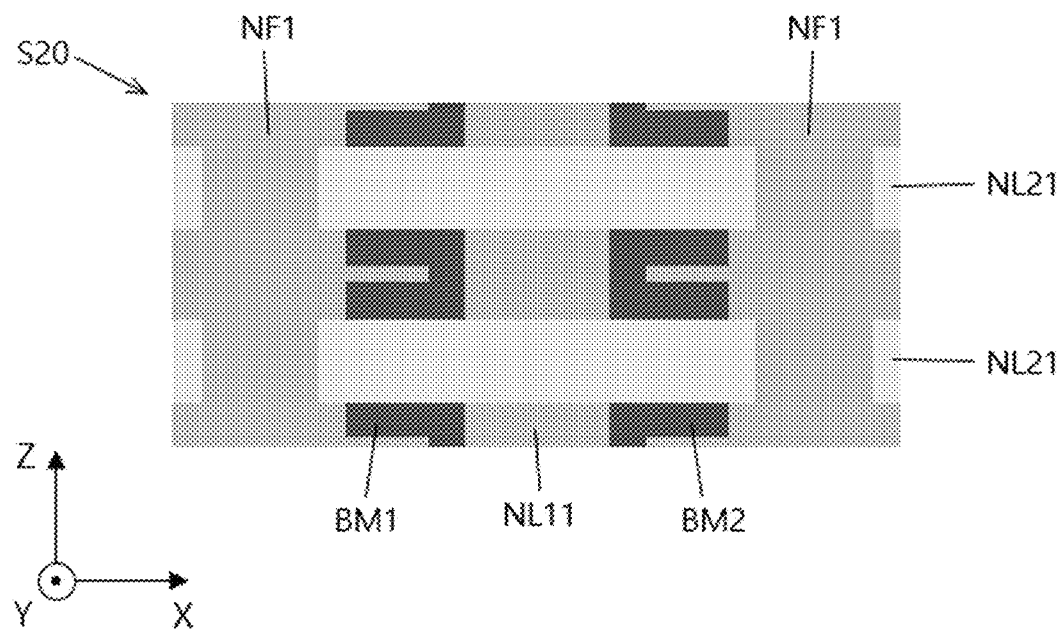
Figure 9B:
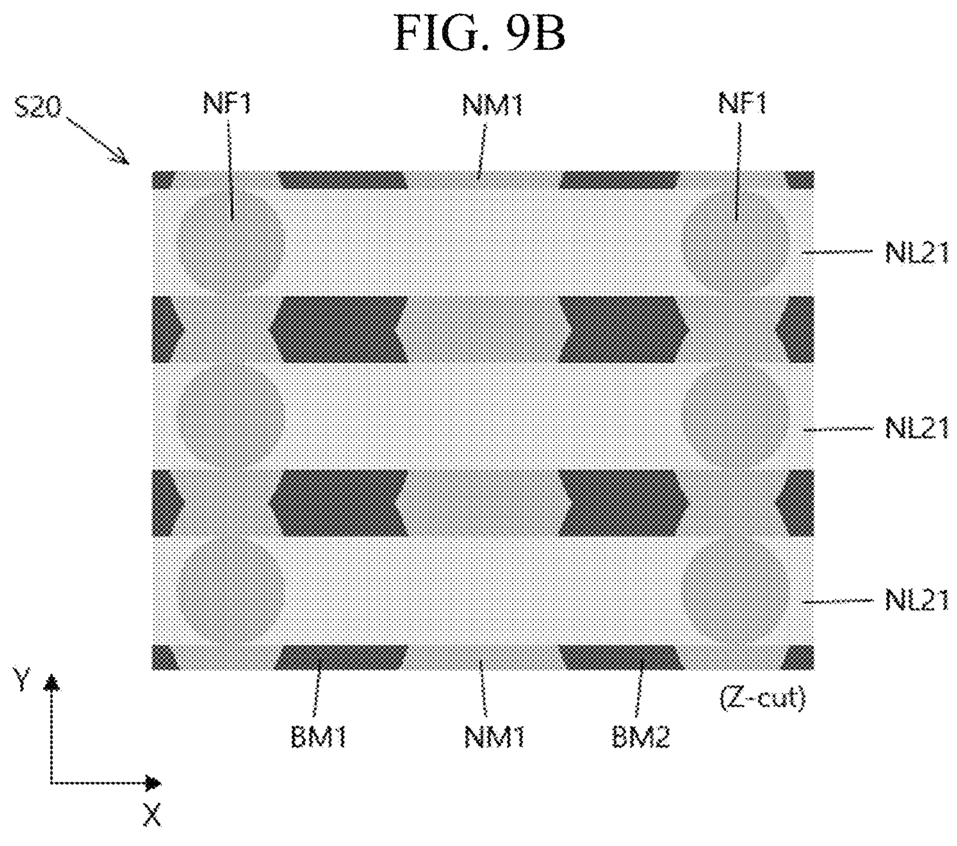
Figure 9C:
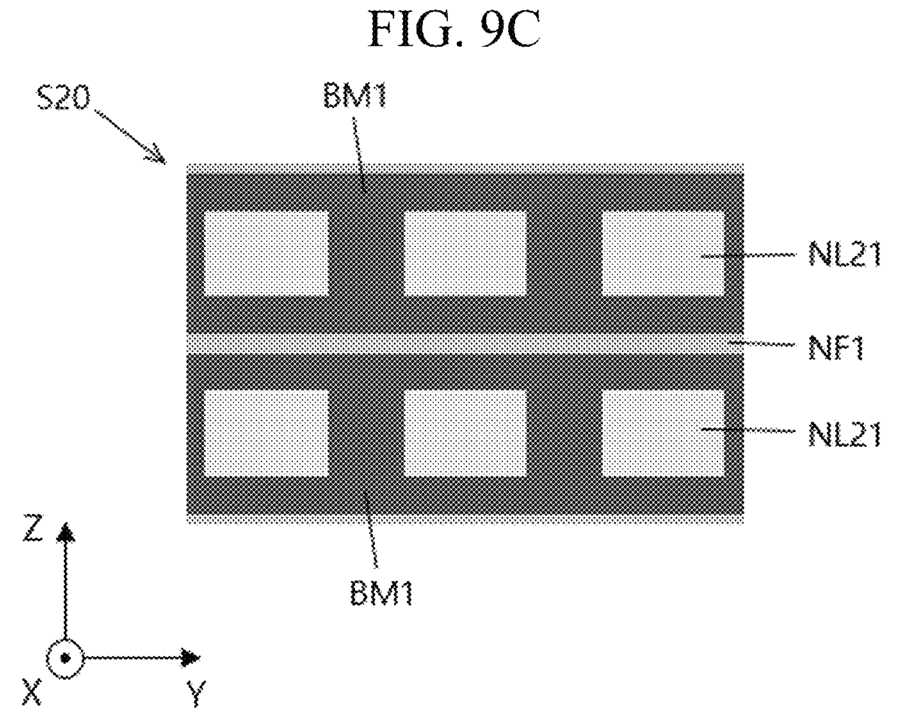

Referring to FIGS. 9A to 9C, a first filling insulating layer NF1 may be formed to fill the first and second through-holes (H15 and H25 in FIG. 8A). The first filling insulating layer NF1 may be a type of gap fill material layer. As a non-limiting example, the first filling insulating layer NF1 may include a silicon nitride (e.g., $SiN_x$) or may be formed of a silicon nitride (e.g., $SiN_x$). The first filling insulating layer NF1 may be formed to fill the first and second through-holes (H15 and H25 in FIG. 8A) and to fill empty spaces of bent portions of the bit line material layers BM1 and BM2 around them.

Figure 10A:
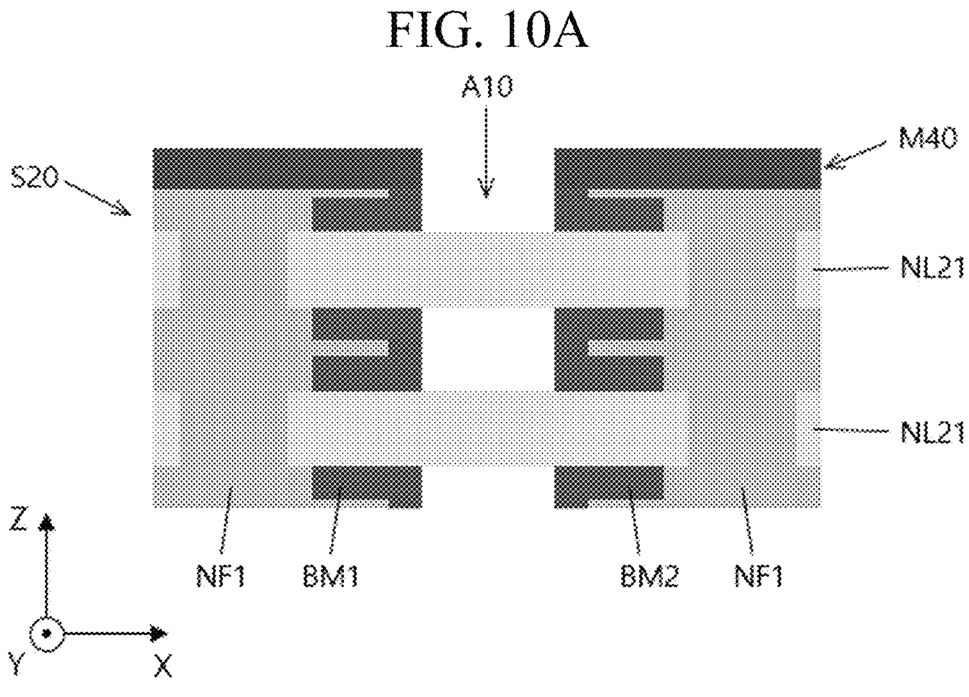
Figure 10B:
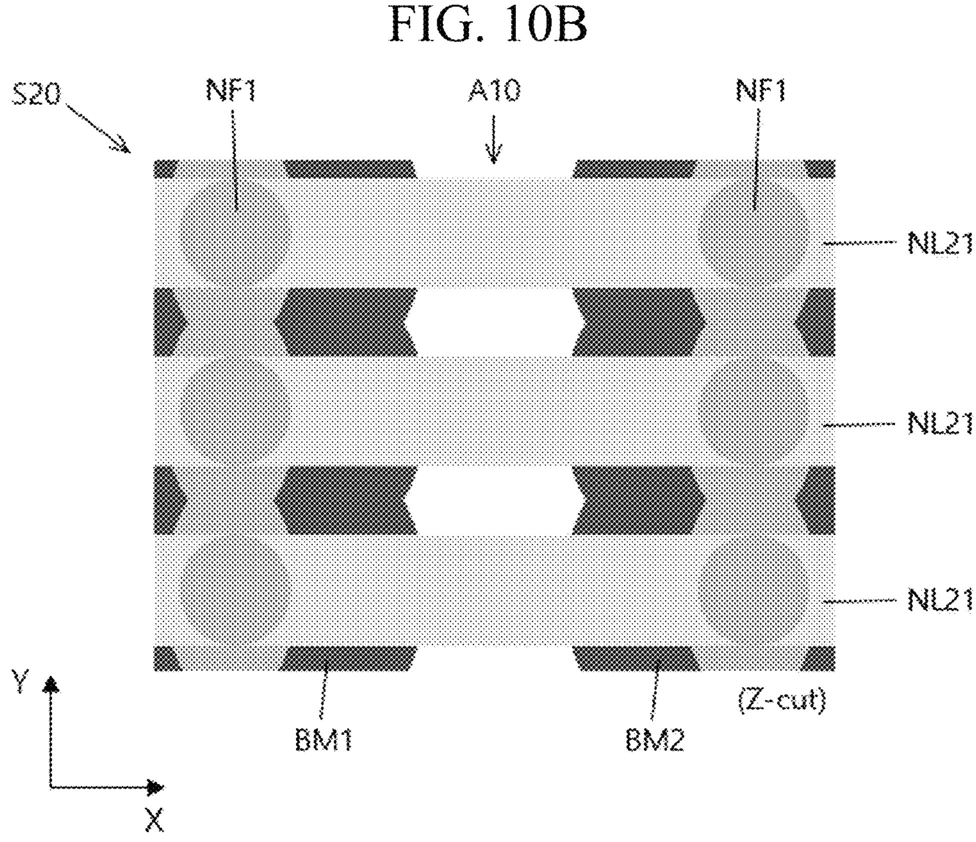
Figure 10C:
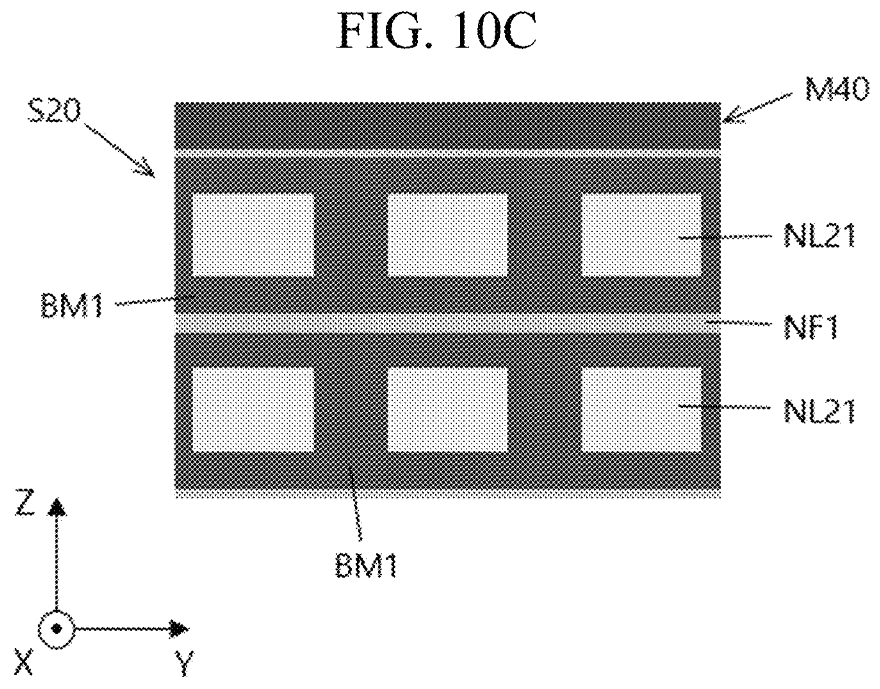

Referring to FIGS. 10A to 10C, the first material layer pattern (NL11 in FIG. 9A) and the filling material (NL11 in FIG. 9B) between the write bit line material layer BM1 and the read bit line material layer BM2 may be removed to form an opening region A10. Side surfaces of the write bit line material layer BM1 and the read bit line material layer BM2 may be exposed by the opening region A10. A fourth mask pattern M40 may be used to form the opening region A10. The fourth mask pattern M40 may have a predetermined opening pattern. The fourth mask pattern M40 may be, for example, a photoresist pattern. After forming the opening region A10, the fourth mask pattern M40 may be removed.

Figure 11A:
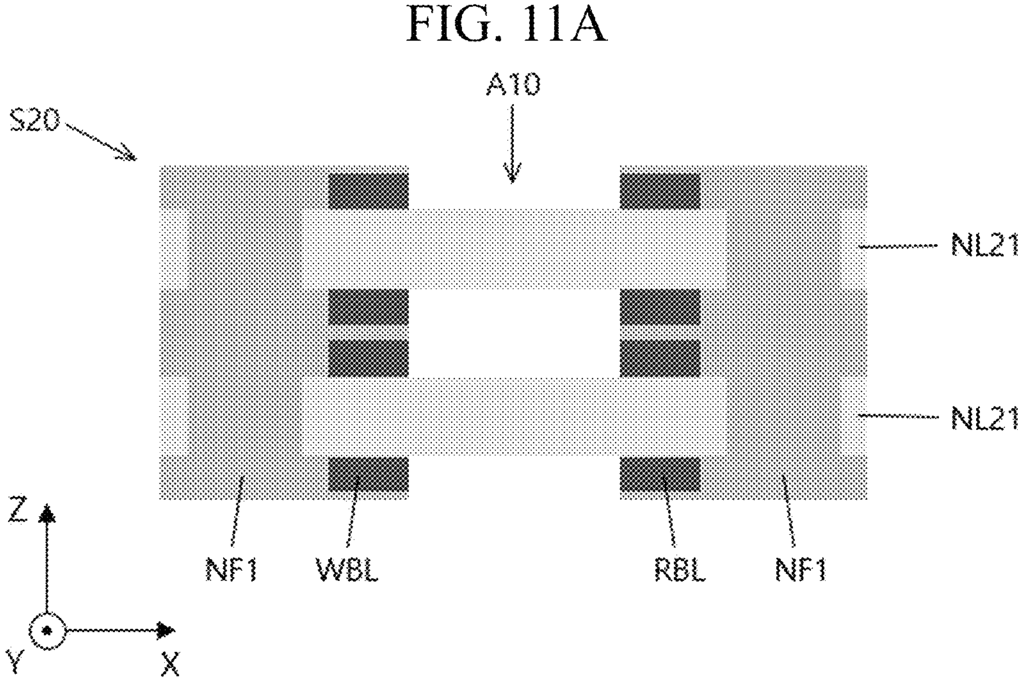
Figure 11B:
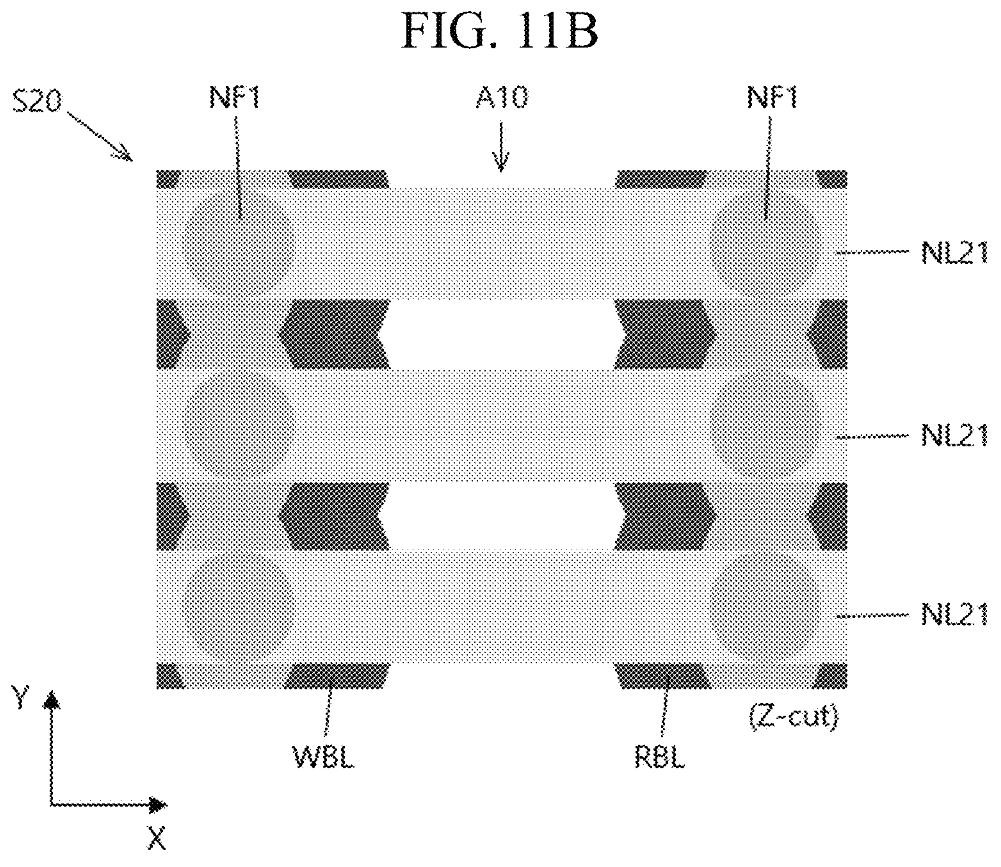
Figure 11C:
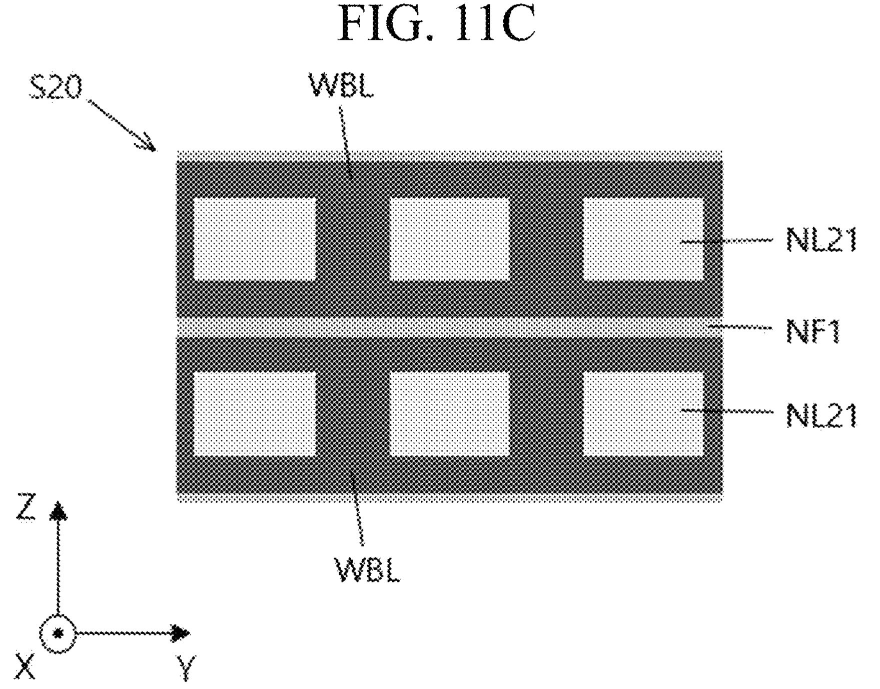

Referring to FIGS. 11A to 11C, a write bit line WBL may be formed from the write bit line material layer (BM1 in FIG. 10A), and a read bit line RBL may be formed from the read bit line material layer (BM2 in FIG. 10A) by recessing a portion of each of the write bit line material layer (BM1 in FIG. 10A) and the read bit line material layer (BM2 in FIG. 10A) exposed by the opening region A10. In this step, a portion of the write bit line material layer surrounding the lower second material layer pattern NL21, and a portion of the write bit line material layer surrounding the upper second material layer pattern NL21 may be separated from each other. Furthermore, a portion of the read bit line material layer surrounding the lower second material layer pattern NL21 and a portion of the read bit line material layer surrounding the upper second material layer pattern NL21 may be separated from each other. The write bit line WBL may extend horizontally in the Y-axis direction while surrounding a portion of the second material layer pattern NL21. Similarly, the read bit line RBL may extend horizontally in the Y-axis direction while surrounding a portion of the second material layer pattern NL21. The opening region A10 in FIG. 11A may be said to be an expanded opening region.

Figure 12A:
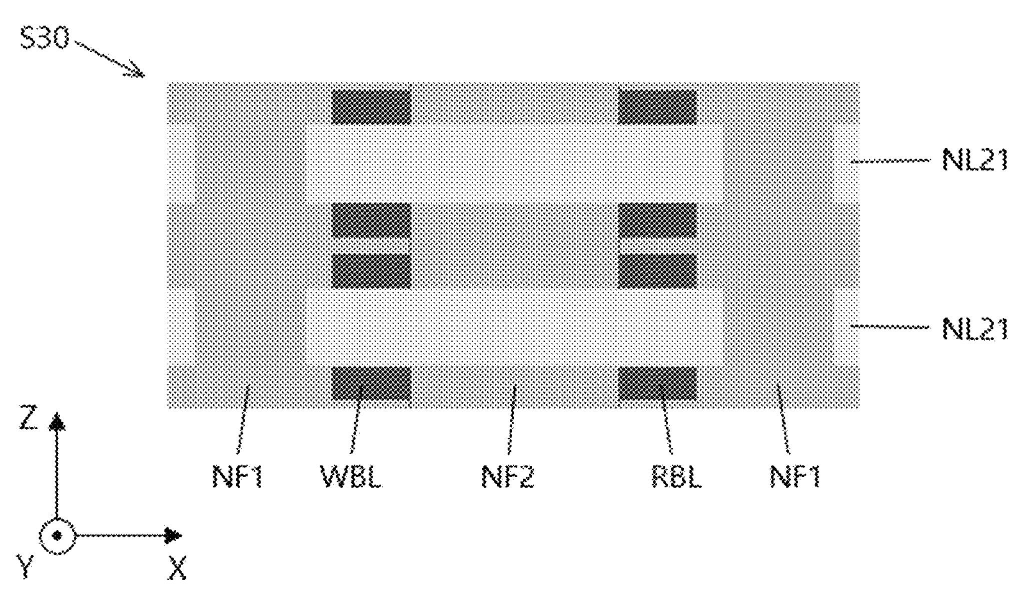
Figure 12B:
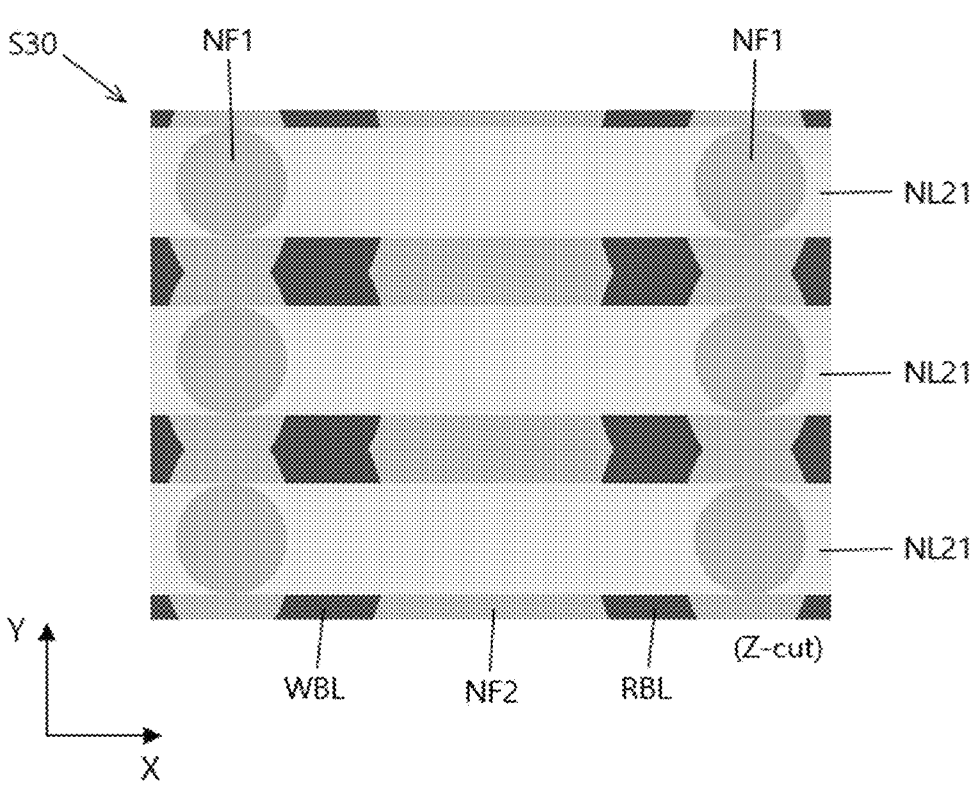
Figures 12C, 13A:
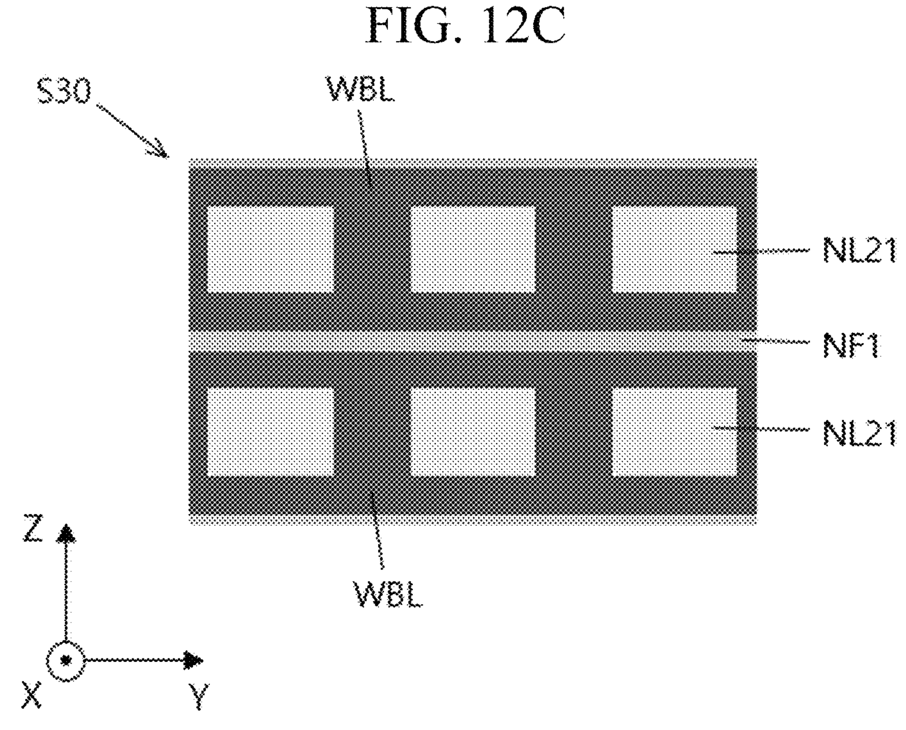

Referring to FIGS. 12A to 12C, a second filling insulating layer NF2 may be formed to fill the opening region (A10 in FIG. 11A). The second filling insulating layer NF2 may be a type of gap fill material layer. The second filling insulating layer NF2 may be formed of the same material as the first filling insulating layer NF1 or may be formed of a similar material. As a non-limiting example, the second filling insulating layer NF2 may include a silicon nitride (e.g., $SiN_x$) or be formed of a silicon nitride (e.g., $SiN_x$). When forming the second filling insulating layer NF2, if there is an insulating material (an insulating material for forming NF2) deposited on top of the first filling insulating layer NF1, for example, this may be removed through an etchback process, etc. The structure of FIGS. 12A to 12C may be referred to as an intermediate device structure S30.

Although the method for forming the intermediate device structure S30 from the structure (S20 in FIG. 5A) has been described in detail with reference to FIGS. 6A to 12C, this is only an example, and the specific method for forming the intermediate device structure S30 may vary depending on the case. The intermediate element structure S30 may also be referred to as an 'intermediate stage structure' or an 'intermediate result structure'.

Figure 13B:
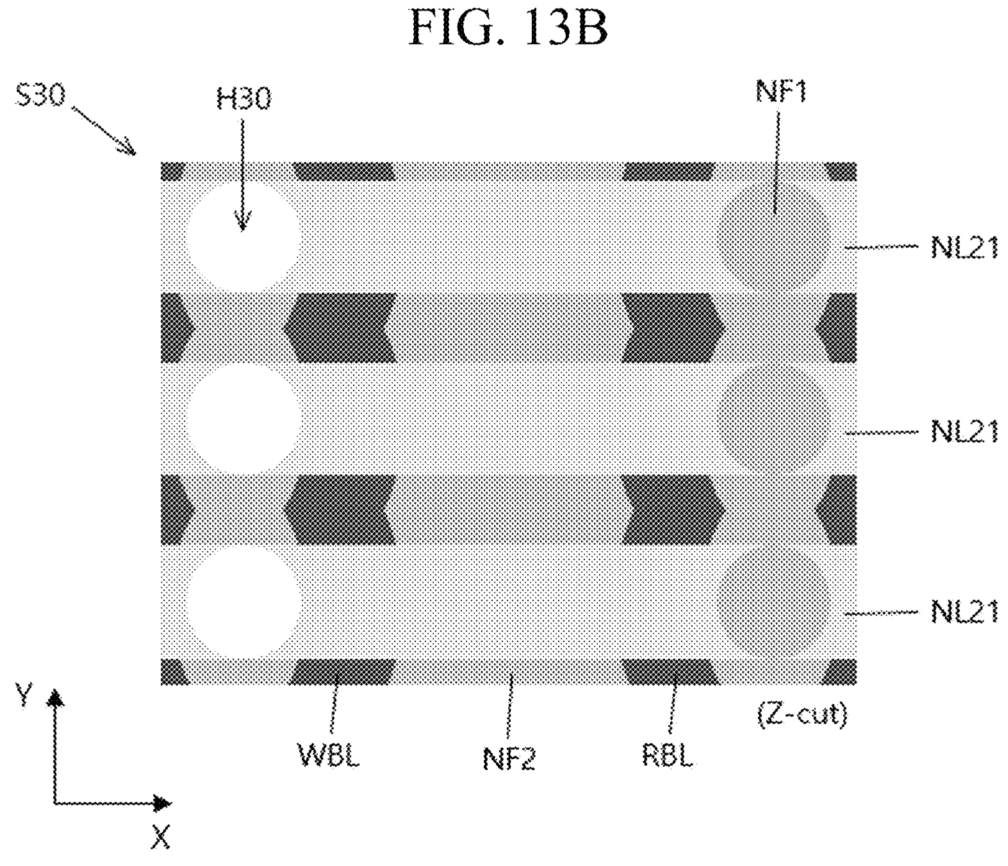
Figure 13C:
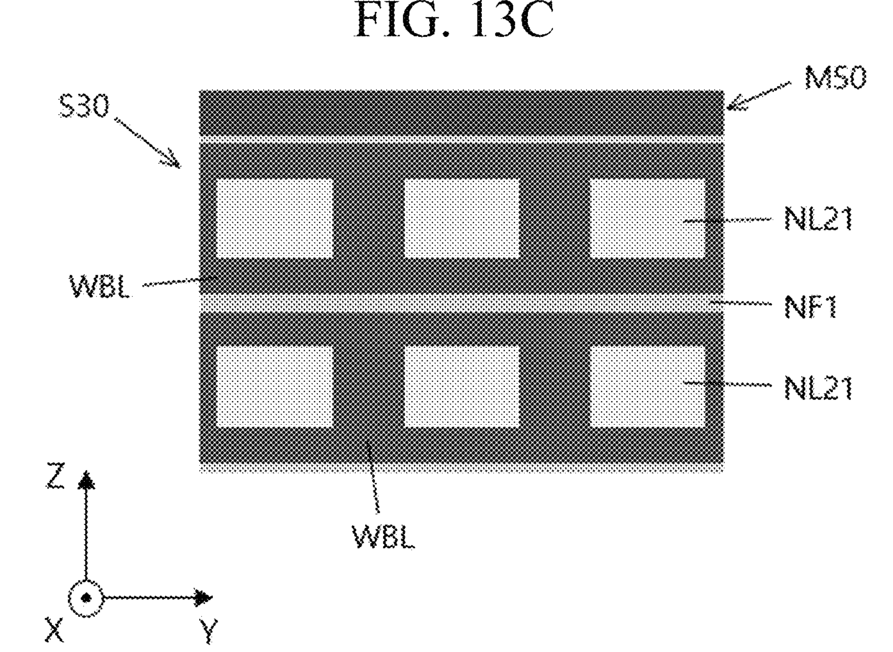

Referring to FIGS. 13A to 13C, a third vertical hole H30 may be formed in a region which corresponds to or substantially corresponds to the first vertical hole (H10 in FIG. 4A) in the intermediate device structure S30. A fifth mask pattern M50 may be used to form the third vertical hole H30. The fifth mask pattern M50 may have a predetermined opening pattern. The fifth mask pattern M50 may be, for example, a photoresist pattern. After forming the third vertical hole H30, the fifth mask pattern M50 may be removed. A side surface of the second material layer pattern NL21 may be exposed by the third vertical hole H30. In other words, the side surface of the second material layer pattern NL21 may be exposed by the third vertical hole H30 in a region where the write word line will be formed. For reference, the expression 'corresponding' in this specification may mean the same thing, but may be a concept which broadly encompasses the same or similar things. This may be applied equally throughout this specification.

Figure 14A:
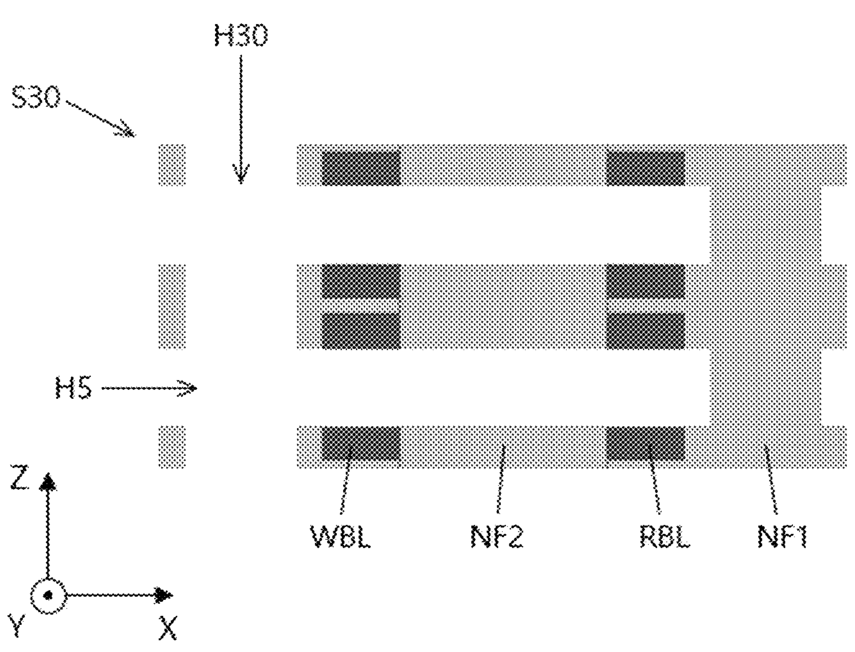
Figure 14B:
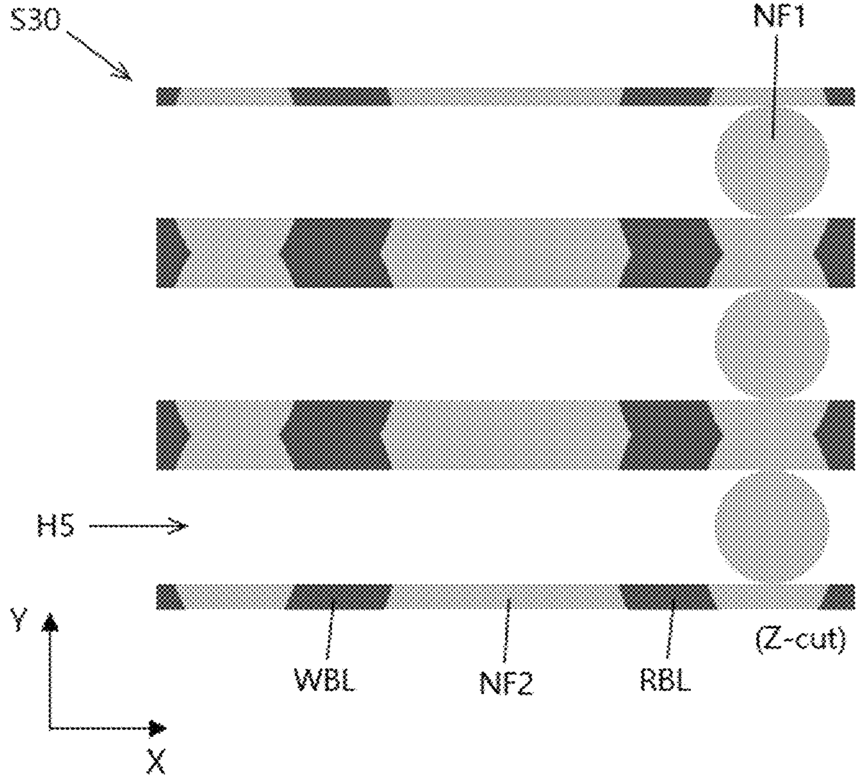
Figures 14C, 15A:
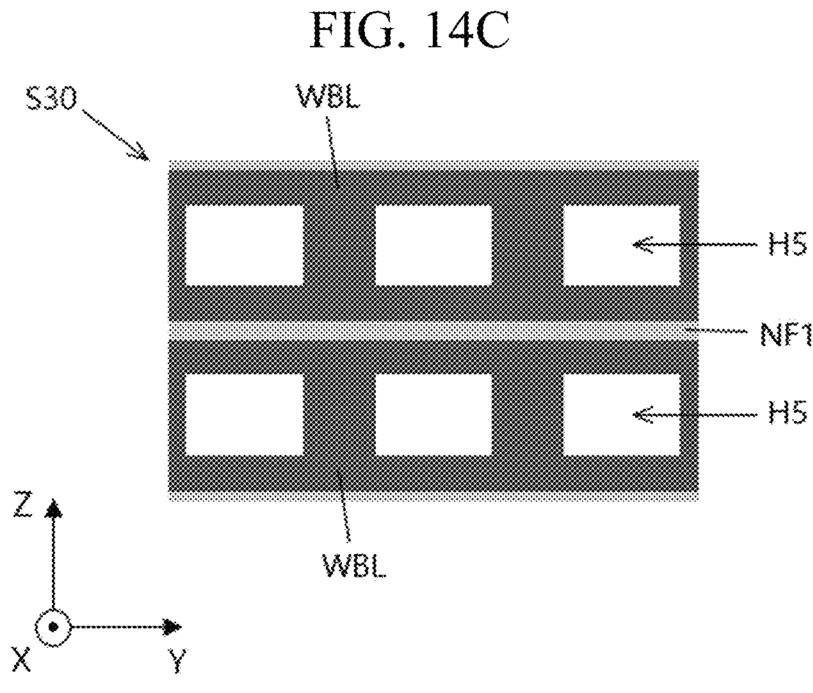

Referring to FIG. 14A to FIG. 14C, a horizontal hole H5 which exposes the write bit line WBL and the read bit line RBL may be formed by removing the second material layer pattern NL21 exposed by the third vertical hole H30. The horizontal hole H5 may extend in the first direction, for example, the X-axis direction. A wet etchant having etching selectivity for the second material layer pattern (NL21 in FIG. 13A), that is, a wet etching solution, may be injected through the third vertical hole H30 to selectively etch the second material layer pattern (NL21 in FIG. 13A). The horizontal hole H5 may have a line shape or a bar shape extending in the X-axis direction.

Then, a read transistor structure (TR in FIG. 23A) electrically connected to the read bit line RBL in the horizontal hole H5, and a write transistor structure (TW in FIG. 23A) electrically connected to the write bit line WBL may be formed by using a method as illustrated in FIGS. 15A to 24C. The read transistor structure (TR in FIG. 23A) may include a first channel layer, a first gate insulating layer, and a first gate electrode. The write transistor structure (TW in FIG. 23A) may include a second channel layer, a second gate insulating layer, and a second gate electrode, and the second channel layer may be electrically connected to the first gate electrode.

Figure 15B:
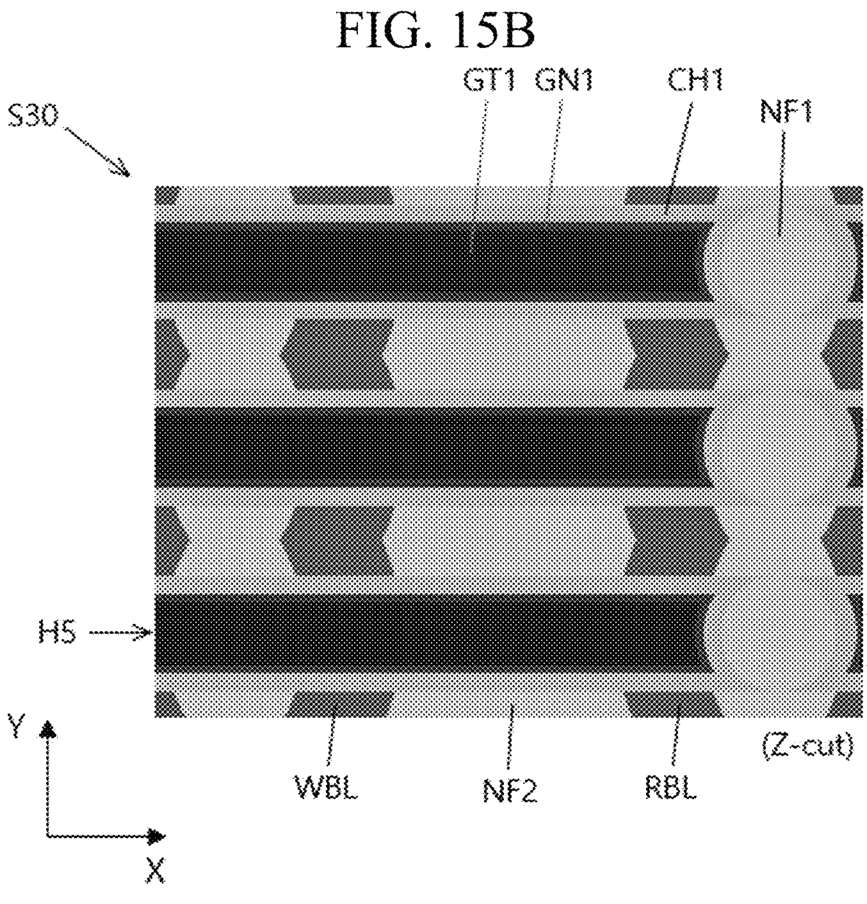
Figure 15C:
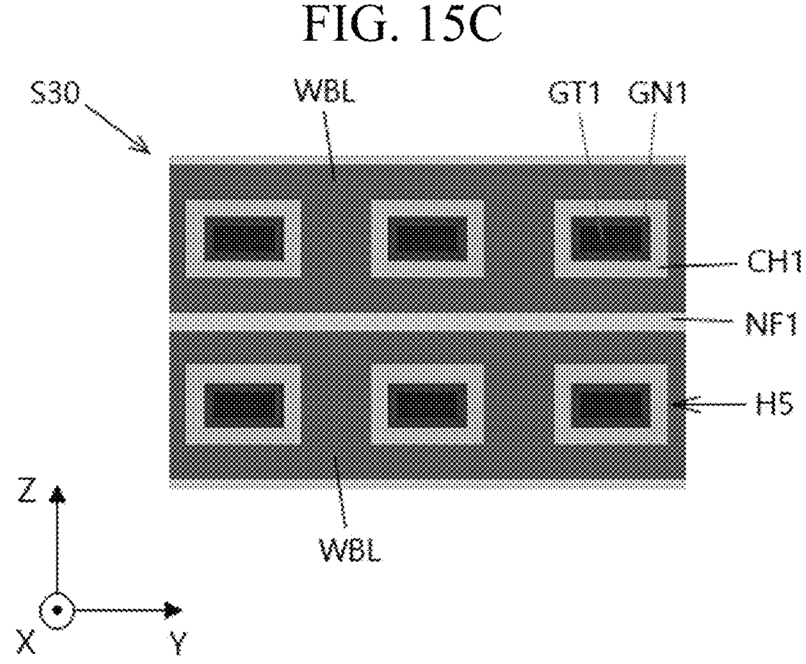

Referring to FIGS. 15A to 15C, a first channel material layer CH1 and a first gate insulating material layer GN1 may be sequentially formed on inner surfaces of the horizontal hole H5 and the third vertical hole H30. The first channel material layer CH1 and the first gate insulating material layer GN1 may be formed conformally according to the shape of the inner surfaces of the horizontal hole H5 and the third vertical hole H30. The first channel material layer CH1 and the first gate insulating material layer GN1 may be formed to be so thin that they may not fill the interior of the horizontal hole H5 and the third vertical hole H30. The first channel material layer CH1 and the first gate insulating material layer GN1 may be formed through, for example, an atomic layer deposition (ALD) process.

The first channel material layer CH1 may include, for example, an oxide semiconductor. For example, the oxide semiconductor may include at least one selected from the group consisting of indium gallium zinc oxide (IGZO), zinc tin oxide (ZTO), and indium tin oxide (ITO). However, the specific material of the first channel material layer CH1 is not limited to the above and may vary in various ways. In some cases, the first channel material layer CH1 may include a non-oxide semiconductor. The first channel material layer CH1 may be a single layer or a multilayer.

The first gate insulating material layer GN1 may be formed to include at least any one selected from a silicon oxide, a silicon nitride, a nitrogen oxide, and a high-k material. Here, the high-k material may be a material with a higher dielectric constant as compared with a silicon nitride. The specific material of the first gate insulating material layer GN1 is not limited to the above and may vary in various ways.

Next, a first gate electrode material layer GT1 filling the horizontal hole H5 and the third vertical hole H30 may be formed on the first gate insulating material layer GN1. The first gate electrode material layer GT1 may be formed by a metal, a metal compound, or another conductive material. The first gate electrode material layer GT1 may be formed through, for example, an ALD process.

Figures 16A, 16B:
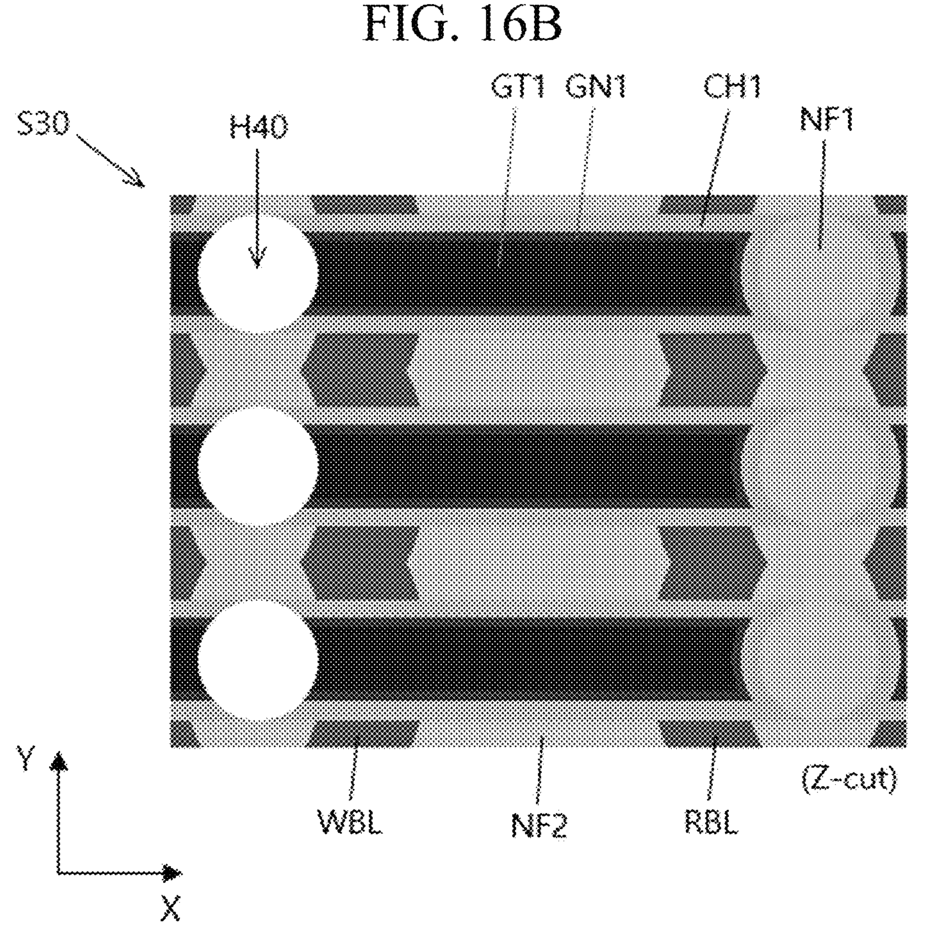
Figures 16C, 17A:
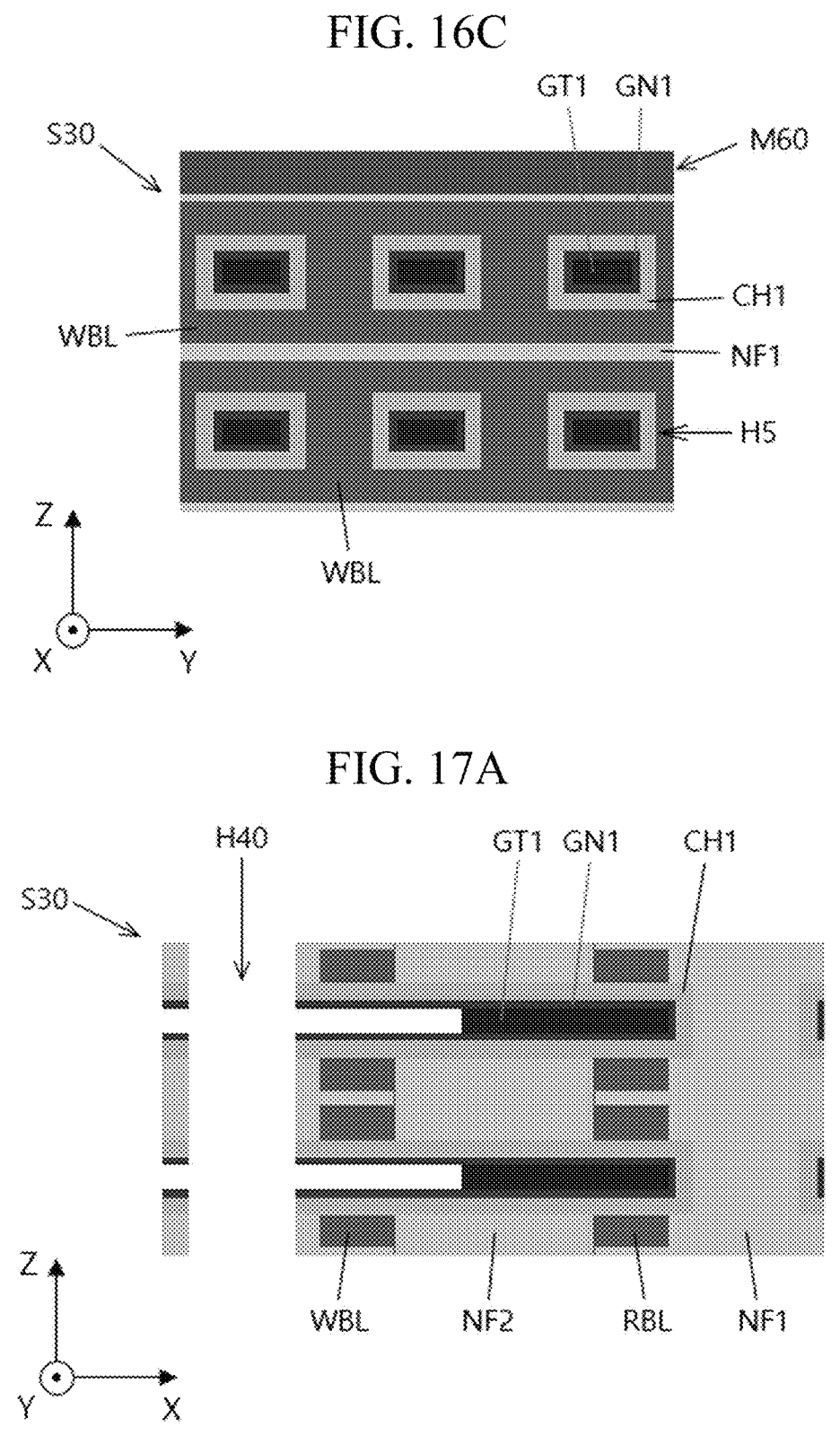

Referring to FIG. 16A to FIG. 16C, a fourth vertical hole H40 may be formed in a region corresponding to the third vertical hole (H30 in FIG. 13A) in the intermediate device structure S30 where the first channel material layer CH1, the first gate insulating material layer GN1, and the first gate electrode material layer GT1 are formed. A sixth mask pattern M60 may be used to form the fourth vertical hole H40. The sixth mask pattern M60 may have a predetermined opening pattern. The sixth mask pattern M60 may be, for example, a photoresist pattern. After forming the fourth vertical hole H40, the sixth mask pattern M60 may be removed. However, the removal timing of the sixth mask pattern M60 may vary.

Figure 17C:
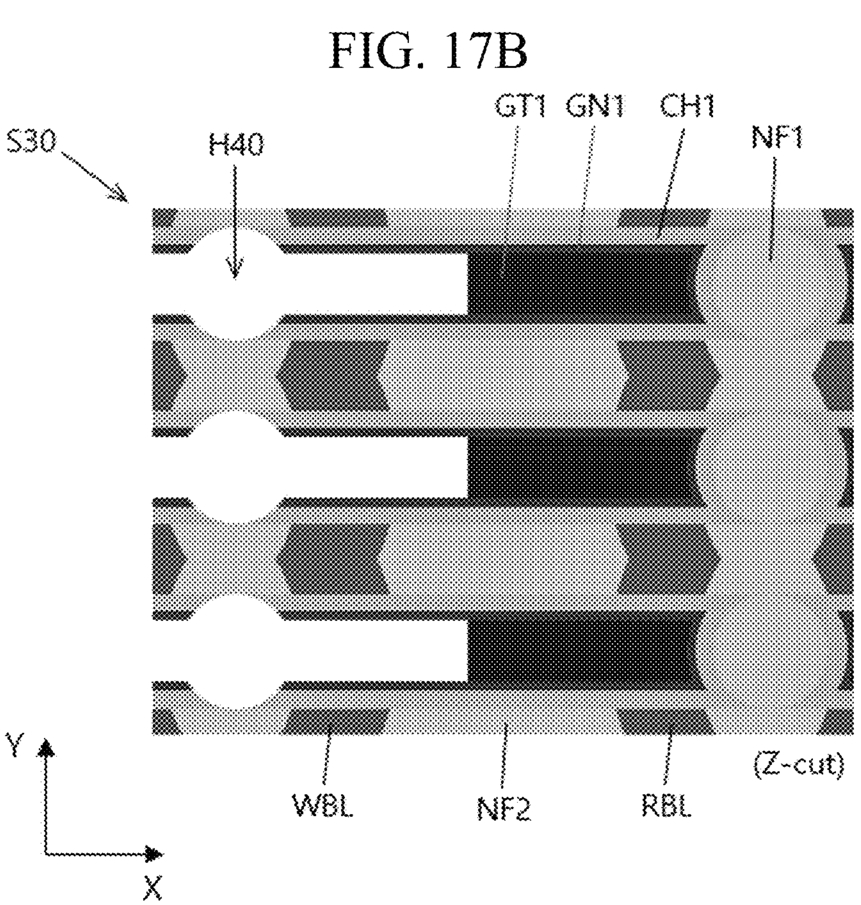

Referring to FIGS. 17A to 17C, a portion of the first gate electrode material layer GT1 exposed by the fourth vertical hole H40 may be recessed. A portion of the first gate electrode material layer GT1 surrounded by the read bit line RBL may remain inside the horizontal hole (H5 in FIG. 15A). The remaining first gate electrode material layer GT1 may be referred to as 'first gate electrode GT1'.

Figure 18A:
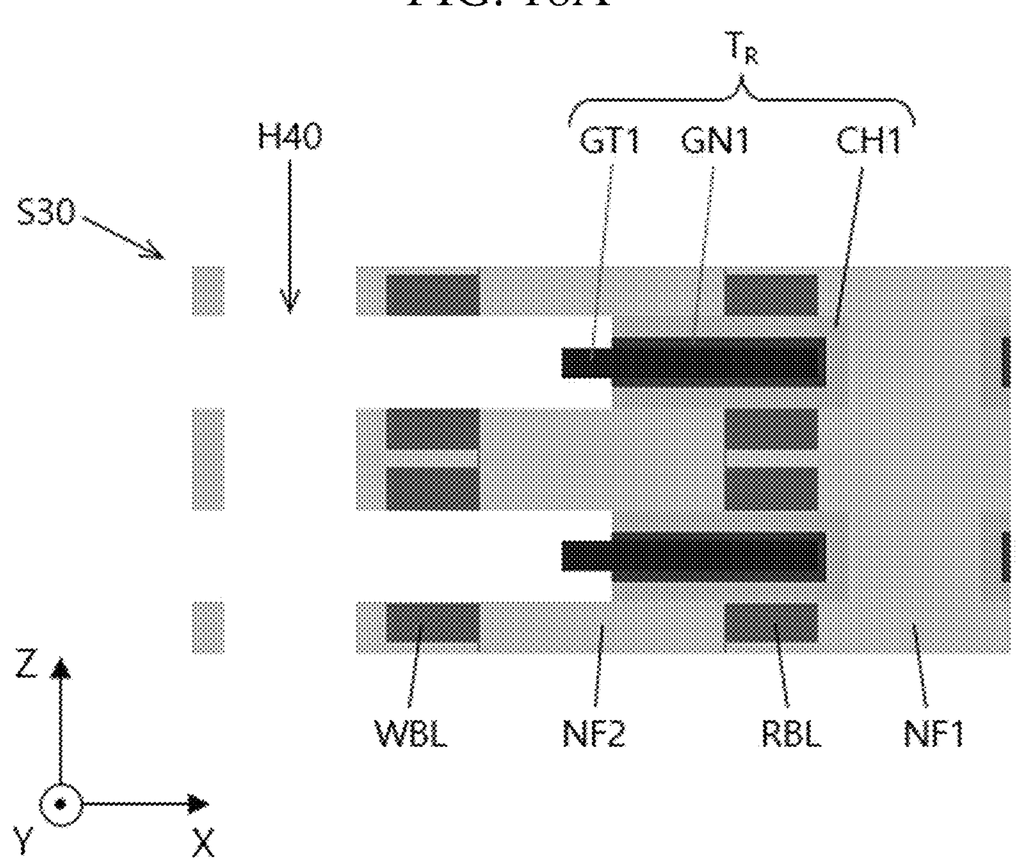
Figure 18B:
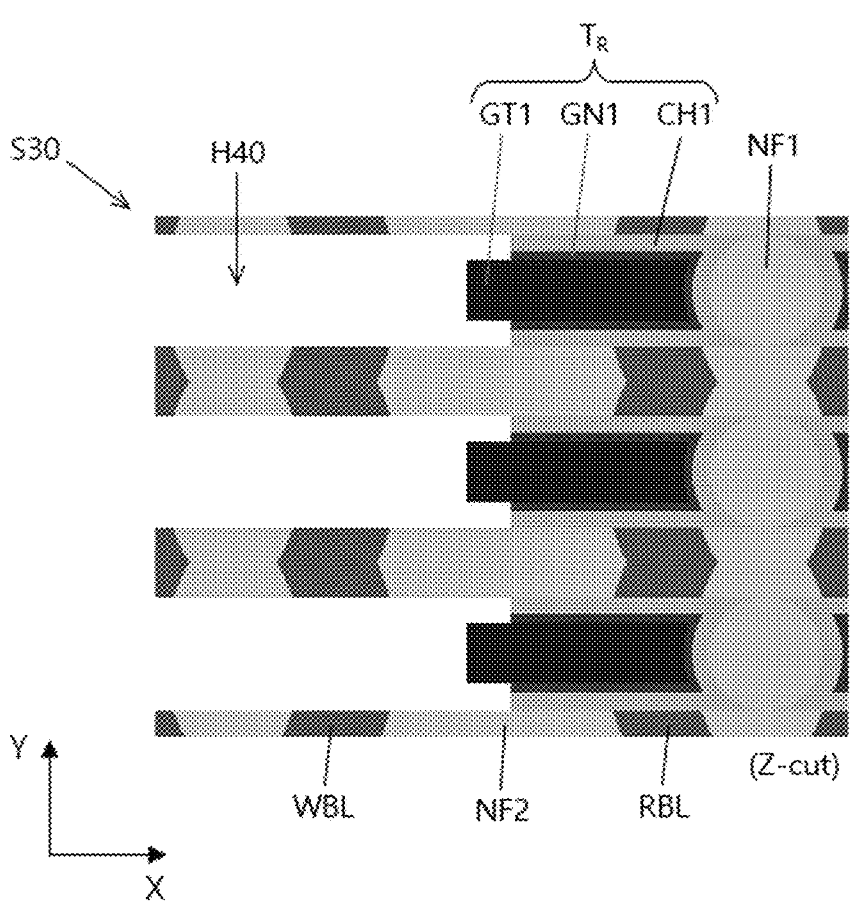
Figure 18C:
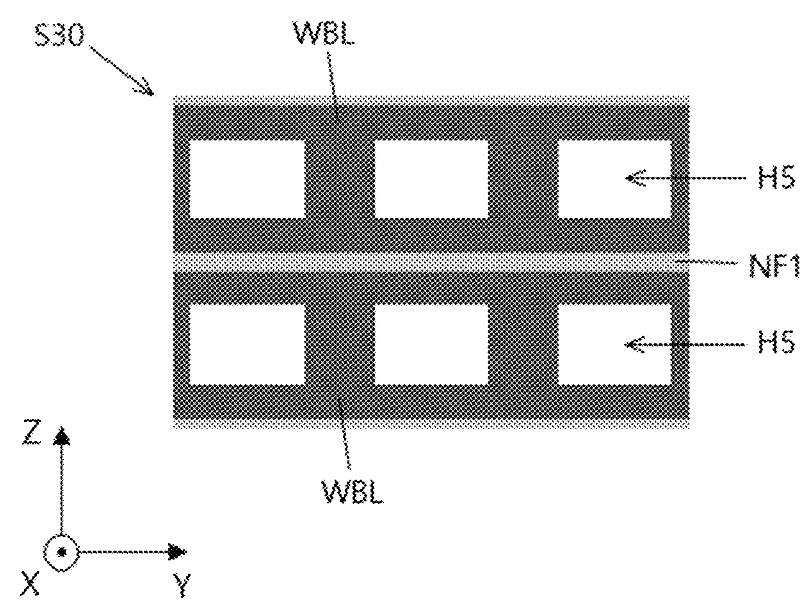

Referring to FIGS. 18A to 18C, a portion of the first gate insulating material layer GN1 and a portion of the first channel material layer CH1 exposed by the fourth vertical hole H40 may be recessed. A portion of the first channel material layer CH1 and a portion of the first gate insulating material layer GN1 surrounded by the read bit line RBL may remain inside the horizontal hole (H5 in FIG. 15A). The remaining first channel material layer CH1 may be referred to as 'a first channel layer CH1', and the remaining first gate insulating material layer GN1 may be referred to as 'a first gate insulating layer GN1'. The first gate electrode GT1 may have a structure which protrudes more toward the fourth vertical hole H40 than the first channel layer CH1.

The first channel layer CH1, the first gate insulating layer GN1, and the first gate electrode GT1 may constitute a read transistor structure $T_R$. The read transistor structure $T_R$ may have a channel-all-around (CAA) structure. In other words, the read bit line RBL may have a structure surrounding the first channel layer CH1. In some cases, a portion of the read bit line RBL may be considered included in the read transistor structure $T_R$.

Figure 19A:
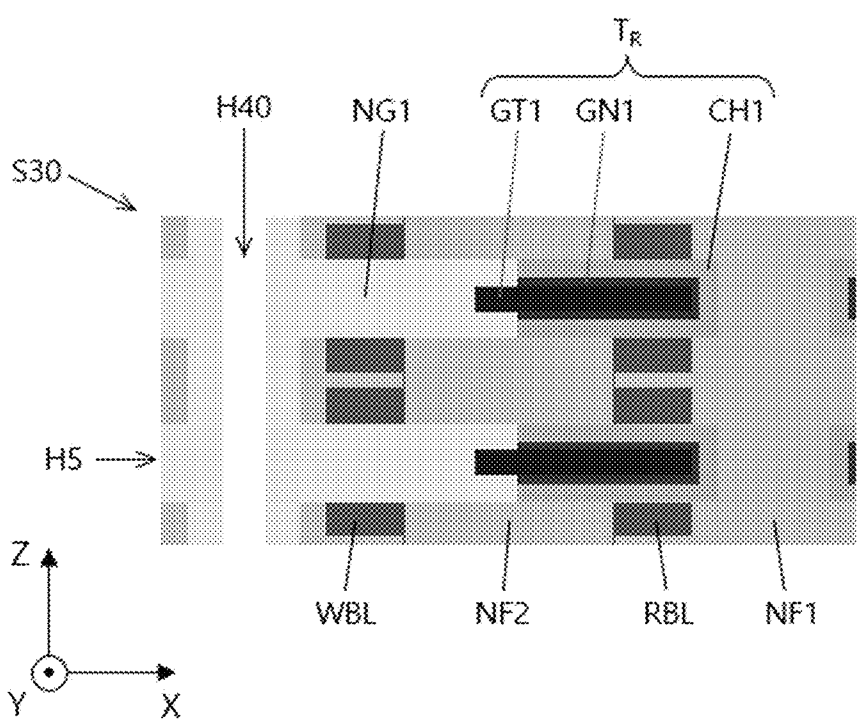
Figure 19B:
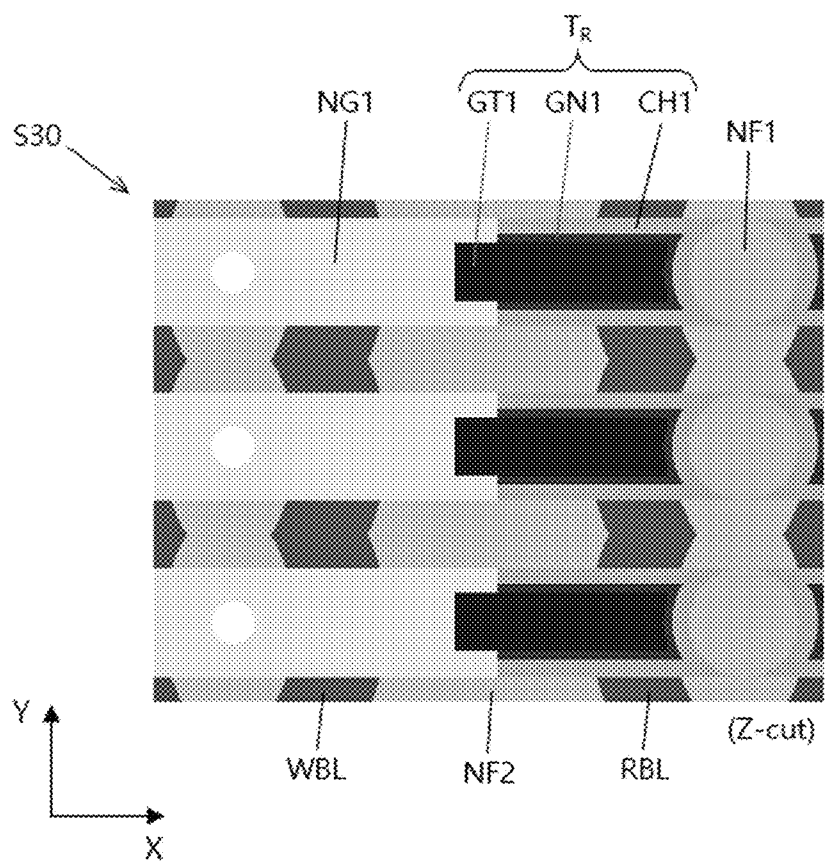
Figure 19C:
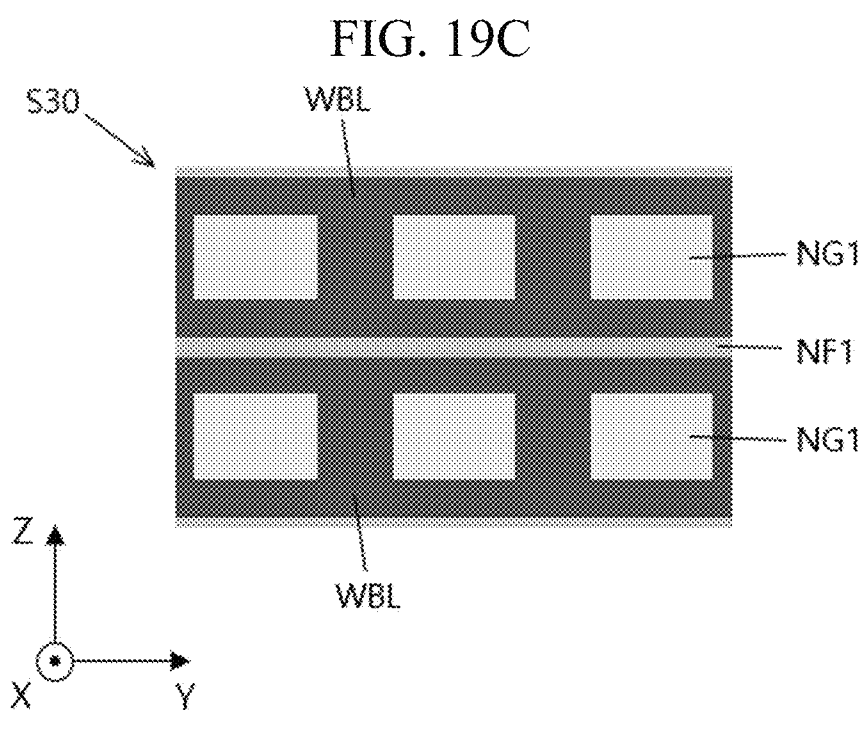

Referring to FIG. 19A to FIG. 19C, a first gap fill insulation layer NG1 may be formed to fill at least a portion of the remaining portion of the horizontal hole H5 and at least a portion of the fourth vertical hole H40. The first gap fill insulating layer NG1 may be formed so as not to completely fill the fourth vertical hole H40. As a non-limiting example, the first gap fill insulating layer NG1 may include silicon oxide (e.g., $SiO_2$) or may be formed of a silicon oxide (e.g., $SiO_2$).

Figure 20A:
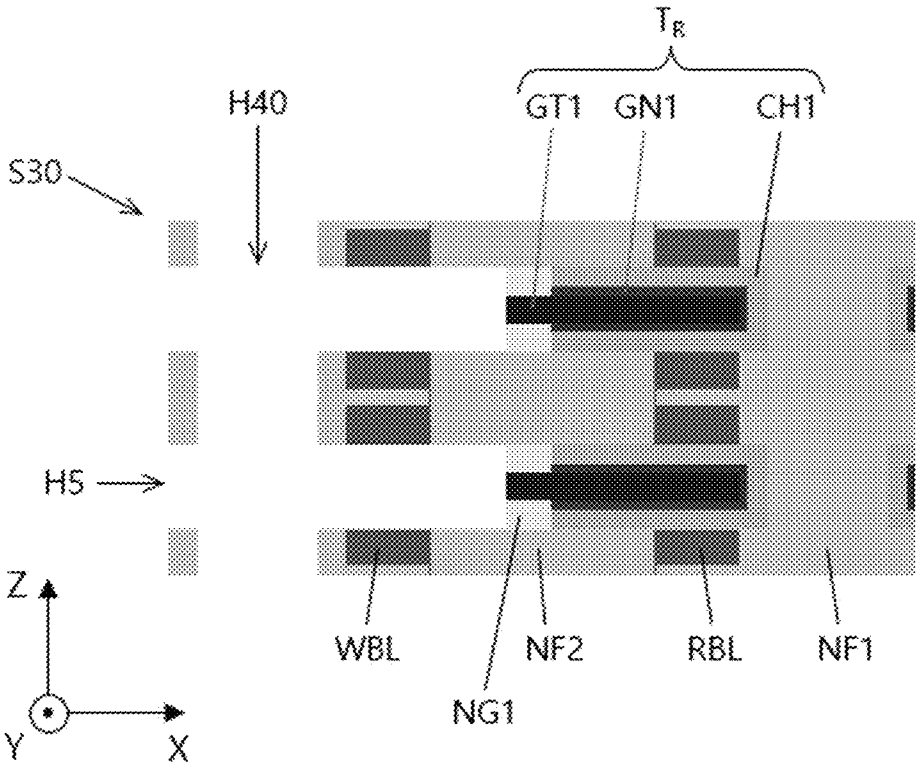
Figures 20B, 20C:
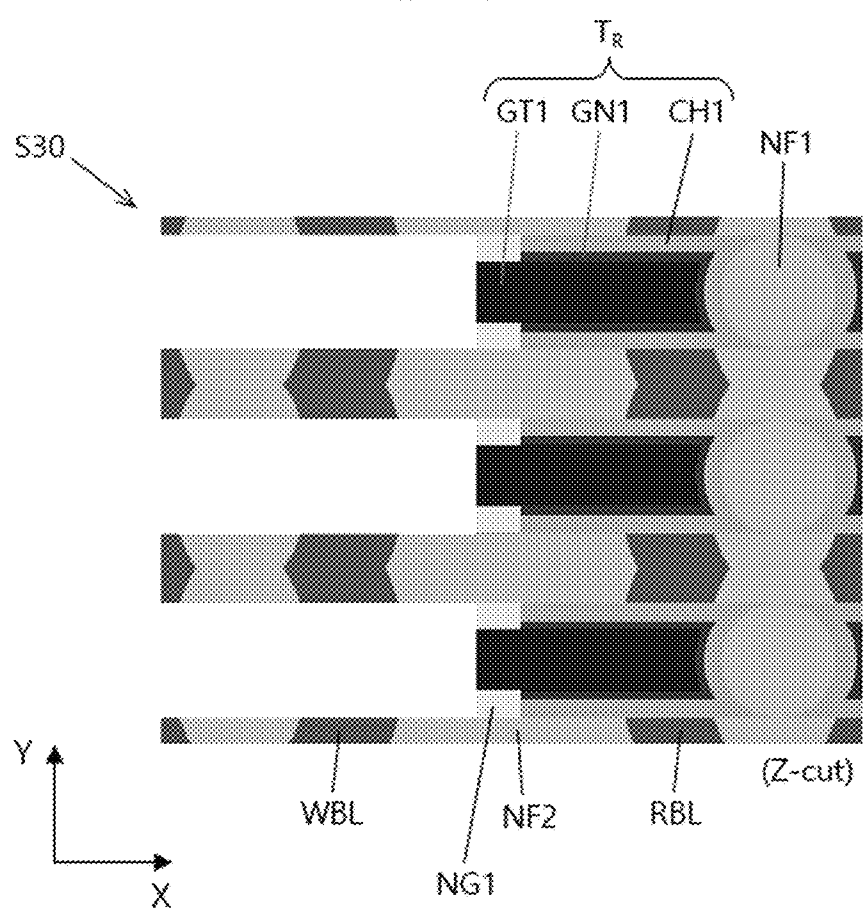

Referring to FIGS. 20A to 20C, a portion of the first gap fill insulating layer NG1 formed inside the fourth vertical hole H40 may be removed by etching, and a portion of the first gap fill insulating layer NG1 formed inside the horizontal hole H5 may be etched. As a result, the first gap fill insulating layer NG1 which exposes the first gate electrode GT1 toward the fourth vertical hole H40 while filling the empty space around an end portion of the first gate electrode GT1 may remain (be formed). Here, the end portion of the first gate electrode GT1 refers to an end portion adjacent to the fourth vertical hole H40.

Figure 21A:
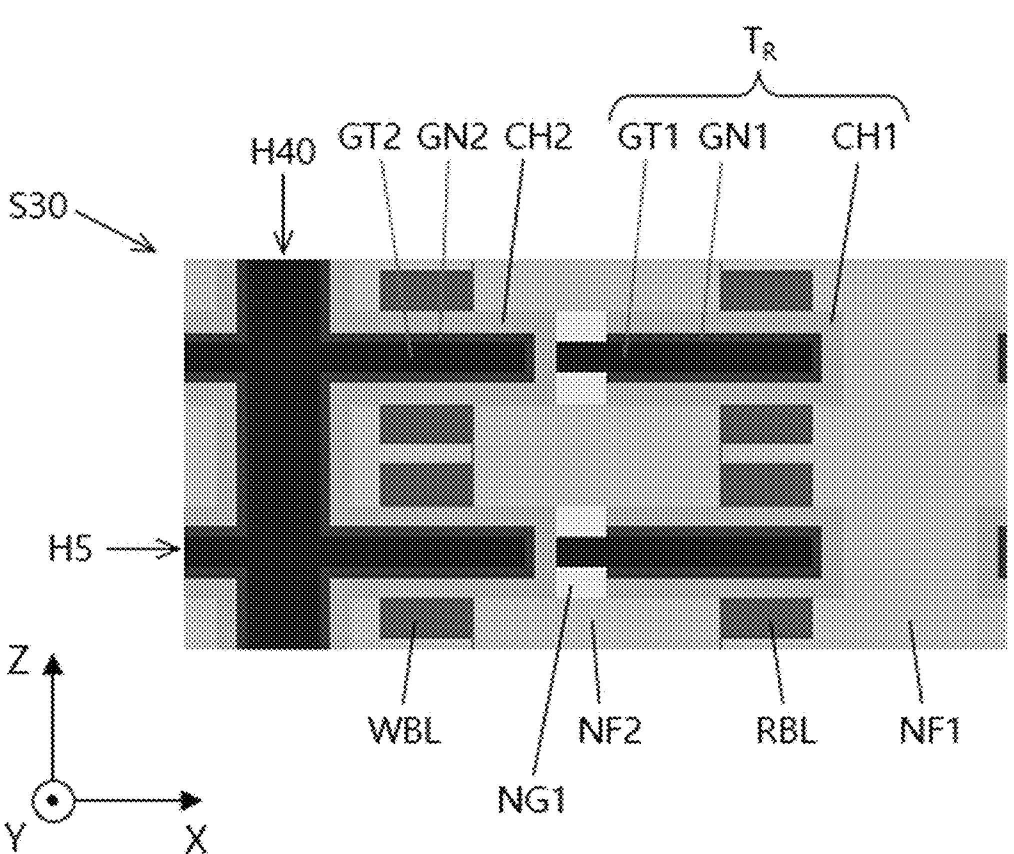
Figure 21B:
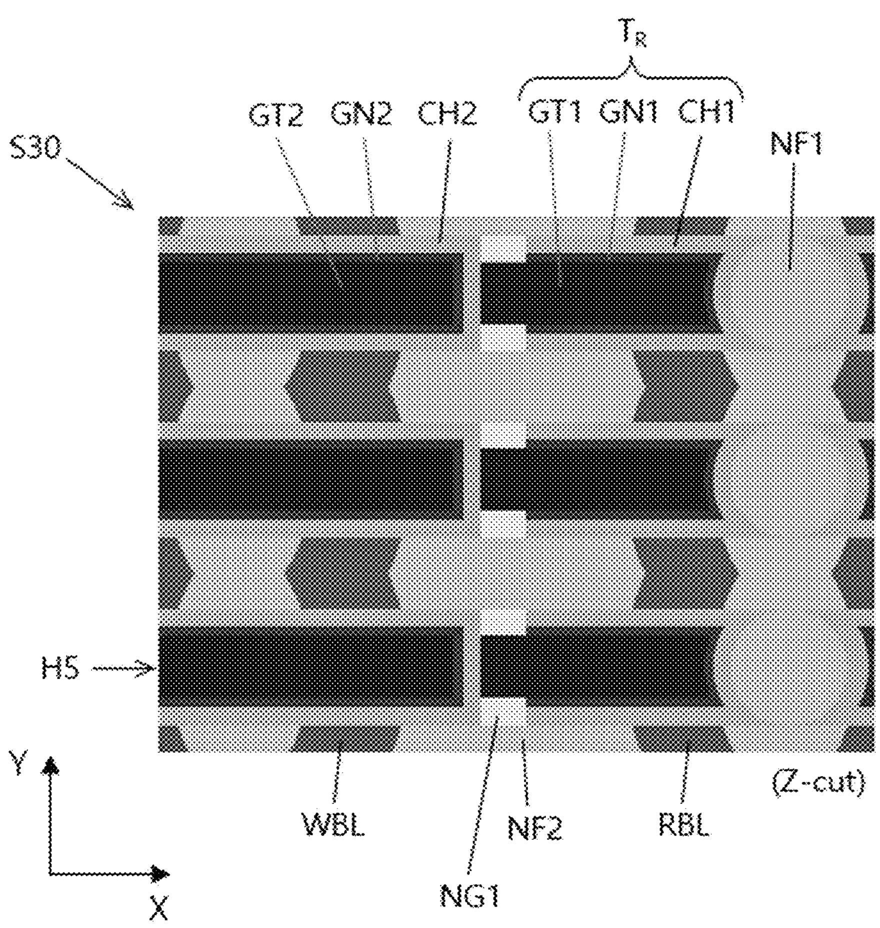
Figure 21C:
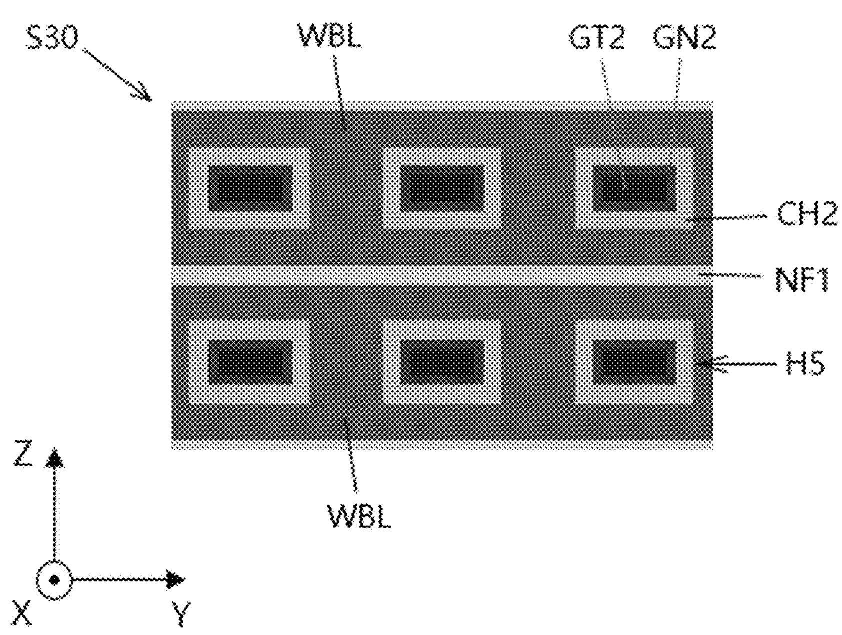

Referring to FIG. 21A to FIG. 21C, a second channel material layer CH2 and a second gate insulating material layer GN2 may be sequentially formed on inner surfaces of the horizontal hole H5 portion adjacent to (in contact with) the write bit line WBL and the fourth vertical hole H40. The second channel material layer CH2 and the second gate insulating material layer GN2 may be formed conformally according to the shape of the inner surfaces of the corresponding portion of the horizontal hole H5 and the fourth vertical hole H40. The second channel material layer CH2 and the second gate insulating material layer GN2 may be formed to be so thin that they do not fill the corresponding portion of the horizontal hole H5 and the inner side of the fourth vertical hole H40. The second channel material layer CH2 and the second gate insulating material layer GN2 may be formed through, for example, an ALD process.

The second channel material layer CH2 may include, for example, an oxide semiconductor. For example, the oxide semiconductor may include at least any one selected from the group consisting of indium gallium zinc oxide (IGZO), zinc tin oxide (ZTO), and indium tin oxide (ITO). However, the specific material of the second channel material layer CH2 is not limited to the above and may vary in various ways. In some cases, the second channel material layer CH2 may include a non-oxide semiconductor. The second channel material layer CH2 may be a single layer or a multilayer.

The second gate insulating material layer GN2 may be formed to include at least any one selected from a silicon oxide, a silicon nitride, a nitrogen oxide, and a high-k material. Here, the high-k material may be a material with a higher dielectric constant as compared with a silicon nitride. The specific material of the second gate insulating material layer GN2 is not limited to the above and may vary in various ways.

Next, a second gate electrode material layer GT2 filling the corresponding portion of the horizontal hole H5 and the fourth vertical hole H40 may be formed on the second gate insulating material layer GN2. The second gate electrode material layer GT2 may be formed of a metal, a metal compound, or other conductive material. The second gate electrode material layer GT2 may be formed through, for example, an ALD process.

Figure 22A:
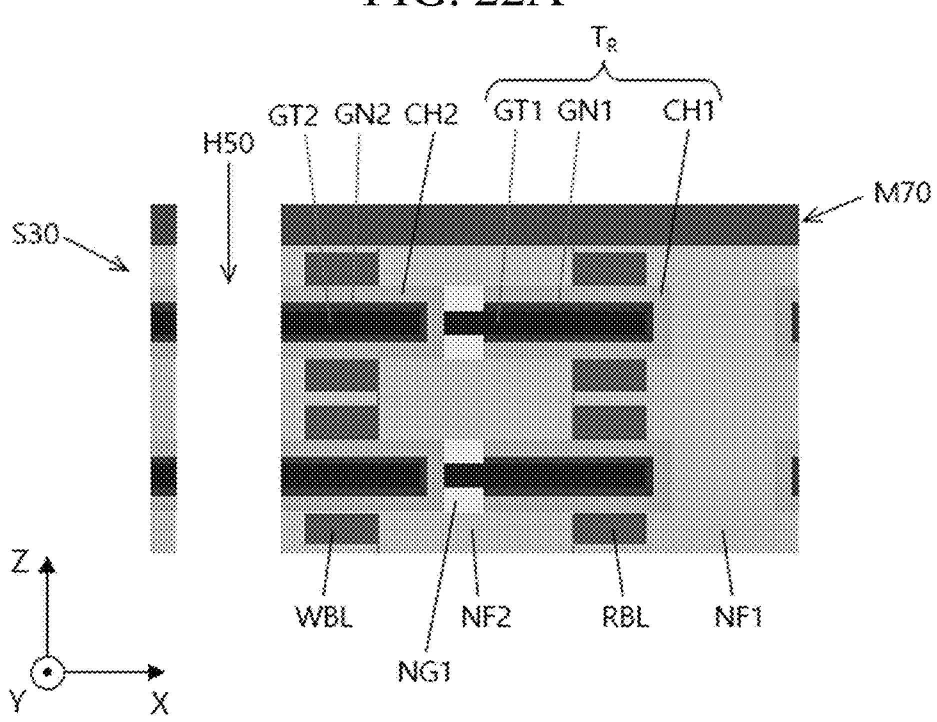
Figure 22B:
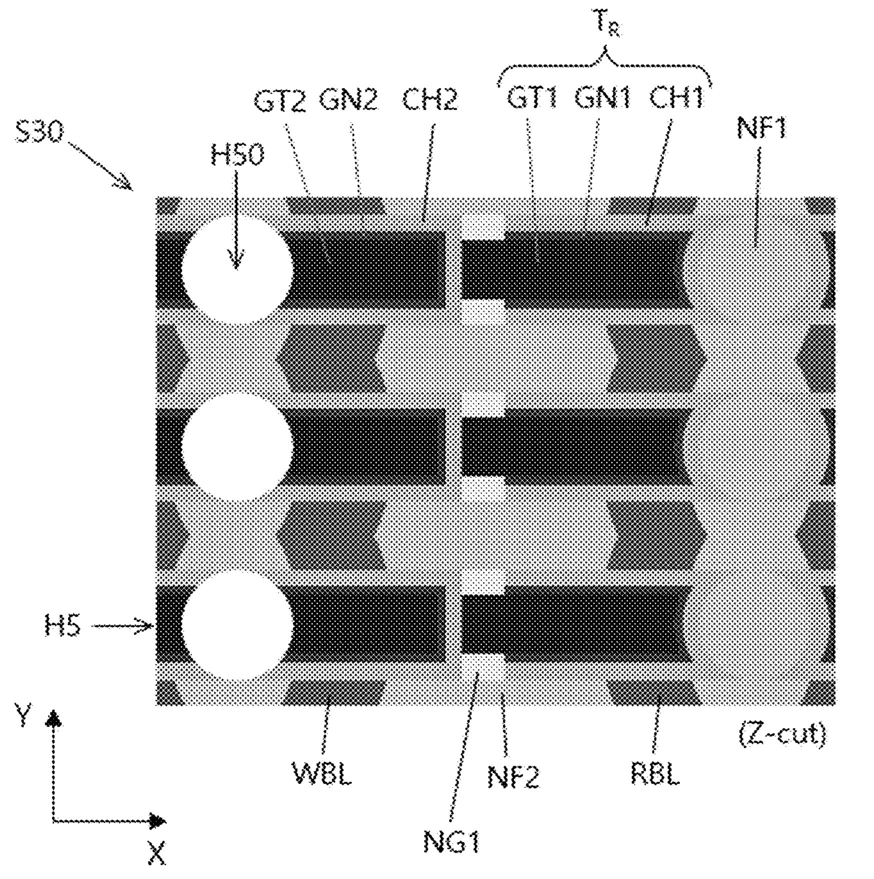
Figure 22C:
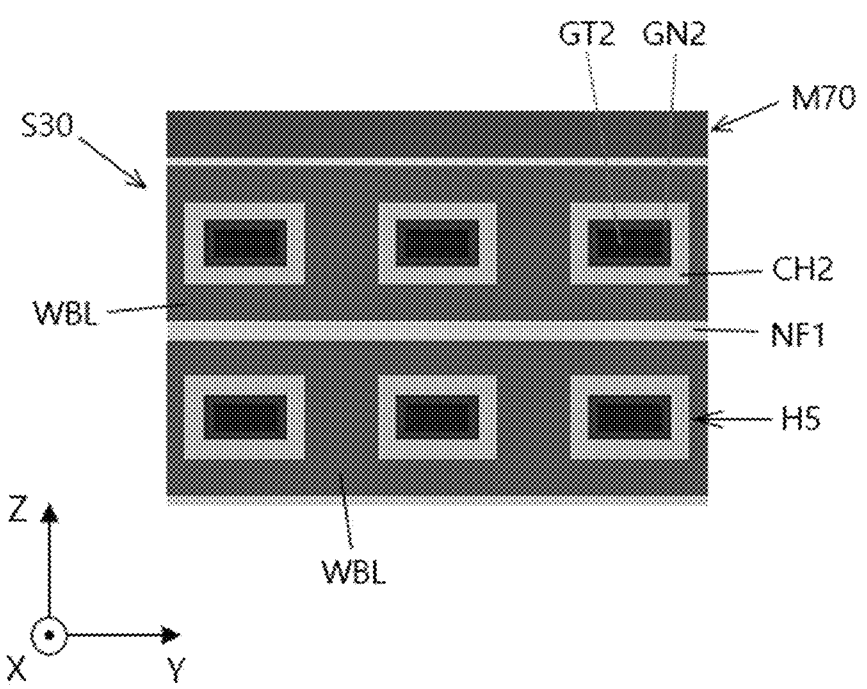

Referring to FIGS. 22A to 22C, a fifth vertical hole H50 may be formed in a region corresponding to the fourth vertical hole (H40 in FIG. 16A) in the intermediate device structure S30 where the second channel material layer CH2, the second gate insulating material layer GN2, and the second gate electrode material layer GT2 are formed. A seventh mask pattern M70 may be used to form the fifth vertical hole H50. The seventh mask pattern M70 may have a predetermined opening pattern. The seventh mask pattern M70 may be, for example, a photoresist pattern.

Figure 23A:
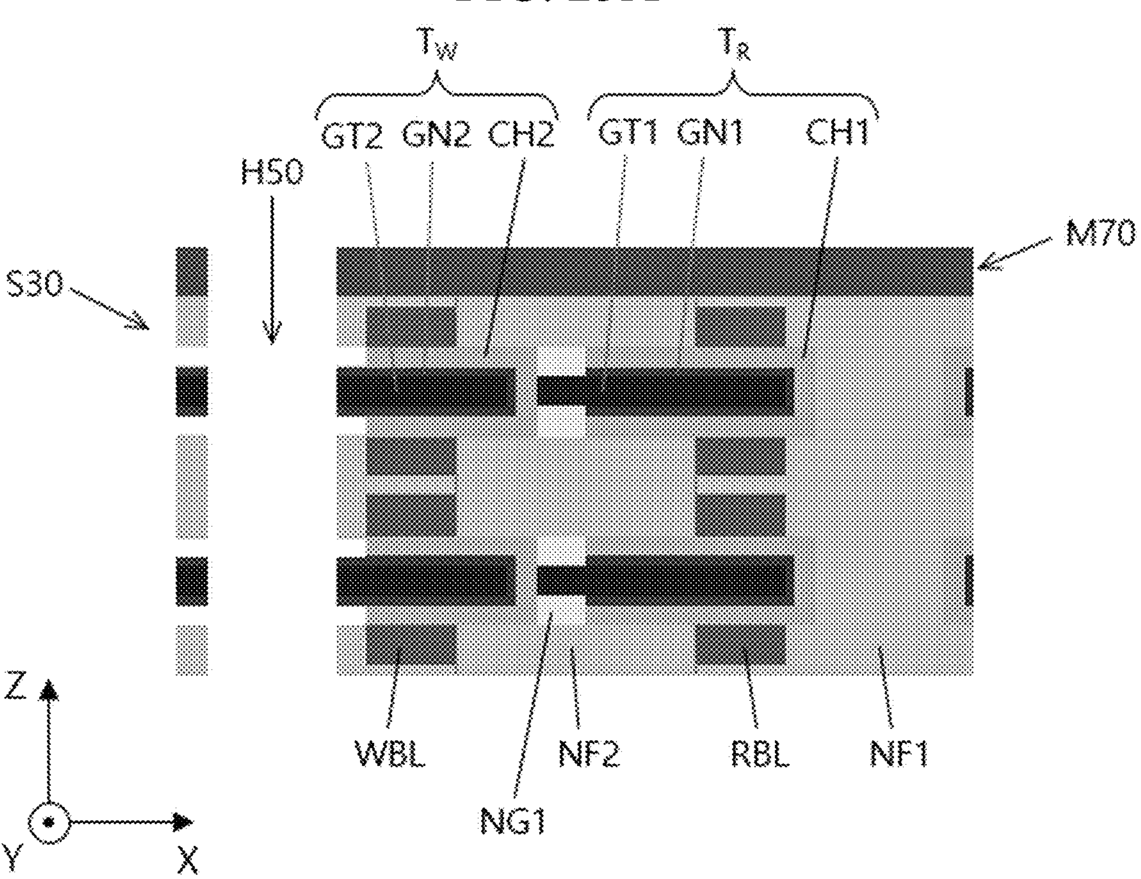
Figure 23B:
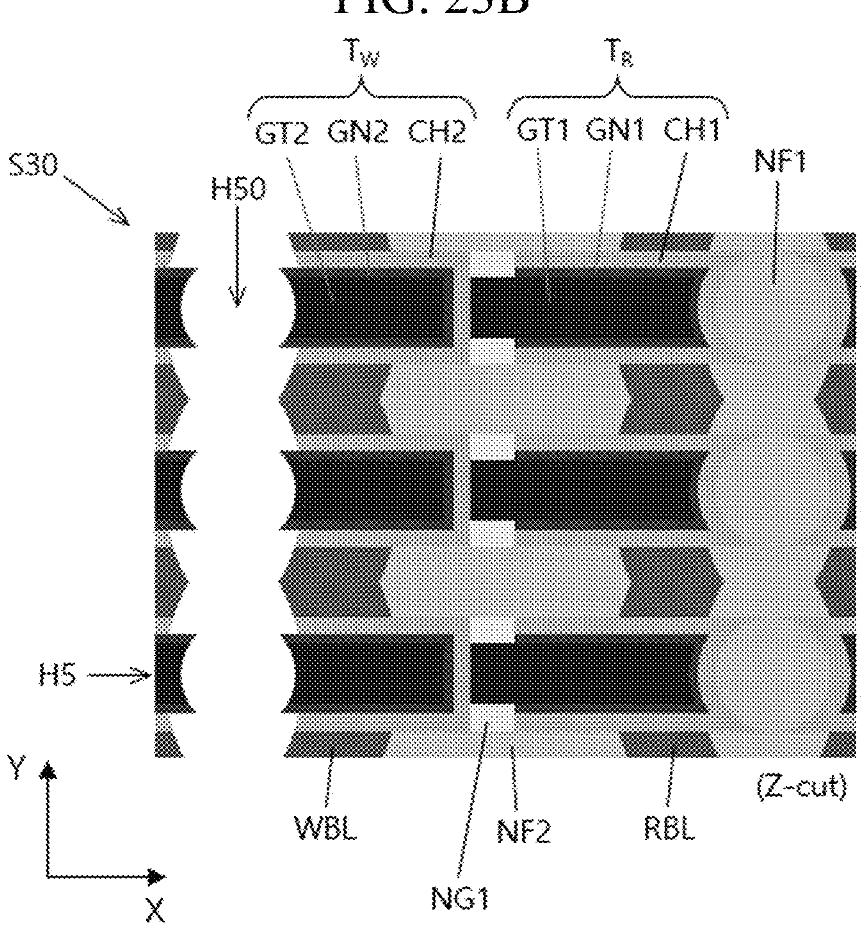
Figure 23C:
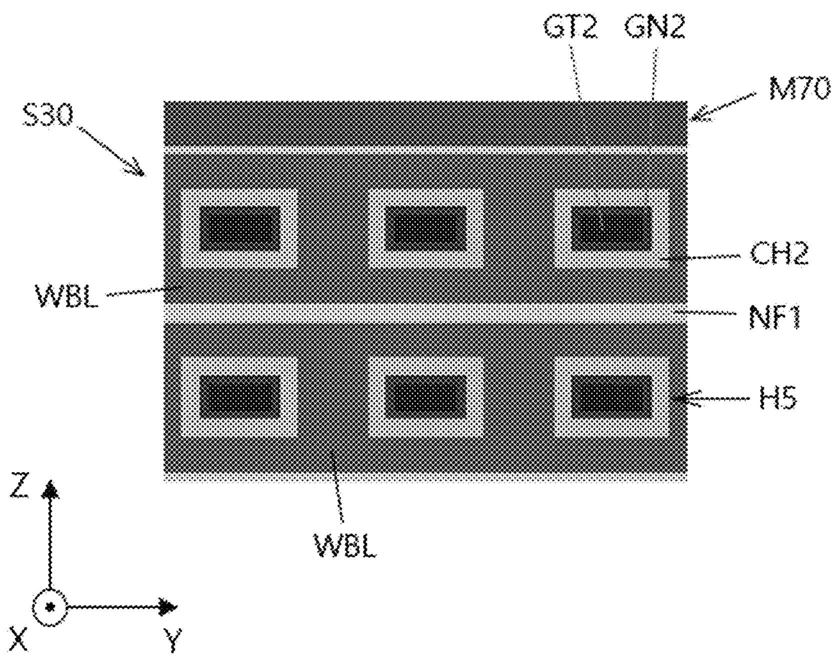

Referring to FIGS. 23A to 23C, a portion of the second channel material layer CH2 exposed by the fifth vertical hole H50 may be recessed. The second channel material layer CH2 surrounded by the write bit line WBL may remain inside the corresponding portion of the horizontal hole (H5 in FIG. 21A). The second gate insulating material layer GN2 remaining in the remaining second channel material layer CH2 may be provided, and the second gate electrode material layer GT2 remaining in the remaining second gate insulating material layer GN2 may be provided. The remaining second channel material layer CH2 may be referred to as 'a second channel layer CH2', and the remaining second gate insulating material layer GN2 may be referred to as 'a second gate insulating material layer GN2'. The remaining second gate electrode material layer GT2 may be referred to as the 'second gate electrode GT2.' The second gate electrode GT2 may have a structure which protrudes more toward the fifth vertical hole H50 than the second channel material layer CH2.

The second channel layer CH2, the second gate insulating layer GN2, and the second gate electrode GT2 may constitute a write transistor structure $T_w$. The write transistor structure $T_w$ may have a channel-all-around (CAA) structure. In other words, the write bit line WBL may have a structure surrounding the second channel layer CH2. In some cases, a portion of the write bit line may be considered included in the write transistor structure $T_w$. The second channel layer CH2 may be electrically connected to the first gate electrode GT1 of the read transistor structure $T_R$. The second channel layer CH2 may be in contact with the first gate electrode GT1.

Figure 24A:
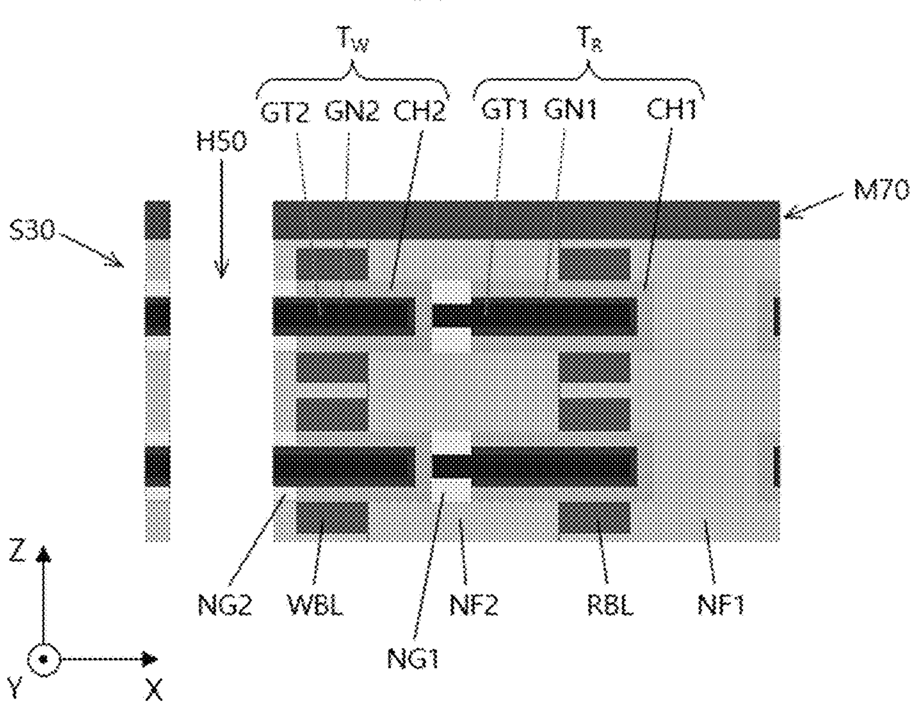
Figure 24B:
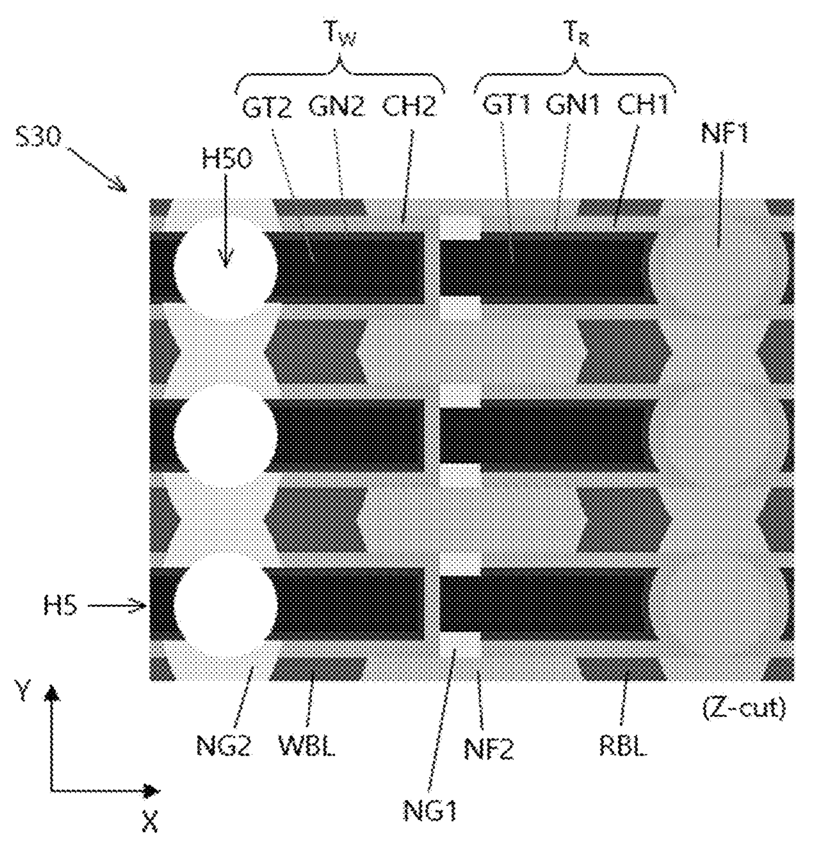
Figures 24C, 25A:
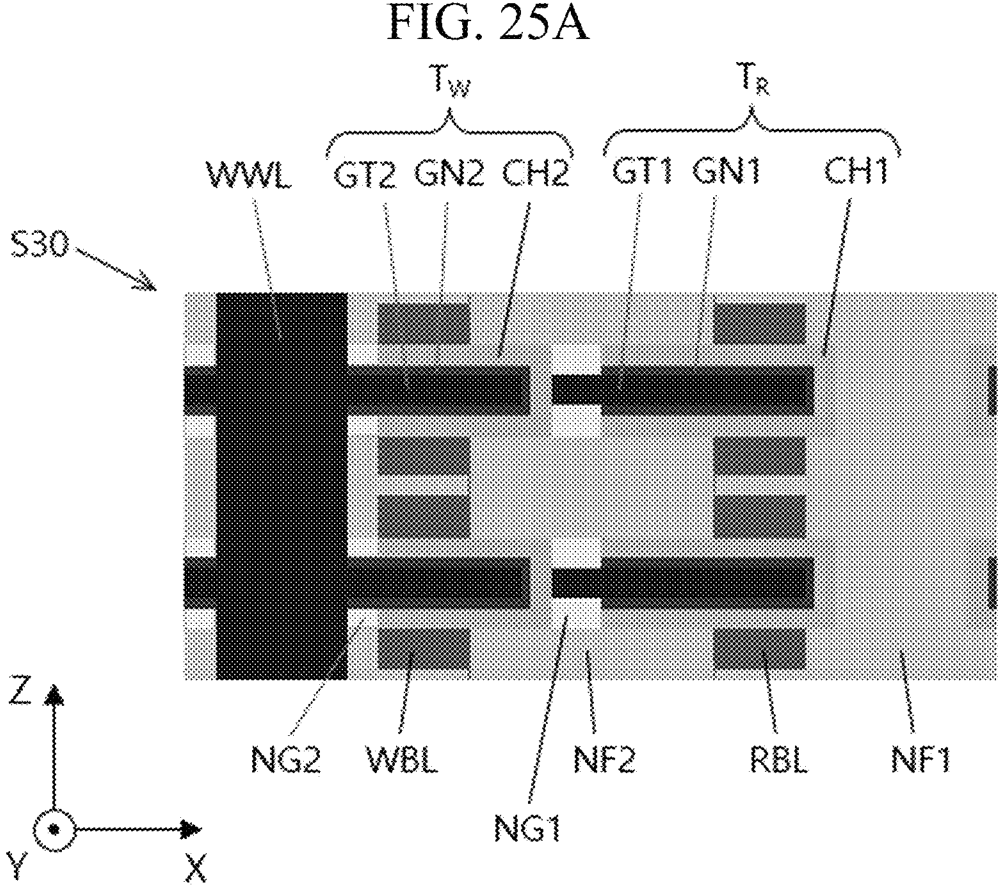

Referring to FIG. 24A to FIG. 24C, a second gap fill insulating layer NG2 which exposes the second gate electrode GT2 toward the fifth vertical hole H50 while filings the empty space around an end portion of the second gate electrode GT2 may be formed. Here, the end portion of the second gate electrode GT2 refers to an end portion adjacent to (be in contact with) the fifth vertical hole H50. After depositing a material (insulating material) of the second gap fill insulating layer NG2 in the fifth vertical hole H50 and its surrounding area, the second gap fill insulating layer NG2 as shown in FIGS. 24A and 24B may be formed by removing the portion of the material formed in the fifth vertical hole H50 by an etching process. As a non-limiting example, the second gap fill insulating layer NG2 may include a silicon oxide (e.g., $SiO_2$) or may be formed of a silicon oxide (e.g., $SiO_2$). After forming the second gap fill insulating layer NG2, the seventh mask pattern M70 may be removed. However, the removal timing of the seventh mask pattern M70 may vary.

Although the method for forming the read transistor structure $T_R$ and the write transistor structure $T_w$ has been described in detail with reference to FIGS. 15A to 24C, this is merely an example and the method may vary in various cases.

Then, by using a method as illustrated in FIGS. 25A to 27C, a write word line (WWL in FIG. 25A) electrically connected to the second gate electrode GT2 and extending in the vertical direction may be formed in the region corresponding to the first vertical hole (H10 in FIG. 4A), and a read word line (RWL in FIG. 27A) electrically connected to the first channel layer CH1 and extending in the vertical direction may be formed in the region corresponding to the second vertical hole (H20 in FIG. 4A).

Figure 25B:
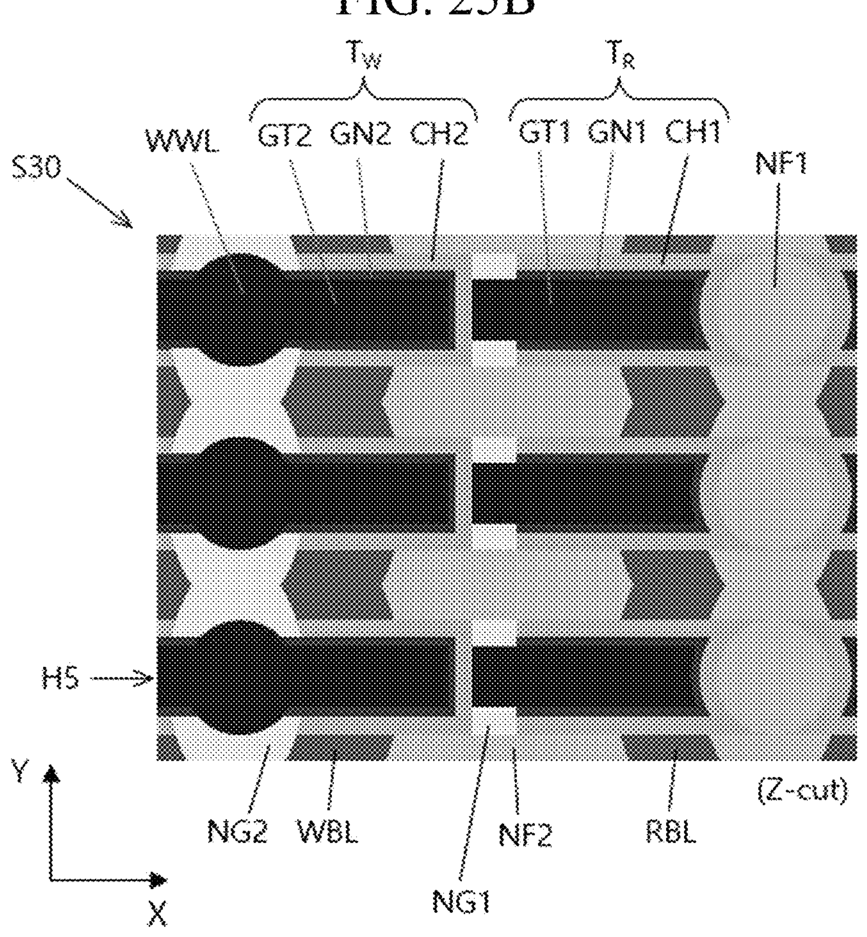
Figure 25C:
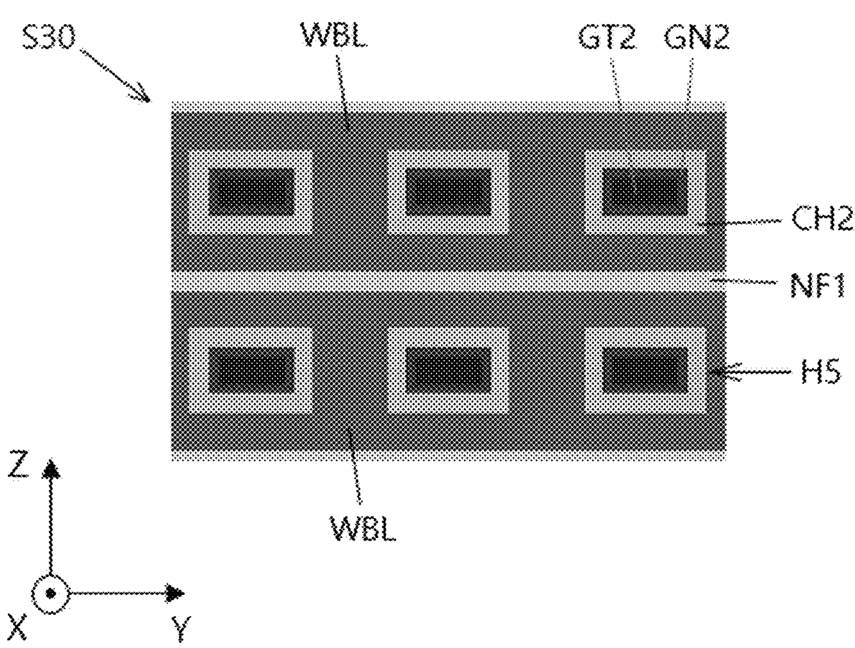

Referring to FIGS. 25A to 25C, the write word line WWL electrically connected to the second gate electrode GT2 and extending in the vertical direction may be formed in the fifth vertical hole (H50 in FIG. 24A). Since the fifth vertical hole (H50 in FIG. 24A) may correspond to the first vertical hole (H10 in FIG. 4A), it may be said that the write word line WWL is formed in a region corresponding to the first vertical hole (H10 in FIG. 4A). The write word line WWL may extend in the vertical direction and be commonly connected to the second gate electrodes GT2 of the plurality of write transistor structures TW. The write word line WWL may be formed of a metal, a metal compound, or other conductive material.

Figure 26A:
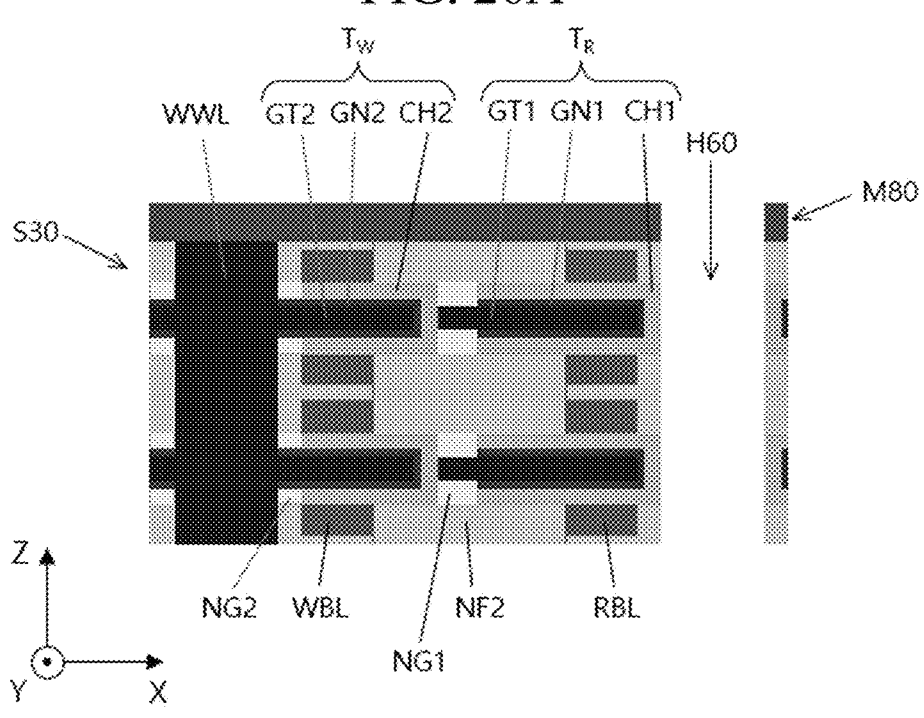
Figure 26B:
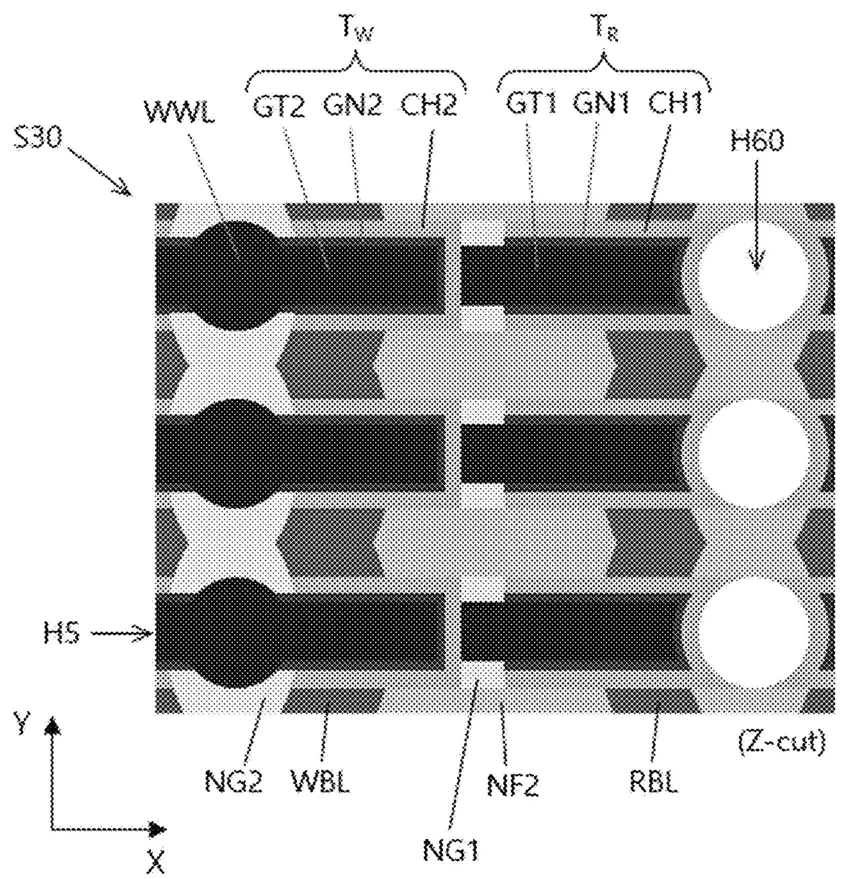
Figures 26C, 27A:
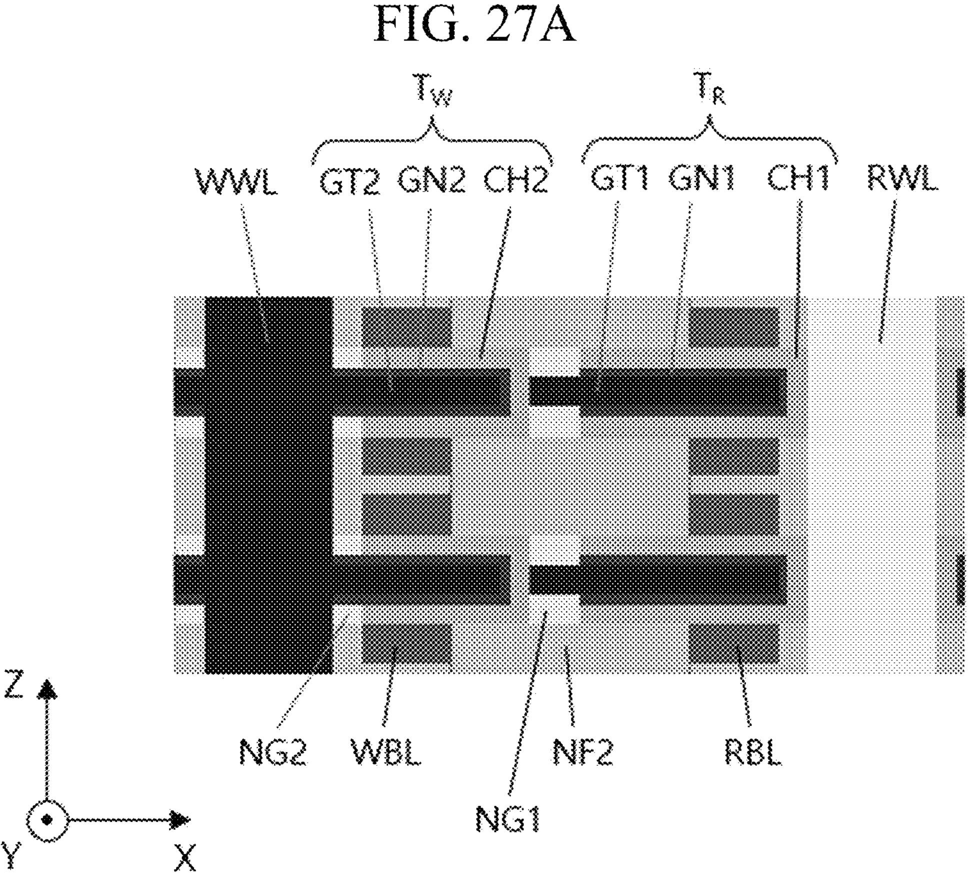

Referring to FIGS. 26A to 26C, a sixth vertical hole H60 may be formed in a region corresponding to or substantially corresponding to the second vertical hole (H20 in FIG. 4A) in the intermediate device structure S30. An eighth mask pattern M80 may be used to form the sixth vertical hole H60. The eighth mask pattern M80 may have a predetermined opening pattern. The eighth mask pattern M80 may be, for example, a photoresist pattern. After forming the sixth vertical hole H60, the eighth mask pattern M80 may be removed. A side surface of the first channel layer CH1 of the read transistor structure TR may be exposed by the sixth vertical hole H60.

Figure 27B:
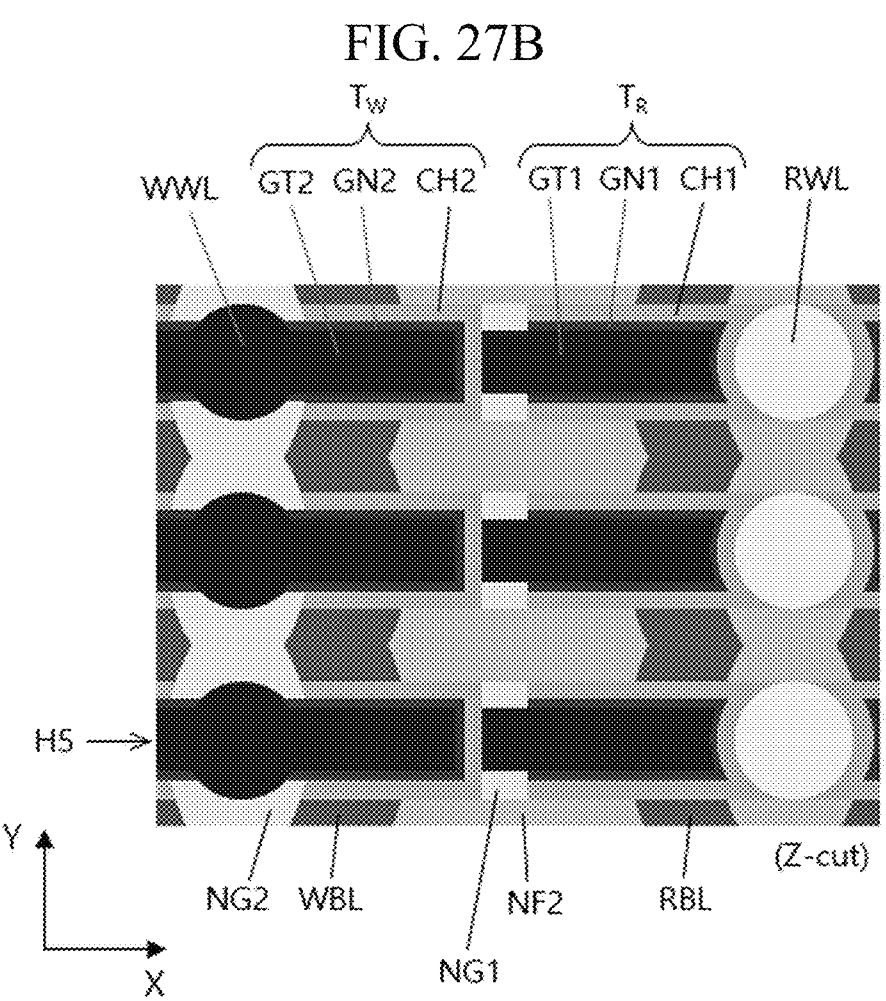
Figure 27C:
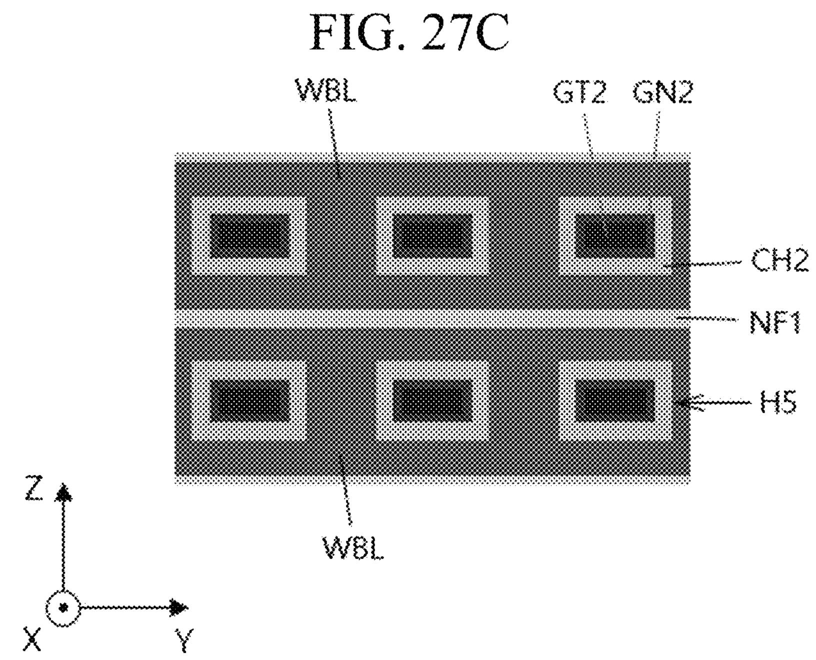

Referring to FIGS. 27A to 27C, the read word line RWL electrically connected to the first channel layer CH1 and extending in the vertical direction may be formed in the sixth vertical hole (H60 in FIG. 26A). Since the sixth vertical hole (H60 in FIG. 26A) may correspond to the second vertical hole (H20 in FIG. 4A), it may be said that the read word line RWL is formed a region corresponding to the second vertical hole (H20 in FIG. 4A). The read word line RWL may extend in the vertical direction and be commonly connected to the first channel layers CH1 of the plurality of read transistor structures TR. The read word line RWL may be formed of a metal, a metal compound, or other conductive material.

Although the method for forming the write word line WWL and the read word line RWL has been described in detail with reference to FIGS. 25A to 27C, this is only an example and may vary depending on the case.

According to one embodiment of the present invention, a plurality of the second material layer patterns (NL21 in FIG. 3C) may be arranged to be spaced apart from each other in the horizontal and vertical directions, and a plurality of the horizontal holes (H5 in FIG. 14C) may be arranged to be spaced apart from each other in the horizontal and vertical directions, and the read transistor structure ($T_R$ in FIG. 27A) and the write transistor structure ($T_w$ in FIG. 27A) may be formed in each horizontal hole (H5 in FIG. 14C). Each of the write word lines WWL may be commonly connected to a plurality of write transistor structures $T_w$ spaced apart from each other in the vertical direction, and each of the read word lines RWL may be commonly connected to a plurality of read transistor structures $T_R$ spaced apart from each other in the vertical direction. A plurality of write word lines WWL may extend in a vertical direction, and a plurality of read word lines RWL may extend in a vertical direction. A plurality of write bit lines WBL may extend in the horizontal direction, and a plurality of read bit lines RBL may extend in the horizontal direction.

The read transistor structure TR and the write transistor structure TW connected thereto may constitute one memory cell structure, and a plurality of the memory cell structures may be arranged to be spaced apart from each other in the horizontal and vertical directions. In an actual manufacturing process, a much larger number of memory cell structures than those shown in FIGS. 27A to 27C may be arranged in a vertical direction and a horizontal direction.

In an embodiment of the present invention, since the write bit line WBL and the read bit line RBL may extend in the horizontal direction, and the write word line WWL and the read word line RWL may extend in the vertical direction, a capacitorless three-dimensional stacked DRAM device with very high integration degree and data storage density, and excellent performance may be easily manufactured. According to this embodiment of the present invention, highly integrated and high-capacity devices may be easily manufactured and mass production is possible. According to one example, the three-dimensional stacked DRAM device may be a 2T0C type DRAM device or may be configured to include it.

Figure 28:
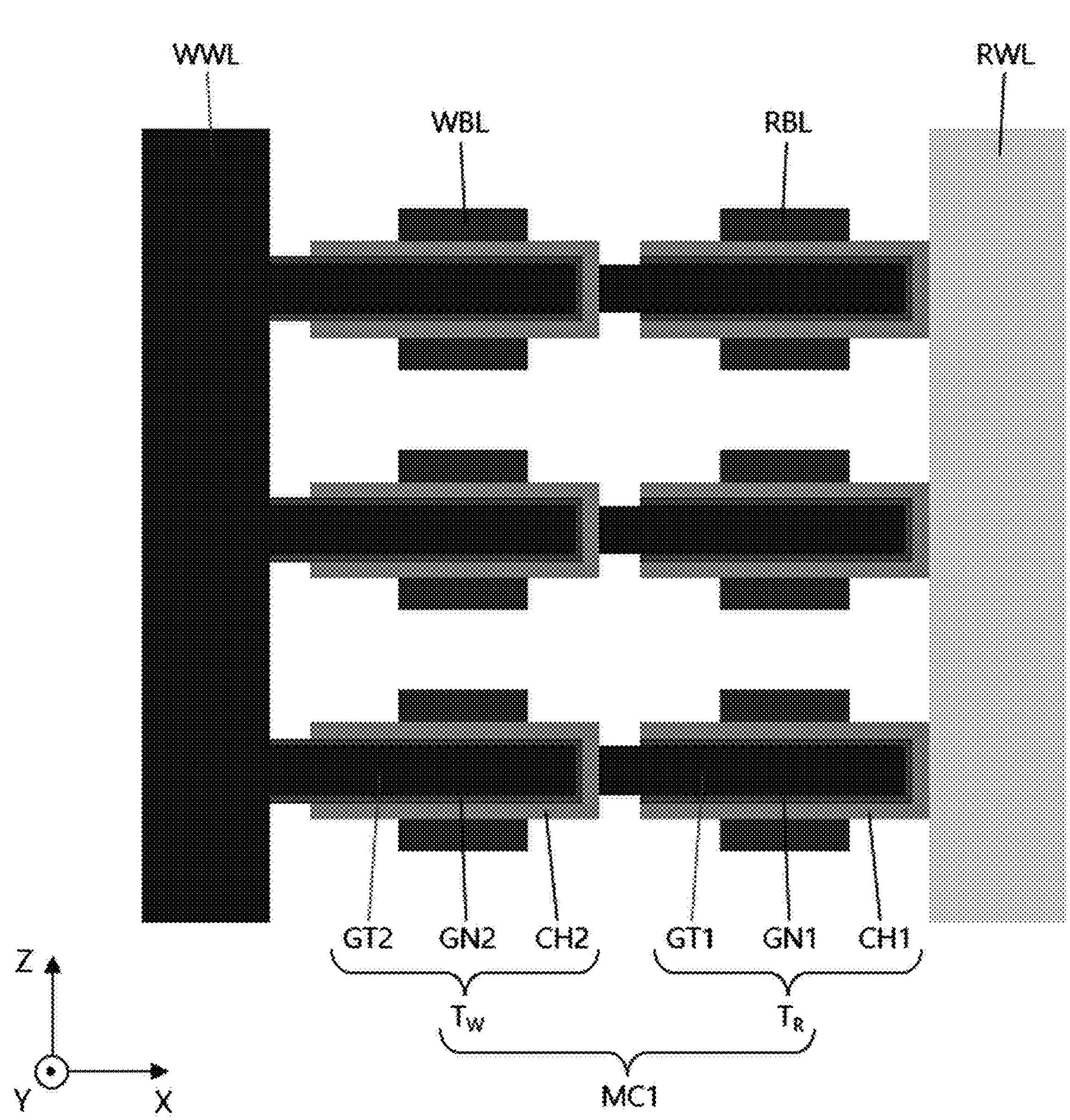
FIG. 28 and FIG. 29 are diagrams for explaining an example of a capacitorless three-dimensional stacked DRAM device according to an embodiment of the present invention.
Figure 29:
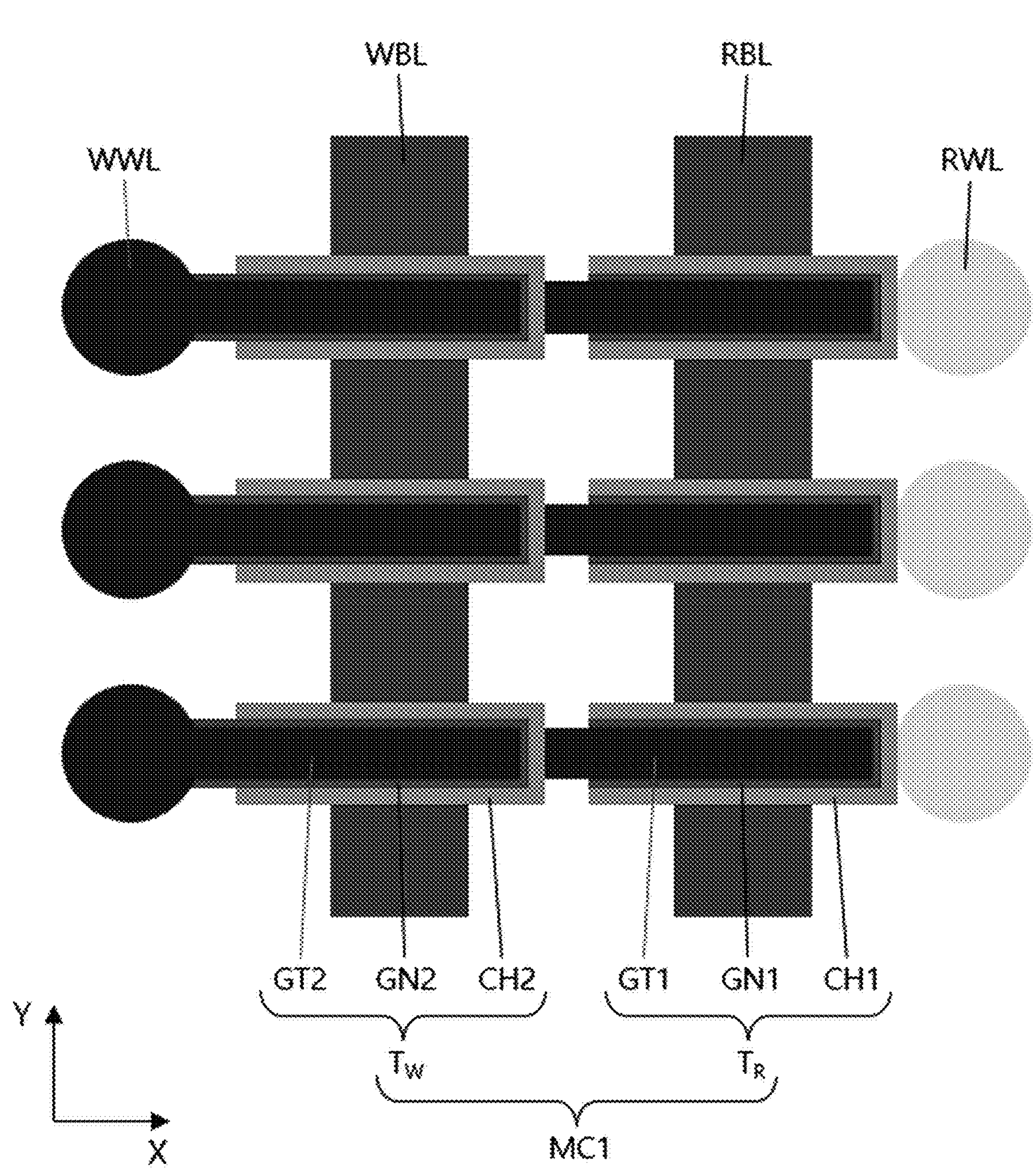

FIG. 28 and FIG. 29 are diagrams for explaining an example of a capacitorless three-dimensional stacked DRAM device according to an embodiment of the present invention. FIG. 28 is a cross-sectional view of the device cut along the XZ plane, and FIG. 29 is a cross-sectional view (i.e., Z-cut view) of the device cut along the XY plane. The capacitorless 3D stacked DRAM device may be a 3D stacked DRAM device having a gain cell structure. For example, the capacitorless three-dimensional stacked DRAM device may be a three-dimensional stacked DRAM device having a two transistor zero capacitor (2T0C) cell structure.

Referring to FIG. 28 and FIG. 29, a capacitorless three-dimensional stacked DRAM device according to an embodiment of the present invention may include a plurality of memory cell structures (MC1) arranged to be spaced apart from each other in the horizontal and vertical directions. Each of the plurality of memory cell structures MC1 may include a horizontal read transistor structure $T_R$ and a horizontal write transistor structure $T_w$ electrically connected thereto. The read transistor structure $T_R$ may include a first channel layer CH1, a first gate insulating layer GN1, and a first gate electrode GT1. The write transistor structure $T_w$ may include a second channel layer CH2, a second gate insulating layer GN2, and a second gate electrode GT2. Here, the second channel layer CH2 may be electrically connected to the first gate electrode GT1. For example, the second channel layer CH2 may be in contact with the first gate electrode GT1. The read transistor structure $T_R$ and the corresponding write transistor structure $T_R$ may be arranged to be mutually connected in the horizontal direction.

The capacitorless three-dimensional stacked DRAM device may further include a plurality of write bit lines WBL extending in the horizontal direction and connected to a plurality of write transistor structures $T_w$ of a plurality of memory cell structures MC1, and a plurality of read bit lines RBL extending in the horizontal direction and connected to a plurality of read transistor structures $T_R$ of a plurality of memory cell structures MC1. In addition, the capacitorless three-dimensional stacked DRAM device may further include a plurality of write word lines WWL extending in the vertical direction and connected to a plurality of write transistor structures $T_w$, and a plurality of read word lines RWL extending in the vertical direction and connected to a plurality of read transistor structures $T_R$.

In a predetermined area where a plurality of memory cell structures MC1 are arranged horizontally and vertically, a plurality of write bit lines WBL and a plurality of read bit lines RBL may be disposed between a plurality of write word lines WWL and a plurality of read word lines RWL. Furthermore, a plurality of write bit lines WBL may be disposed between a plurality of write word lines WWL and a plurality of read bit lines RBL. Furthermore, a plurality of read bit lines RBL may be disposed between a plurality of read word lines RWL and a plurality of write bit lines WBL.

According to one embodiment, at least one of the first and second channel layers (CH1 and CH2) may include an oxide semiconductor. However, the material of the first and second channel layers (CH1 and CH2) is not limited to the oxide semiconductor described above. In some cases, at least one of the first and second channel layers (CH1 and CH2) may include a non-oxide semiconductor.

According to one embodiment, in each read transistor structure $T_R$, the first gate electrode GT1 may have a rod structure extending in the horizontal direction. The first gate insulating layer GN1 may have a first shell structure surrounding the remaining portion except for one end portion of the first gate electrode GT1. The first channel layer CH1 may have a second shell structure surrounding the first gate insulating layer GT1. The first gate electrode GT1 may protrude toward the write transistor structure TW rather than the first channel layer CH1. The formation range of the first gate insulating layer GN1 may vary.

According to one embodiment, the read bit line RBL may have a structure surrounding a portion of the first channel layer CH1. The read word line RWL may be electrically connected to an end of the first channel layer CH1. The read word line RWL may be in contact with the end of the first channel layer CH1.

According to one embodiment, in each write transistor structure $T_w$, the second gate electrode GT2 may have a rod structure extending in the horizontal direction. The second gate insulating layer GN2 may have a first shell structure surrounding the remaining portion except for one end portion of the second gate electrode GT2. The second channel layer CH2 may have a second shell structure surrounding the second gate insulating layer GN2. The second gate electrode GT2 may protrude toward the write word line WWL rather than the second channel layer CH2. The formation range of the second gate insulating layer GN2 may vary.

According to one embodiment, the write bit line WBL may have a structure surrounding a portion of the second channel layer CH2. The write word line WWL may be electrically connected to an end of the second gate electrode GT2. The write word line WWL may be in contact with the end of the second gate electrode GT2.

In addition, the structure of the capacitorless 3D stacked DRAM device according to an embodiment of the present invention may have various structures and modified configurations as described with reference to FIGS. 1A to 27C.

In the capacitorless three-dimensional stacked DRAM device according to an embodiment of the present invention, the gate capacitance of the read transistor structure $T_R$ may be used as a storage element (i.e., a storage node). The capacitorless 3D stacked DRAM devices may have a long data retention time and may have various advantages because the cells may be composed of only a plurality of transistors without a capacitor.

Figure 30:
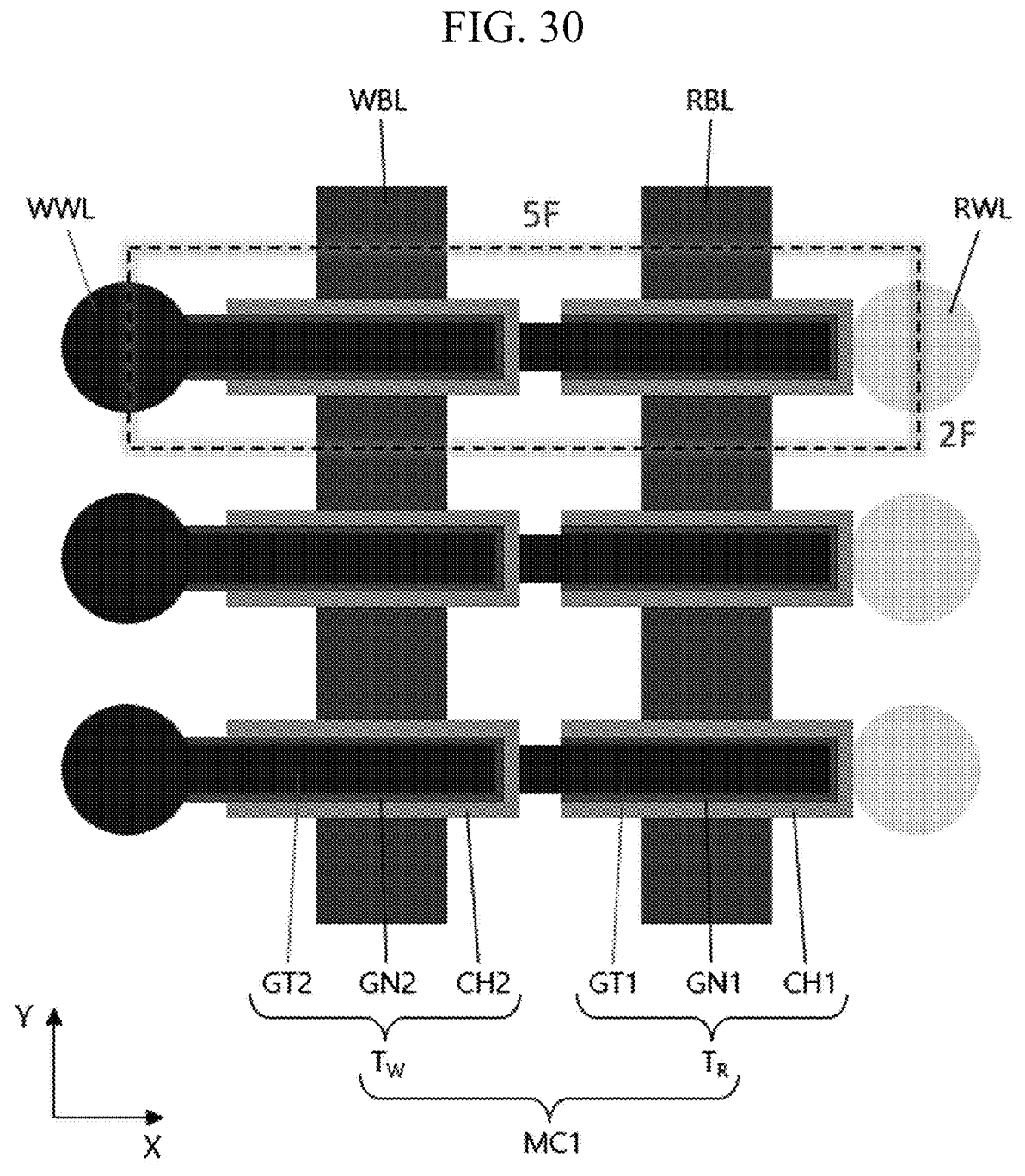

FIG. 30 is a diagram showing the size of a unit memory area in the capacitorless three-dimensional stacked DRAM device of FIG. 29.

Referring to FIG. 30, the unit memory area of the capacitorless 3D stacked DRAM device according to an embodiment of the present invention may have, for example, a size of 5F×2F (where F is the feature size), that is, a size of $10F^2$. Each of the write word line WWL and the read word line RWL may be shared with adjacent memory cells, the unit memory area may have a size of $10F^2$, and the area per memory cell may be minimized. Since a plurality of the unit memory areas may be easily stacked repeatedly in the vertical direction, a device of high integration and high capacity may be easily implemented.

According to the embodiments of the present invention described above, it is possible to implement a capacitorless three-dimensional stacked DRAM device which may significantly improve degree of integration three-dimensionally, secure excellent performance, and facilitate the manufacturing process. In particular, the capacitorless three-dimensional stacked DRAM device according to an embodiment of the present invention has a structure in which the write word line and the read word line extend in the vertical direction, and the write bit line and the read bit line extend in the horizontal direction, and thus, it may be easy to manufacture a three-dimensional stacked structure in which the cells are connected in the vertical direction. According to this embodiment of the resent invention, a device of high integration and high capacity may be easily manufactured and mass production is possible. In particular, it is possible to minimize lithography process steps, minimize the area per memory cell, and implement a device of high integration, and high capacity by stacking memory cells in a three-dimensional way. According to one example, the three-dimensional stacked DRAM device may be a 2T0C type DRAM device or may be configured to include it.

In this specification, the preferred embodiments of the present invention have been disclosed, and although specific terms have been used, they are only used in a general sense to easily explain the technological content of the present invention and to help understanding the present invention, and they are not used to limit the scope of the present invention. It is obvious to those having ordinary skill in the related art to which the present invention belong that other modifications based on the technological idea of the present invention may be implemented in addition to the embodiments disclosed herein. It will be understood to those having ordinary skill in the related art that in connection with capacitorless three-dimensional stacked DRAM devices and methods of manufacturing the same according to the embodiment described with reference to FIGS. 1A to 30, various substitutions, changes, and modifications may be made without departing from the technological spirit of the present invention. Therefore, the scope of the invention should not be determined by the described embodiments, but should be determined by the technological concepts described in the claims.

The embodiments of the present invention may be applied to semiconductor/electronic devices and manufacturing methods thereof. For example, the embodiments of the present invention may be applied to memory devices and methods of manufacturing thereof.

The invention claimed is:

1. A capacitorless 3D stacked DRAM device comprising:

a plurality of memory cell structures spaced apart from each other in horizontal and vertical directions, each of the plurality of memory cell structures including a horizontal read transistor structure and a horizontal write transistor structure, the horizontal read transistor structure including a first channel layer, a first gate insulating layer, and a first gate electrode, the horizontal write transistor structure including a second channel layer electrically connected to the first gate electrode, a second gate insulating layer, and a second gate electrode layer;

a plurality of write bit lines connected to the plurality of write transistor structures of the plurality of memory cell structures and extending in the horizontal direction;

a plurality of read bit lines connected to the plurality of read transistor structures of the plurality of memory cell structures and extending in the horizontal direction;

a plurality of write word lines connected to the plurality of write transistor structures and extending in the vertical direction; and a plurality of read word lines connected to the plurality of read transistor structures and extending in the vertical direction, and wherein the plurality of write bit lines and the plurality of read bit lines are disposed between the plurality of write word lines and the plurality of read word lines, wherein the plurality of write bit lines are disposed between the plurality of write word lines and the plurality of read bit lines, and wherein the plurality of read bit lines are disposed between the plurality of read word lines and the plurality of write bit lines.

2. The capacitorless 3D stacked DRAM device of claim 1, wherein at least one of the first and second channel layers includes an oxide semiconductor.

3. The capacitorless 3D stacked DRAM device of claim 1, wherein in each of the read transistor structures, the first gate electrode has a rod structure extending in the horizontal direction, the first gate insulating layer has a first shell structure surrounding a remaining portion except for one end portion of the first gate electrode, and the first channel layer has a second shell structure surrounding the first gate insulating layer.

4. The capacitorless 3D stacked DRAM device of claim 3, wherein the first gate electrode protrudes toward the write transistor structure rather than the first channel layer.

5. The capacitorless 3D stacked DRAM device of claim 1, wherein the read bit line has a structure surrounding a portion of the first channel layer, and the read word line is electrically connected to an end of the first channel layer.

6. The capacitorless 3D stacked DRAM device of claim 1, wherein in each of the write transistor structures, the second gate electrode has a rod structure extending in a horizontal direction, the second gate insulating layer has a first shell structure surrounding a remaining portion except for one end portion of the second gate electrode, and the second channel layer has a second shell structure surrounding the second gate insulating layer.

7. The capacitorless 3D stacked DRAM device of claim 6, wherein the second gate electrode protrudes toward the write word line rather than the second channel layer.

8. The capacitorless 3D stacked DRAM device of claim 1, wherein the write bit line has a structure surrounding a portion of the second channel layer, and the write word line is electrically connected to an end of the second gate electrode.

9. The capacitorless 3D stacked DRAM device of claim 1, wherein a unit memory area of the capacitorless 3D stacked DRAM device has a size of $10F^2$ (F: feature size).

* * * * *